US008711327B2

(12) United States Patent
Shibazaki

(10) Patent No.: US 8,711,327 B2
(45) Date of Patent: Apr. 29, 2014

(54) EXPOSURE APPARATUS, EXPOSURE METHOD, AND DEVICE MANUFACTURING METHOD

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 1174 days.

(21) Appl. No.: 12/331,863

(22) Filed: Dec. 10, 2008

(65) Prior Publication Data
US 2009/0153822 A1 Jun. 18, 2009

Related U.S. Application Data

(60) Provisional application No. 61/006,030, filed on Dec. 14, 2007.

(51) Int. Cl.
*G03B 27/42* (2006.01)
*G03B 27/58* (2006.01)

(52) U.S. Cl.
USPC .............................................. 355/53; 355/72

(58) Field of Classification Search
USPC ....................................... 355/53, 72; 356/614
See application file for complete search history.

(56) References Cited

U.S. PATENT DOCUMENTS

| | | | |
|---|---|---|---|
| 4,780,617 A | 10/1988 | Umatate et al. | |
| 5,003,342 A | 3/1991 | Nishi | |
| 5,448,332 A | 9/1995 | Sakakibara et al. | |
| 5,610,715 A | 3/1997 | Yoshii et al. | |
| 6,262,796 B1 | 7/2001 | Loopstra et al. | |
| 6,341,007 B1 | 1/2002 | Nishi et al. | |
| 6,611,316 B2 | 8/2003 | Sewell | |
| 6,778,257 B2 | 8/2004 | Bleeker et al. | |
| 6,819,425 B2 | 11/2004 | Kwan | |
| 6,897,963 B1 | 5/2005 | Taniguchi et al. | |
| 6,952,253 B2 | 10/2005 | Lof et al. | |
| 7,023,610 B2 | 4/2006 | Ohtsuki et al. | |
| 7,025,498 B2 | 4/2006 | del Puerto | |
| 7,102,729 B2 | 9/2006 | Renkens et al. | |
| 7,161,659 B2 | 1/2007 | Van Den Brink et al. | |
| 7,238,931 B2 | 7/2007 | Nabeshima et al. | |
| 2003/0025890 A1 | 2/2003 | Nishinaga | |
| 2003/0076482 A1 | 4/2003 | Inoue | |
| 2005/0128461 A1 | 6/2005 | Beems et al. | |

(Continued)

FOREIGN PATENT DOCUMENTS

| EP | 1 420 298 A2 | 5/2004 |
|---|---|---|
| EP | 1 918 983 A1 | 5/2008 |

(Continued)

OTHER PUBLICATIONS

Written Opinion of the International Searching Authority issued in PCT/JP2008/073132, filed Dec. 12, 2008.

*Primary Examiner* — Peter B Kim
(74) *Attorney, Agent, or Firm* — Oliff PLC

(57) ABSTRACT

Two X encoder heads (X heads) and one Y head are mounted on one wafer stage, and an X scale and a Y scale corresponding to these heads are arranged on a surface facing the wafer stage so that the scales connect the exposure area and the alignment area. The wafer stage is made to move back and forth between the exposure area and the alignment area along a path where the X scale and the Y scale are set, while performing position measurement using three encoder heads. In this case, a switching process between XZ interferometer will not be necessary.

79 Claims, 23 Drawing Sheets

(56) References Cited

U.S. PATENT DOCUMENTS

| | | |
|---|---|---|
| 2005/0248856 A1 | 11/2005 | Omura et al. |
| 2005/0280791 A1 | 12/2005 | Nagasaka et al. |
| 2006/0023178 A1 | 2/2006 | Loopstra et al. |
| 2006/0023194 A1 | 2/2006 | Loopstra et al. |
| 2006/0139595 A1 | 6/2006 | Koenen et al. |
| 2006/0139660 A1* | 6/2006 | Kwan ............... 356/614 |
| 2006/0170892 A1 | 8/2006 | Koenen et al. |
| 2006/0227309 A1 | 10/2006 | Loopstra et al. |
| 2006/0231206 A1 | 10/2006 | Nagasaka et al. |
| 2006/0238731 A1 | 10/2006 | Beems et al. |
| 2006/0238733 A1 | 10/2006 | Beems et al. |
| 2007/0051160 A1 | 3/2007 | Pril et al. |
| 2007/0195296 A1 | 8/2007 | Van Der Pasch et al. |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0088843 A1 | 4/2008 | Shibazaki |
| 2008/0094592 A1 | 4/2008 | Shibazaki |
| 2008/0094593 A1 | 4/2008 | Shibazaki |
| 2008/0094604 A1 | 4/2008 | Shibazaki |
| 2008/0106722 A1 | 5/2008 | Shibazaki |
| 2008/0218713 A1 | 9/2008 | Shibazaki |
| 2008/0316446 A1 | 12/2008 | Shibazaki |

FOREIGN PATENT DOCUMENTS

| | | |
|---|---|---|
| JP | A-2005-259738 | 9/2005 |
| WO | WO 01/40875 A1 | 6/2001 |
| WO | WO 2005/059617 A2 | 6/2005 |
| WO | WO 2005/059618 A2 | 6/2005 |
| WO | WO 2007/018127 A1 | 2/2007 |
| WO | WO 2007/097350 A1 | 8/2007 |
| WO | WO 2007/097379 A1 | 8/2007 |

* cited by examiner

EXPOSURE APPARATUS, EXPOSURE METHOD, AND DEVICE MANUFACTURING METHOD

CROSS-REFERENCE TO RELATED APPLICATIONS

This non-provisional application claims the benefit of Provisional Application No. 61/006,030 filed Dec. 14, 2007, the disclosure of which is hereby incorporated herein by reference in its entirety.

BACKGROUND OF THE INVENTION

1. Field of the Invention

The present invention relates to exposure apparatus, exposure methods, and device manufacturing methods, and more particularly to an exposure apparatus and an exposure method used in a lithography process to manufacture microdevices such as a semiconductor device, and a device manufacturing method using the exposure method.

2. Description of the Background Art

Conventionally, in a lithography process for manufacturing electron devices (microdevices) such as semiconductor devices (such as integrated circuits) and liquid crystal display devices, exposure apparatuses such as a projection exposure apparatus by a step-and-repeat method (a so-called stepper), or a projection exposure apparatus by a step-and-scan method (a so-called scanning stepper (which is also called a scanner) is mainly used.

In this kind of exposure apparatus, the first thing required is to have a high throughput. As an approach for improving the throughput, various proposals are made also on a twin wafer stage type exposure apparatus which employs a method where a plurality of wafer stages holding a wafer, such as for example, two wafer stages, are arranged, and concurrent processing of different operations is performed on the two stages (refer to, for example, U.S. Pat. No. 6,262,796).

Furthermore, recently, a proposal has also been made on a twin water stage type exposure apparatus which employs a liquid immersion method (refer to, for example, U.S. Pat. No. 7,161,659).

However, in the case the exposure apparatus is equipped with two wafer stages as is described in, for example, U.S. Pat. No. 7,161,659, during the movement of each wafer stage between an exposure position (a position under the projection lens) and a position where wafer exchange (and wafer alignment) is performed, there was a position where measurement of an interferometer system measuring the position of the wafer stage becomes unmeasurable.

SUMMARY OF THE INVENTION

The present invention was made under the circumstances described above, and according to a first aspect of the present invention, there is provided a first exposure apparatus that exposes an object with an energy beam, the apparatus comprising: a movable body on which the object is held and is movable substantially along a predetermined plane within an area of a predetermined range which includes a first area including an exposure position where at least an exposure to the object which is mounted is performed, a second area positioned on one side of a first direction in the first area where at least an exchange of the object is performed, and a third area which is between the first area and the second area; a first grating section placed at a position corresponding to the third area on a plane parallel to the predetermined plane, which faces a surface substantially parallel to the predetermined plane of the movable body; and a measurement device including an encoder system which has an encoder head arranged on the surface of the movable body and measures positional information of the movable body within the predetermined plane based on an output of the encoder head facing the first grating section, and an interferometer system which irradiates a measurement beam on a reflection surface arranged on the movable body and measures positional information of the movable body in at least the first area and the second area, whereby the third area includes a movement path of the movable body where the measurement beam moves off from the reflection surface.

According to a second aspect of the present invention, there is provided a second exposure apparatus that exposes an object with an energy beam, the apparatus comprising: a movable body on which the object is held and is movable substantially along a predetermined plane within an area of a predetermined range which includes a first area including an exposure position where at least an exposure to the object which is mounted is performed, a second area positioned on one side of a first direction in the first area where at least an exchange of the object is performed, and a third area which is between the first area and the second area, a first, second, and third grating section placed at a position corresponding to the first, second, and third areas on a plane parallel to the predetermined plane, which faces a surface substantially parallel to the predetermined plane of the movable body, and a measurement device including an encoder system which has an encoder head arranged on the surface of the movable body that measures positional information of the movable body within the predetermined plane, based on an output of the encoder head facing any one of the first, second, and third grating sections.

According to this apparatus, positional information in the predetermined plane of the movable body is measured by the encoder system included in the measurement device, not only when the movable body moves within the first area and the second area, but also when the movable body moves between the first area and the second area while passing through the third area. Accordingly, by placing the first, second, and third grating sections at the positions corresponding to the first, second, and third areas on the plane parallel to the predetermined plane, it becomes possible to control the position of the movable body within the predetermined plane not only when the movable body moves within the first area and the second area, but also when the movable body moves between the first area and the second area while passing through the third area using only the encoder system included in the measurement device.

According to a third aspect of the present invention, there is provided a third exposure apparatus that exposes an object with an energy beam, the apparatus comprising: a first movable body on which an object is held and is movable substantially along a predetermined plane within a first range which includes a first area including an exposure position where at least an exposure to the mounted object is performed, a second area positioned on one side of a first direction in the first area where at least an exchange of the object is performed, and a third area which is between the first area and the second area; a second movable body on which an object is held and is movable substantially along a predetermined plane within a second range which includes the first area and a fourth area positioned on one side of a first direction in the first area where at least an exchange of the object is performed, and a fifth area between the first area and the fourth area, a first and second grating section placed at a position corresponding to the third and fifth areas on a plane parallel to the predetermined plane, which faces a surface of the first and second movable bodies substantially parallel to the predetermined plane; and a measurement device including an encoder system which has a first and second encoder head arranged respectively on the surface of the first movable body and the surface of the second movable body and measures positional information of the first and second movable bodies within the predetermined plane, respectively, based on an output of the first encoder head facing the first grating section and an output of the second encoder head facing the second grating section.

According to this apparatus, positional information in the predetermined plane of the first movable body, which moves between the first and second areas passing through the third area, is measured by the encoder system included in the measurement device. Further, by the measurement device, positional information in the predetermined plane of the second movable body, which moves between the first and fourth areas passing through the fifth area, is measured. Accordingly, by only placing the first and second grating sections at the positions corresponding to the third area and the fifth area on the plane parallel to the predetermined plane, it becomes possible to control the position of the first movable body when moving between the first area and the second area passing through the third area and the position of the second movable body when moving between the first area and the fifth area passing through the fourth area.

According to a fourth aspect of the present invention, there is provided a first exposure method that exposes an object with an energy beam, the method comprising: a measurement process in which of a movable body on which the object is held and is movable substantially along a predetermined plane, within a predetermined range including a first area including an exposure position where at least an exposure to the object which is mounted is performed, a second area positioned on one side of a first direction in the first area where at least an exchange of the object is performed, and a third area which is between the first area and the second area, positional information within the predetermined plane of the third area is measured, based on an output of an encoder head arranged on a surface of the movable body that faces a first grating section placed at a position corresponding to the third area on a plane parallel to the predetermined plane, which faces the surface of the movable body substantially parallel to the predetermined plane, and positional information of the movable body in at least the first area and the second area is measured also using an interferometer system which irradiates a measurement beam on a reflection surface arranged on the movable body, wherein the third area includes a movement path of the movable body where the measurement beam has moved off the reflection surface.

According to this method, positional information in the predetermined plane of the movable body which moves between the first area and the second area passing through the third area is measured, based on the output of the encoder head. Accordingly, even in the third area including the movement path of the movable body where the measurement beam of the interferometer system moves off from the reflection surface arranged on the movable body, by only placing the first grating at the position corresponding to the third area on the plane parallel to the predetermined plane, it becomes possible to control the position of the movable body when the movable body moves between the first area and the second area while passing through the third area.

According to a fifth aspect of the present invention, there is provided a second exposure method that exposes an object with an energy beam, the method comprising a measurement process in which positional information within a predetermined plane of a movable body on which the object is held and is movable substantially along the predetermined plane within a predetermined range including a first area including an exposure position where at least an exposure to the object which is mounted is performed, a second area positioned on one side of a first direction in the first area where at least an exchange of the object is performed, and a third area which is between the first area and the second area, is measured, based on an output of an encoder head arranged on a surface of the movable body that faces any one of a first, second, and third grating section placed at positions corresponding to the first, second, and third areas on a plane parallel to the predetermined plane, which faces the surface of the movable body substantially parallel to the predetermined plane.

According to this method, positional information in the predetermined plane of the movable body is measured not only when the movable body moves within the first area and the second area, but also when the movable body moves between the first area and the second area passing through the third area, based on the output of the encoder head. Accordingly, by placing the first, second, and third grating sections at the positions corresponding to the first, second, and third areas on the plane parallel to the predetermined plane, it becomes possible to control the position of the movable body within the predetermined plane not only when the movable body moves within the first area and the second area, but also when the movable body moves between the first area and the second area while passing through the third area, based on the output of the encoder system.

According to a sixth aspect of the present invention, there is provided a third exposure method that exposes an object with an energy beam, the method comprising: a measurement process in which positional information of a first movable body on which the object is held and is movable substantially along a predetermined plane within a first range which includes a first area including an exposure position where at least an exposure to the object which is mounted is performed, a second area positioned on one side of a first direction in the first area where at least an exchange of the object is performed, and a third area which is between the first area and the second area, and a second movable body on which the object is held and is movable substantially along a predetermined plane within a second range which includes the first area, a fourth area positioned on one side of a first direction in the first area where at least an exchange of the object is performed, and a fifth area between the first area and the fourth area, is measured in the predetermined plane in the third and fifth areas, respectively, based on an output of a first and second encoder head arranged on a surface of the first movable body and the surface of the second movable body, respectively, each facing a first and second grating section placed respectively at positions corresponding to the third and fifth areas on a plane parallel to the predetermined plane, which faces the surfaces of each of the first and second movable bodies substantially parallel to the predetermined plane.

According to this method, positional information in the predetermined plane of the first movable body which moves between the first area and the second area passing through the third area is measured, based on the output of the first encoder head. Further, positional information in the predetermined plane of the second movable body which moves between the first area and the fourth area passing through the fifth area is measured, based on the output of the second encoder head. Accordingly, by only placing the first and second grating sections at the positions corresponding to the third area and the fifth area on the plane parallel to the predetermined plane, it becomes possible to control the position of the first movable body when moving between the first area and the second area passing through the third area and the position of the second movable body when moving between the first area and the fifth area passing through the fourth area.

According to another aspect of the present invention, there is provided a device manufacturing method including: an exposure process in which an object is exposed using at least one of the first, second, and third exposure methods of the present invention; and a development process in which the object that has undergone exposure is developed.

BRIEF DESCRIPTION OF THE DRAWINGS

In the accompanying drawings.

DESCRIPTION OF THE EMBODIMENTS

A First Embodiment

Hereinafter, a first embodiment of the present invention will be described, with reference to FIGS. 1 to 12.

Figure 1:
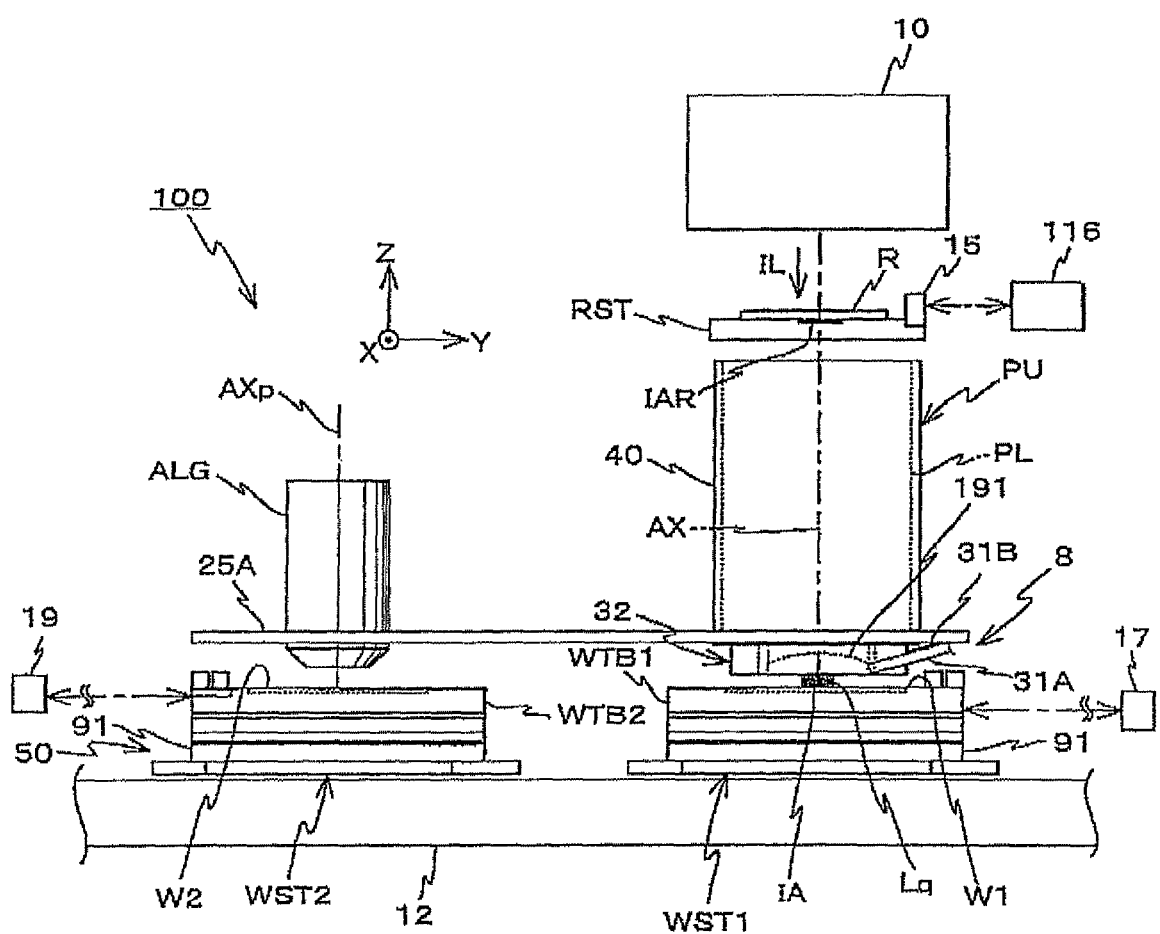
FIG. 1 is a view that schematically shows a configuration of an exposure apparatus of a first embodiment.

FIG. 1 schematically shows a configuration of a twin stage type exposure apparatus 100 in the first embodiment. Exposure apparatus 100 is a projection exposure apparatus by the step-and-scan method, or a so-called scanner. As discussed below, in the embodiment, a projection optical system PL and an alignment system ALG are arranged, and in the description below, a direction parallel to an optical axis AX of projection optical system PL will be described as a Z-axis direction, a direction parallel to a straight line connecting the center of projection optical system PL (optical axis AX) and a detection center of alignment system ALG (an optical axis AXp) within a plane orthogonal to the Z-axis direction will be described as a Y-axis direction, a direction orthogonal to the Z-axis and the Y-axis will be described as an X-axis direction, and rotational (tilt) directions around the X-axis, the Y-axis, and the Z-axis will be described as a θx direction, a θy direction, and a θz direction, respectively.

Exposure apparatus 100 is equipped with an illumination system 10, a reticle stage RST, a projection unit PU, a local liquid immersion device 8, an alignment system ALG, a stage device 50, and a control system of these sections and the like. Incidentally, in FIG. 1, two wafer stages WST1 and WST2, which configure stage unit 50, are located below projection unit PU and below alignment system ALG, respectively. Further, on wafer stages WST1 and WST2, wafers W1 and W2 are placed, respectively.

Illumination system 10 has a light source, an illuminance uniformity optical system including an optical integrator and the like, and an illumination optical system including a reticle blind and the like (none of which are shown), as is disclosed in, for example, U.S. Patent Application Publication No. 2003/0025890 and the like. Illumination system 10 illuminates a slit-shaped illumination area IAR which is set on reticle R with a reticle blind (also referred to as a masking system) by illumination light (exposure light) IL with a substantially uniform illuminance. In this case, as illumination light IL, for example, an ArF excimer laser beam (wavelength 193 nm) is used.

On reticle stage RST, reticle R on which a circuit pattern or the like is formed on its pattern surface (the lower surface in FIG. 1) is fixed, for example, by vacuum chucking. Reticle stage RST is finely drivable within an XY plane by a reticle stage drive section 11 (not shown in FIG. 1, refer to FIG. 7) including a linear motor or the like, and reticle stage RST is also drivable in a scanning direction (in this case, the Y-axis direction, which is the lateral direction of the page surface in FIG. 1) at a predetermined scanning speed.

The positional information (including rotation information in the θz direction) of reticle stage RST in the XY plane (movement plane) is constantly detected, for example, at a resolution of around 0.25 nm by a reticle laser interferometer (hereinafter called a reticle interferometer) 116, via a movable mirror 15 (the mirrors actually arranged are a Y movable mirror (or a retro reflector) that has a reflection surface which is orthogonal to the Y-axis direction and an X movable mirror that has a reflection surface orthogonal to the X-axis direction). The positional information front reticle interferometer 116 is sent to a main controller 20 (not shown in FIG. 1, refer to FIG. 7). Main controller 20 controls the position (and speed) of reticle stage RST via reticle stage drive system 11, based on the positional information which has been sent.

Projection unit PU is placed below (−Z direction) reticle stage RST in FIG. 1. Projection unit PU includes a barrel 40, and projection optical system PU held within barrel 40. As projection optical system PL, for example, a dioptric system is used, consisting of a plurality of lenses (lens elements) that is disposed along optical axis AX, which is parallel to the Z-axis direction. Projection optical system PL is, for example, a both-side telecentric dioptric system that has a predetermined projection magnification (such as one-quarter, one-fifth, or one-eighth times). Therefore, when illumination system 10 illuminates illumination area IAR on reticle R with illumination area IL, by illumination light IL which has passed through reticle R placed so that its pattern surface substantially coincides with a first surface (object surface) of projection optical system PL, a reduced image of the circuit pattern of reticle FR within illumination area IAR via projection optical system PL (projection unit PU) is formed on an area (hereinafter also referred to as an exposure area) IA conjugate with illumination area IAR on a water W1 (or W2) whose surface is coated with a resist (a photosensitive agent) and is placed on a second surface (image plane surface) side of projection optical system PL. And, in accordance with the synchronous drive of reticle stage RST and wafer stage WST1 (or WST2), by reticle R being moved relatively in the scanning direction (the Y-axis direction) with respect to illumination area IAR (illumination light IL) while wafer W1 (or W2) is moved relatively in the scanning direction (the Y-axis direction with respect to the exposure area (illumination light IL) scanning exposure of a shot area (divided are) on wafer W1 (or W2) is performed, and the pattern of the reticle is transferred onto the shot area. That is, in the embodiment, a pattern is generated on wafer W1 (or W2) according to illumination system 10, reticle R, and projection optical system PL, and then by the exposure of the sensitive layer (resist layer) on wafer W1 (or W2) with illumination light IL, the pattern is formed on wafer W.

In exposure apparatus 100 of the embodiment, a local liquid immersion device 9 is installed to perform exposure by a liquid immersion method. Local liquid immersion device 8 includes a liquid supply device 5, a liquid recovery device 6 (both of which are not shown in FIG. 1, refer to FIG. 7), a liquid supply pipe 31A, a liquid recovery pipe 31B, a nozzle unit 32 and the like. As shown in FIG. 1, nozzle unit 32 is supported in a suspended state by a mainframe (not shown) holding projection unit PU, so that the periphery of the lower end portion of barrel 40 that holds an optical element closest to the image plane side (wafer side) constituting projection optical system PL, in this case, a lens (hereinafter also referred to as a tip lens) 1917 is enclosed. In the embodiment, as shown in FIG. 1, the lower end surface of nozzle unit 32 is set to be on a substantially flush surface with the lower end surface of tip lens 191.

Figure 7:
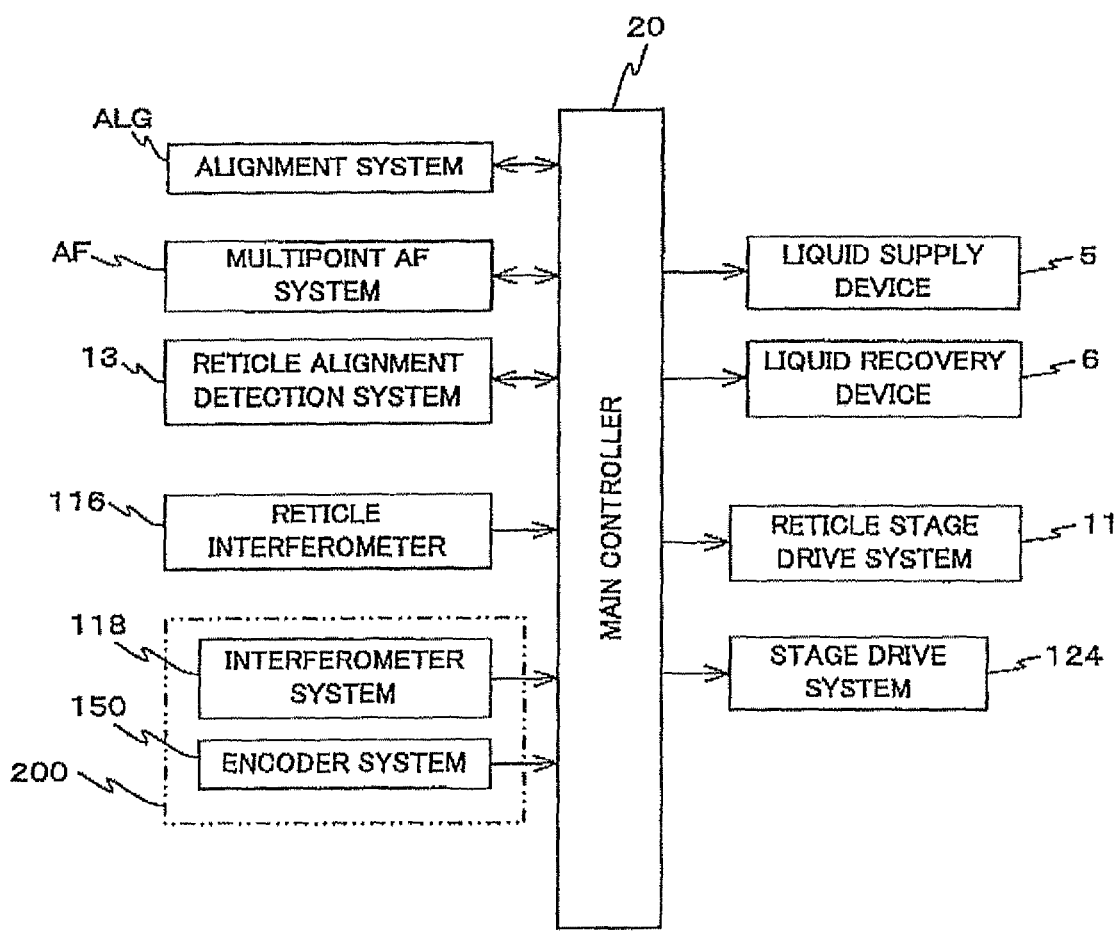
FIG. 7 is a block diagram showing a main configuration of a control system of an exposure apparatus in an embodiment.

Liquid supply pipe 31A connects to liquid supply device 5 (not shown in FIG. 1, refer to FIG. 7), and liquid recovery pipe 31B connects to liquid recovery device 6 (not shown in FIG. 1, refer to FIG. 7). In this case, liquid supply device 5 is equipped with a tank to store the liquid, a compression pump, a temperature controller, a valve for controlling the flow amount of the liquid, and the like. Liquid recovery device 6 is equipped with a tank to store the liquid which has been recovered, a suction pump, a valve for controlling the flow amount of the liquid, and the like.

Main controller 20 controls liquid supply device 5 (refer to FIG. 7), and supplies liquid between tip lens 191 and wafer W1 (or W2) via liquid supply pipe 31A, as well as control liquid recovery device 6 (refer to FIG. 7), and recovers liquid from between tip lens 191 and wafer W1 (or W2) via liquid recovery pipe 31B. During the operations, main controller 20 controls liquid supply device 5 and liquid recovery device 6 so that the quantity of liquid supplied constantly equals the quantity of liquid which has been recovered. Accordingly, in the space between tip lens 191 and wafer W1 (or W2), a constant quantity of liquid Lq is held constantly replaced, and by this, a liquid immersion area 14 (for example, refer to FIGS. 6, 8 and the like) is formed. In exposure apparatus 100 of the embodiment, by irradiating illumination light IL on wafer W1 (or W2) via liquid Lq forming liquid immersion area 14, exposure of wafer W1 (or W2) is performed. Liquid immersion area 14 herein is a three-dimensional space filled with liquid Lq which should be referred to as a liquid space; however, because space also means a gap, in order to avoid such a misunderstanding, the term liquid immersion area is used in the specification.

As the liquid above, for example, pure water which transmits the ArF excimer laser beam (light with a wavelength of 193 nm) is used. Incidentally, refractive index n of the water with respect to the ArF excimer laser beam is around 1.44, and in the pure water, the wavelength of illumination light IL is 193 nm×1/n, shorted to around 134 nm.

Alignment system ALG is placed at a position a predetermined distance away on the −Y side from the center (optical axis AX (coinciding with the center of exposure area IA previously described in the embodiment) of projection optical system PL) of projection unit, and is held by the mainframe (not shown). As alignment system ALG, for example, an FIA (Field Image Alignment) system by an image processing method is used. On wafer alignment and the like, responding to instructions from main controller 20, alignment system ALG picks up an image of a reference mark on wafer stage WST1 or WST2 or an alignment mark (wafer mark) on the wafer, and supplies the imaging signals to main controller 20 via a signal processing system (not shown) (refer to FIG. 7).

In addition, in exposure apparatus 100 of the embodiment, a multiple point focal point position detection system (hereinafter shortly referred to as a multipoint AF system) AF (not shown in FIG. 1, refer to FIG. 7) having a similar configuration as the one disclosed in, for example, U.S. Pat. No. 5,448, 332 and the like, is arranged in the vicinity of projection unit PU. As multipoint AF system herein, a system is used having a configuration of a detection beam from an irradiation system being irradiated on a plurality of detection points on the wafer W1 (or W2) surface via a light transmitting section (not shown) formed in nozzle unit 32 previously described and liquid Lq of the liquid immersion area, and each of the reflected lights of the detection beams at the plurality of detection points being received by a light receiving system via a different light transmitting section formed in nozzle unit 32. Detection signals of multipoint AF system AF are supplied to main controller 20 (refer to FIG. 7) via an AF signal processing system (not shown). Main controller 20 detects positional information of the wafer W surface in the Z-axis direction at each detection point based on the detection signals of multipoint AF system AF, and performs a so-called focus leveling control of wafer W during the scanning exposure based on the detection results. Incidentally, multipoint AF system can be arranged in the vicinity of alignment system AG and surface position information (unevenness information) of the wafer surf ace can be obtained beforehand at the time of wafer alignment, and at the time of exposure, the surface position information and measurement values of a different sensor detecting a position of the wafer stage upper surf ace in the Z-axis direction can be used to perform the so-called focus leveling control of wafer W.

Furthermore, in exposure apparatus 100, above reticle stage RST, a reticle alignment detection system 13 (not shown in FIG. 1, refer to FIG. 7) consisting of a pair of TTR (Through The Reticle) alignment systems which use light of the exposure wavelength is arranged. Detection signals of reticle alignment detection system 13 are supplied to main controller 20 (refer to FIG. 7) via an alignment signal processing system (not shown).

Stage device 50, as shown in FIG. 1, is equipped with wafer stages WST1 and WST2 placed above a base board 12, a measurement system 200 (refer to FIG. 7) that measures positional information of wafer stages WST1 and WST2, and a stage drive system 124 (refer to FIG. 7) which drives wafer stages WST1 and WST2 and the like. Measurement system 200 includes an interferometer system 118 and an encoder system 150, as shown in FIG. 7.

Wafer stages WST1 and WST2 are supported by levitation above base board 12 via a clearance of several μm by air sliders which will be described later that each stage has. And, by a planar motor described below configuring stage drive system 124, wafer stages WST1 and WST2 are drivable within the XY plane along the upper surface (movement guide surface) of base board 12, respectively. Incidentally, wafer stage WST1 moves within a first movement range which will be described below including an exposure time movement area AE, a scrum state movement area AS, a first waiting area AW1, and an alignment area AA. Further, wafer stage WST2 moves within a second movement range which includes exposure time movement area AE, scrum state movement area AS, a second waiting area AW2, and alignment area AA.

Figure 2A:
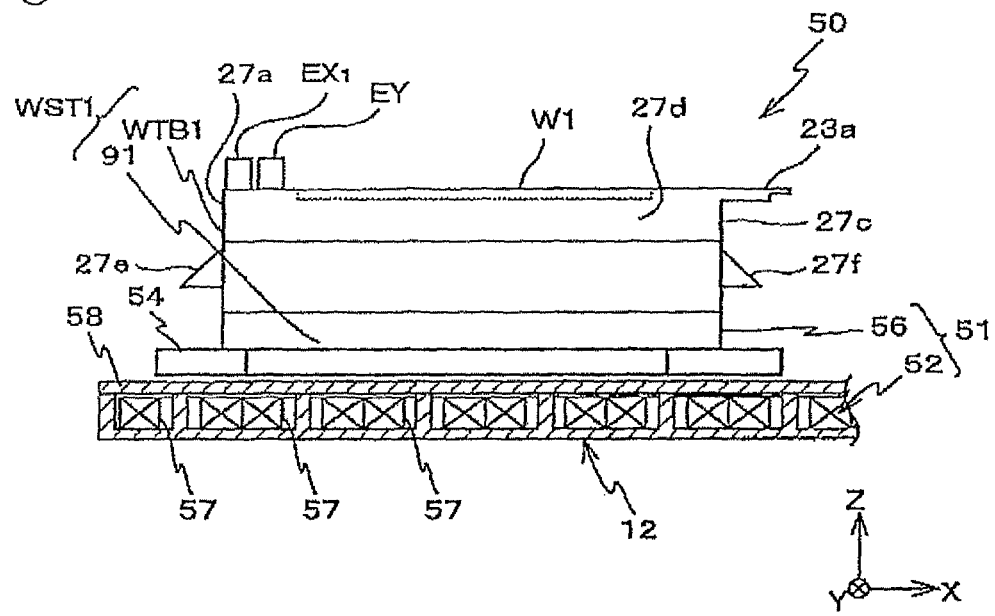
FIG. 2A shows a front view of wafer stage WST1 in FIG. 1.

Wafer stage WST1, as shown in FIGS. 1 and 2A, includes a stage main section 91, and a wafer table WTB1 mounted on stage main section 91. Stage main section 91, as shown in FIG. 2A, has a mover 56 which configures a planar motor 51 along with a stator 52 arranged inside base board 12, and an air slider 54, which is arranged integrally in the periphery of the lower half section of mover 56 and has a plurality of air bearings.

Mover 56 is configured, for example, by a magnet unit including a planar magnetism generating body consisting of a plurality of flat plate magnets having a matrix arrangement so that the polarity of adjacent pole faces are different from one another.

Meanwhile, stator 52 is configured by an armature unit having a plurality of armature coils (drive coils) 57 disposed in a matrix in the interior of base board 12. As armature coil 57, in the embodiment, an X drive coil and a Y drive coil are arranged. And, by stator 52 and mover 56 previously described, a moving magnet type planar motor 51 by an electromagnetic drive method (Lorentz force drive method) is configured.

A plurality of armature coils 57 is covered by a tabular member 58 configuring the upper surface of base board 12. The upper surface of tabular member 58 configures a pressure receiving surface of pressurized air from air bearings which the movement guide surface of wafer stage WST1 (and WST2) and air slider 54 are equipped with.

Wafer table WTB1 is installed on stage main section 91 via a Z leveling mechanism (for example, including voice coil motors and the like), which configures a part of stage drive system 124. Wafer table WTB1 is driven finely in the Z-axis direction, the θx direction, and the θy direction with respect to stage main section 91 by the Z leveling mechanism. Accordingly, wafer table WTB1 is configured drivable in directions of six degrees of freedom (X, Y, Z, θx, θy, and θz) with respect to base board 12, by stage drive system 124 including planar motor 51 and the Z leveling mechanism.

Figure 2B:
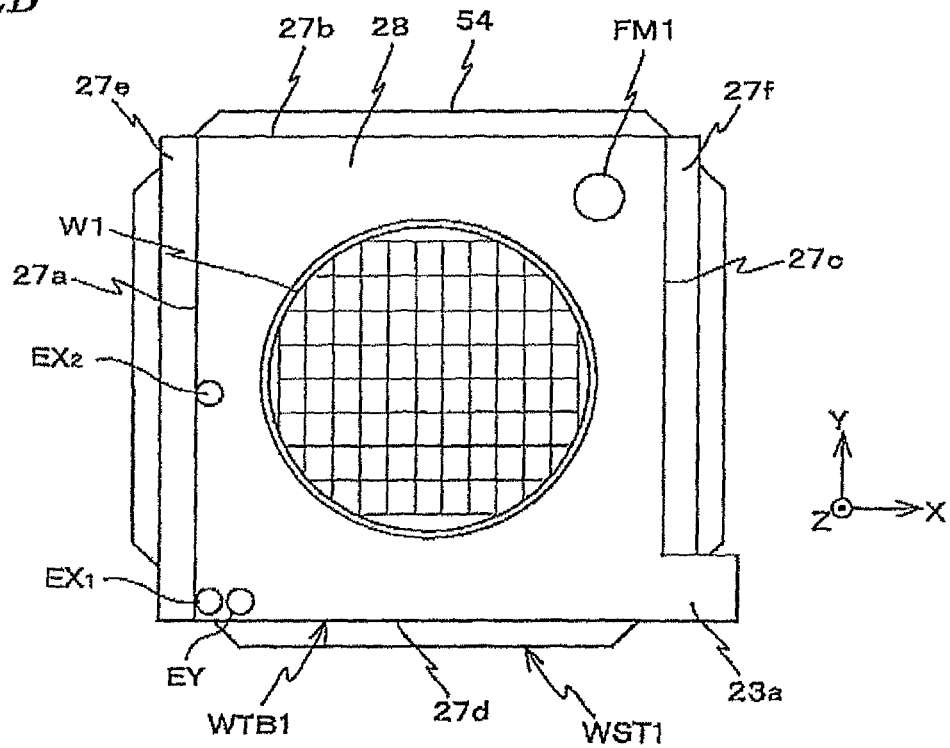
FIG. 2B is a planar view showing wafer stage WST1.

In the center of the upper surface of wafer table WTB1, a wafer holder (not shown) is arranged which holds the wafer by vacuum suction or the like. On the outer side of the wafer holder (mounting area of the wafer), as shown in FIG. 2B, a plate 28 is arranged that has a circular opening one size larger than the wafer holder formed in the center, and also has a rectangular outer shape (contour). The surf ace of plate 28 forms a liquid repellent surface to which a liquid repellent treatment against liquid Lq is applied. Incidentally, plate 28 is set so that its entire surface (or a part of its surface) becomes substantially flush with the surface of wafer W.

Further, on the +Y side of plate 28 in the vicinity of the +X end, a circular opening is formed, and a fiducial mark plate FM1 is fitted into the opening. Fiducial mark plate 11 has its surface arranged substantially flush with plate 28. On the surface of fiducial mark plate FM1, at least a pair of first fiducial marks detected by reticle alignment detection system 13 and a second fiducial mark detected by alignment system ALG are formed.

On the +X side of wafer table WTB1 at the −Y end, as shown in FIG. 2B, a plate-shaped eaves section 23a is arranged which protrudes more than the other sections. The entire surface of the upper surface of water table WTB1 is substantially flush, including wafer W1 and eaves section 23a.

Figure 3A:
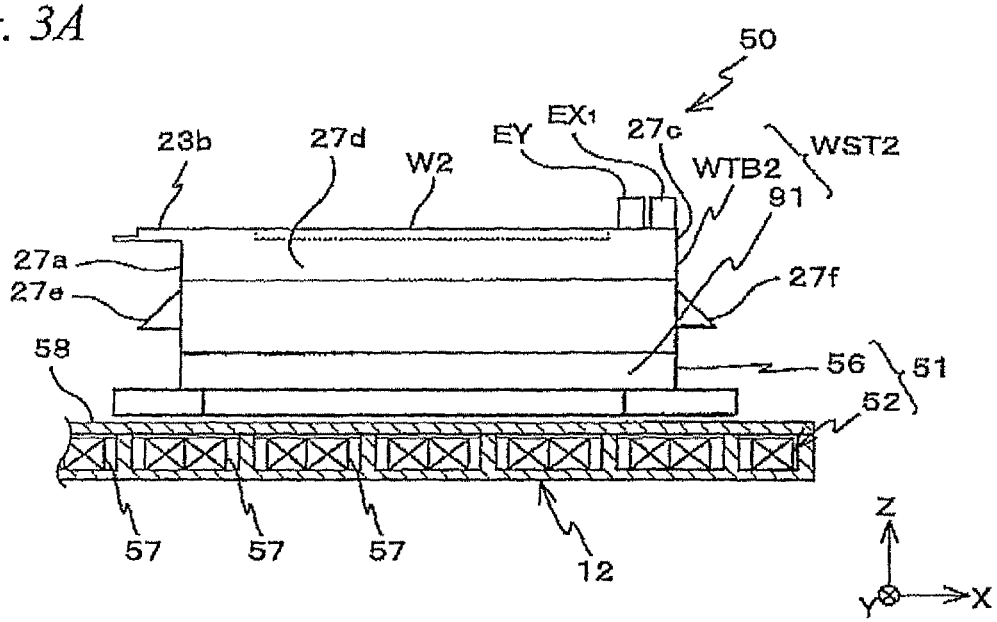
FIG. 3A shows a front view of wafer stage WST2 in FIG. 1.
Figure 3B:
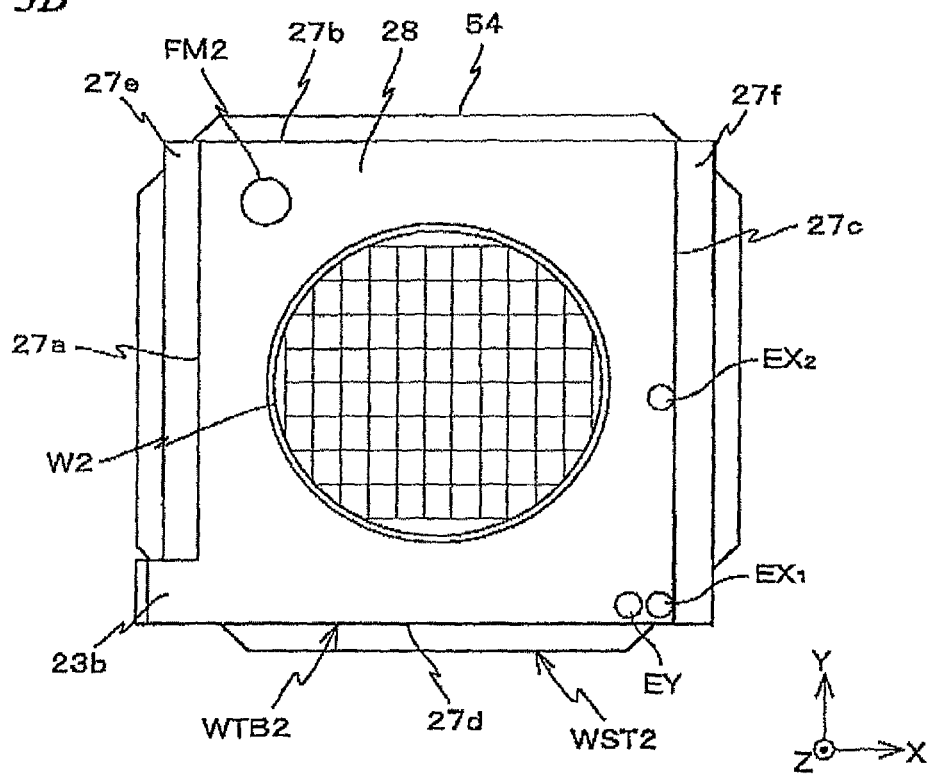
FIG. 3B is a planar view showing wafer stage WST2.

Wafer stage WST2, as shown in FIGS. 1, 3A, and 3B and the like, includes stage main section 91 and a wafer table WTB2, and is configured in a similar manner, although symmetrical with wafer stage WST1 described above. However, in wafer stage WST2, fiducial mark plate FM2 is arranged on the wafer table WTB2 upper surface in a placement symmetric to the placement of fiducial mark A1 on wafer table WTB1, and an eaves section 23b is arranged in a placement almost symmetric to eaves section 23a of wafer table WTB1.

Eaves sections 23a and 23b will now be described in detail, including their functions.

Figure 4A:
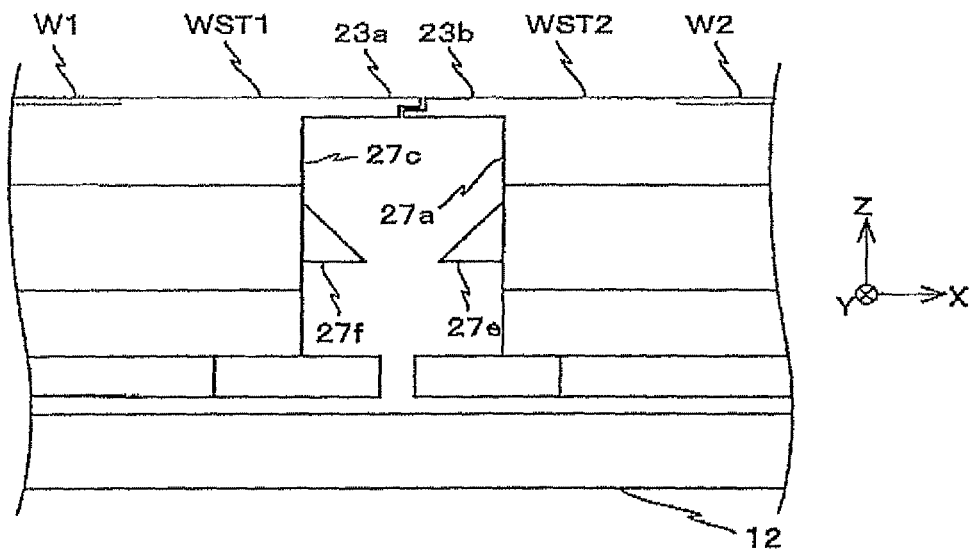
FIGS. 4A to 4C are views used to explain a delivery portion.

FIG. 4A shows an enlarged view of eaves section 23a arranged in wafer table WTB1 and eaves section 23b arranged in wafer table WTB2. As shown in FIG. 4A, eaves section 23a consists of a substantially tabular section protruding from the upper end on the +X side of wafer table WTB1, and at the tip a projecting section is formed whose upper half projects out when compared with the lower half. On the other hand, eaves section 23b consists of a substantially tabular section protruding from the upper end on the −X side of wafer table WTB2, and at the tip, a projecting section is formed whose lower half projects out when compared with the upper half and engages with the projecting section of eaves section 23a, and in the engaged state, forms a plate section as a whole as shown in FIG. 4A.

As is obvious from FIG. 4A, the tip of eaves section 23a and 23b are each located on the AX side end of wafer stage WST1 and the −X side end of wafer stage WST1, respectively. Further, the length of eaves section 23a and eaves section 23a in total in a state where eaves sections 23a and 23b are engaged is set to a level of length where wafer stage WST1 and water stage WST2 can be kept from coming into contact (to be more precise, keep the +X side end of air slider 54 of wafer stage WST1, and the −X side end of air slider 54 of wafer stage WST from coming into contact), even though a part of the tip has an overlapping section. In this case, in the state where eaves sections 23a and 23b are engaged, not only the contact of air sliders 54 described above, but also a reflection mirror 27f (to be described later on) arranged projecting on the +X side end of wafer stage WST1 and a reflection mirror 27e (to be described later on) arranged projecting on the −X side end of wafer stage WST2 can also be kept from coming into contact as shown in FIG. 4A. More specifically, the protrusion length of each of the eaves sections 23a and 23b is not a problem in particular, as long as wafer stage WST 1 and wafer stage WST2 can be kept from coming into contact (or to be more precise, the contact between the +X side end of air slider 54 of wafer stage WST1 and the −X side end of air slider 54 of wafer stage WST2) and reflection mirror 27f and reflection mirror 27e can also be kept from coming into contact in a state where eaves sections 23a and 23b are engaged.

In the embodiment, in a state where both stages WST1 and WST2, or to be more precise, eaves sections 23a and 23b are in proximity or in contact (that is, in a scrum state of both stages), eaves sections 23a and 23b completely covers a reflection surface 27f and a reflection surface 27e.

In the embodiment, in a state where both stages WST1 and WST2, or to be more precise, eaves sections 23a and 23b are in proximity or in contact (that is, in a scrum state of both stages), eaves sections 23a and 23b completely covers a reflection surface 27f and a reflection surface 27e. At this point, the upper surfaces of wafer table WTB1 and wafer table WTB2 include the upper surfaces of eaves sections 23a and 23b, and become a substantially flush surface (a completely flat surface) as a whole (refer to FIG. 4A). In this case, the term eaves sections 23a and 23b in proximity, for example, refers to a state where eaves sections 23a and 23b approach each other via a clearance of around or less than 300 μm.

Figure 5:
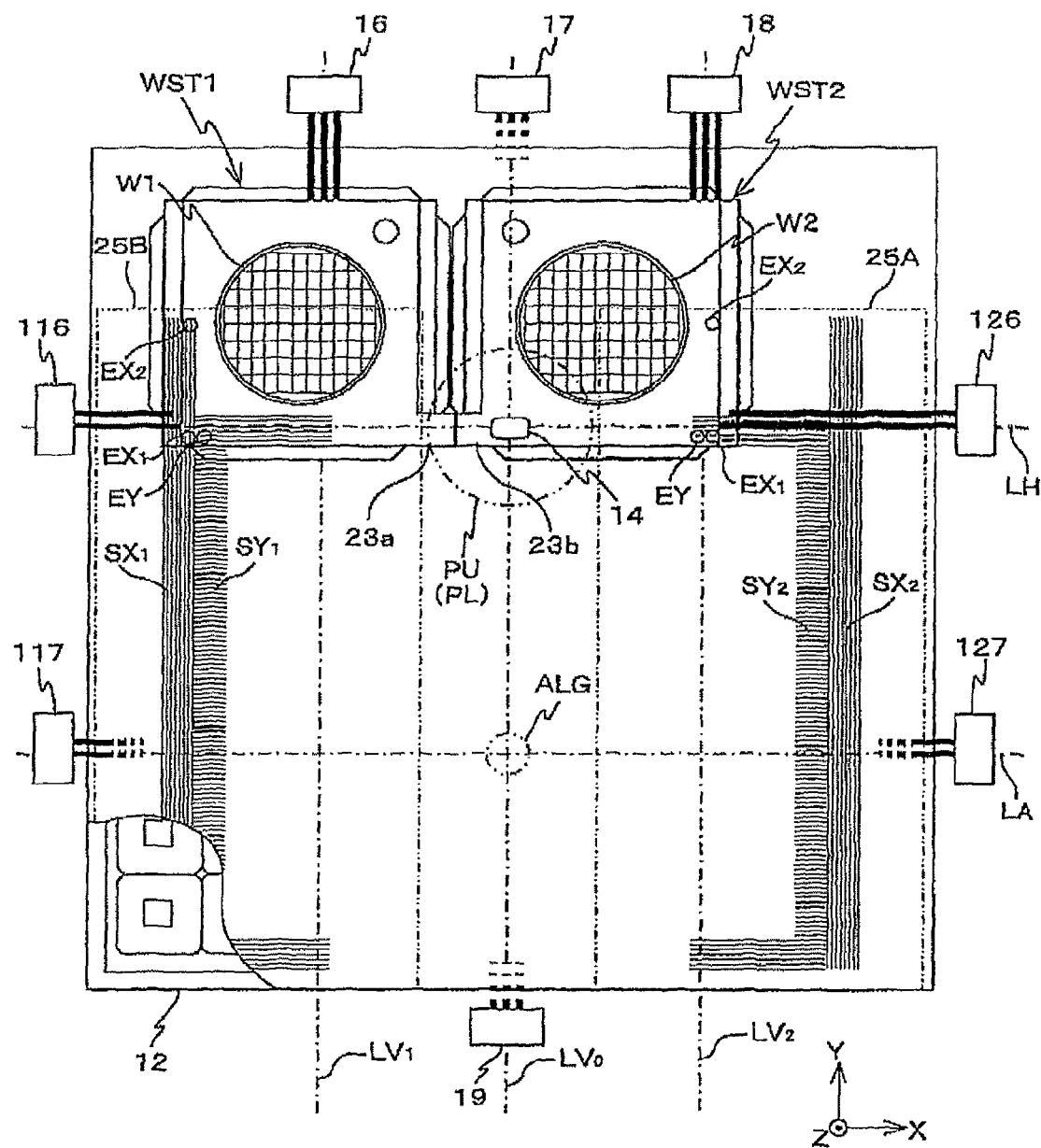
FIG. 5 shows a planar view of a stage device equipped in the exposure apparatus of FIG. 1.
Figure 11:
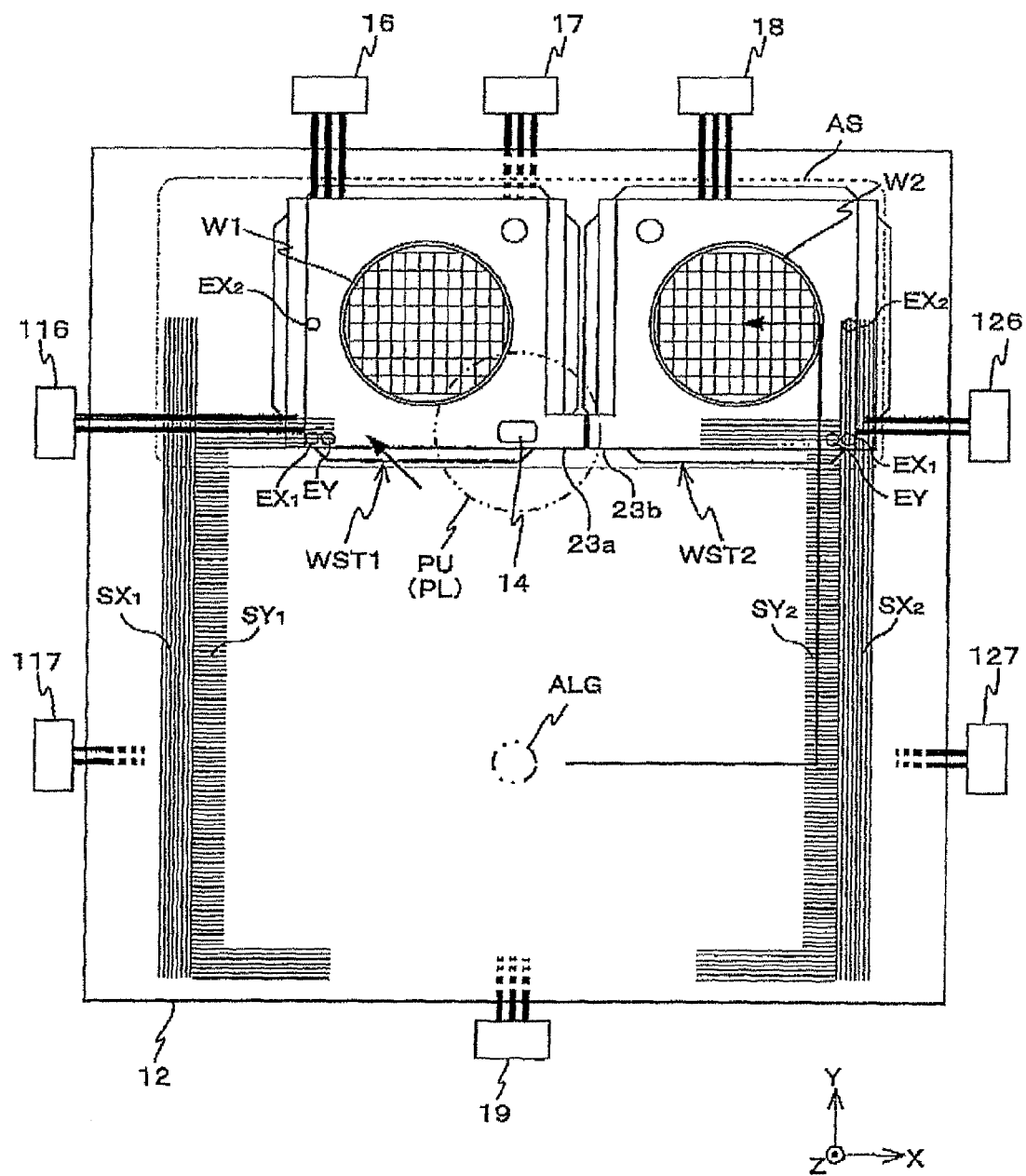
FIG. 11 is a view showing a state where movement to a scrum position of wafer stage WST1 and wafer stage WST2 has been completed.

The width of eaves section 23a (the length in the Y-axis direction) is set sufficiently larger than the width of liquid immersion area 14 previously described (the length in the Y-axis direction), as shown in FIG. 5. Accordingly, for example, when exposure of wafer W1 mounted on wafer table WTB1 has been completed and in order to begin exposure of wafer W2 mounted on wafer table WTB2, wafer stage WST1 positioned at a movement area AE (refer to FIG. 8) at the time of exposure in the vicinity of projection optical system PL has to be withdrawn outside of exposure time movement area AE (refer to FIG. 8), and wafer stage WST2 waiting at a predetermined waiting position has to be moved to exposure time movement area AE. On this movement, as shown in FIG. 11, main controller 20 makes wafer stages WST1 and WST2 move into proximity or come into contact in the X-axis direction by engaging eaves section 23a that wafer stage WST1 has with eaves section 23b that wafer stage WST2 has. And, by main controller 20 driving both wafer stages WST1 and WST2 in the −X direction while maintaining this state (scrum state), liquid immersion area 14 sequentially moves from the upper surface of wafer table WTB1, eaves section 23a, eaves section 23b, and then to wafer table WTB2. As a matter of course, liquid immersion area 14 can be moved in a reverse order.

Figure 9:
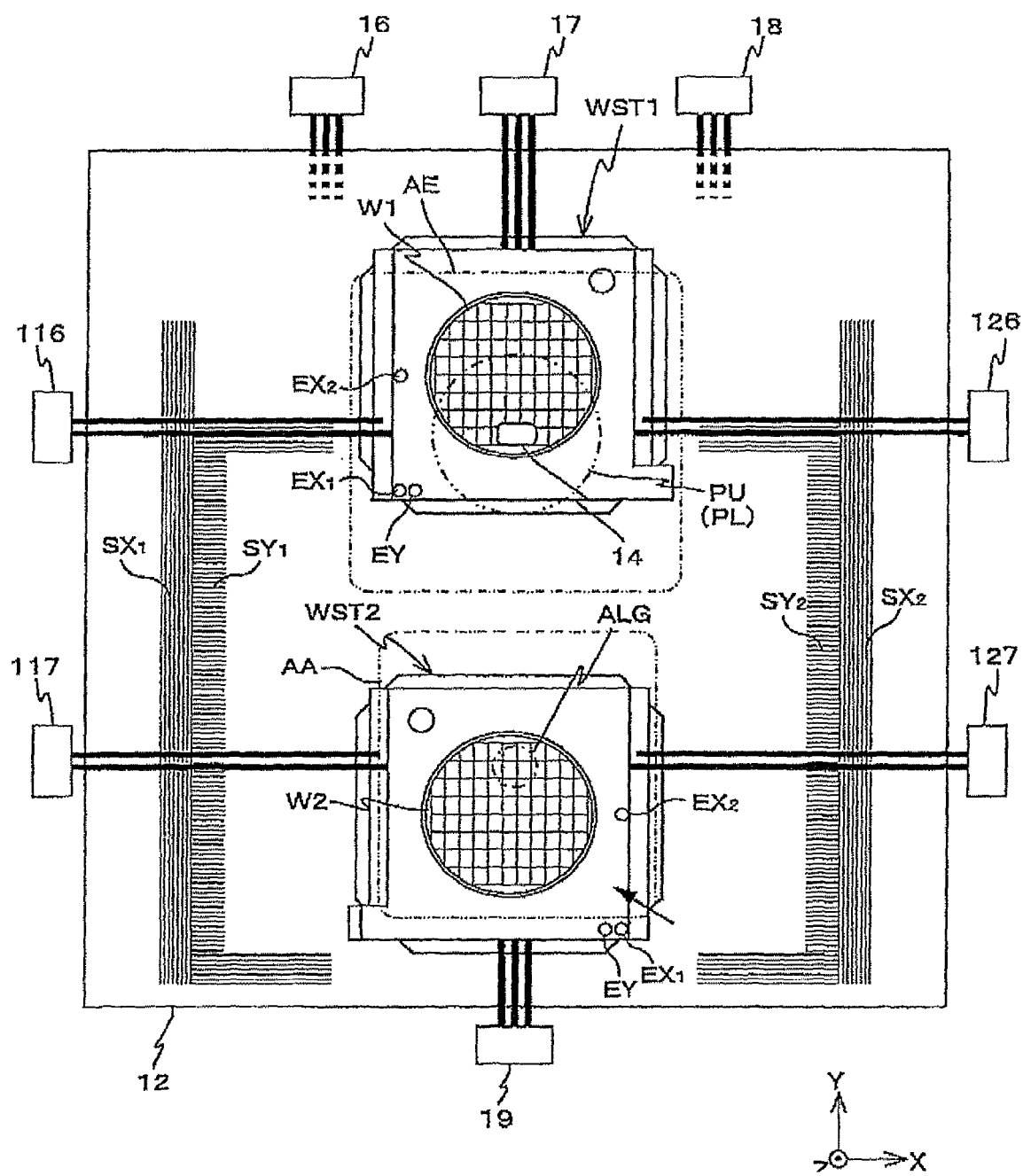
FIG. 9 is a view showing a state where exposure is performed on a wafer placed on wafer stage WST1, and wafer alignment is performed on wafer stage WST2.

Incidentally, for example, as shown in FIG. 11, scrum state movement area AS serves as a rough range in which wafer stages WST1 and WST2 move while maintaining a scram state. Further, for example, as shown in FIG. 9, exposure time movement area AE is a rough range in which the wafer on the wafer stage moves according to the movement of the wafer stage upon exposure, and further, alignment area AA which will be described below is a rough range where the wafer on the wafer stage moves according to the movement of the wafer stage on wafer alignment.

When liquid immersion area 14 moves from above wafer table WTB1 to wafer table WTB2 via eaves sections 23a and 23b, liquid Lq which forms liquid immersion area 14 may enter a gap between eaves section 23a and eaves section 23b and leak below wafer stage(s) WST1 and/or WST2 via the side surface of wafer stage(s) WST1 and/or WST2. Therefore, for example, as shown in FIG. 40, a seal member 24 should be put on a part of a surface of eaves section 23b which engages with eaves section 23a, on a part of a surface of eaves section 23a which engages with eaves section 23b, or on a part of the engaging surfaces of both eaves section 23a and a stepped portion 23b. In such a case, by seal member 24, liquid Lq can be kept from entering the gap between eaves section 23a and eaves section 23b, which can prevent the leakage from occurring below wafer stage WST1 and/or WST2. Incidentally, as seal member 24, for example, an elastic seal member consisting of fluororubber or the like is used. Further, instead of pasting seal member 24, a water repellent coating can be applied by Teflon® or the like on the engagement surface of eaves section 23a with the engagement surface of eaves section 23b, and/or the engagement surface of eaves section 23b with the engagement surface of eaves section 23a.

In the embodiment, as described above, liquid immersion area 14 can be moved between wafer tables WTB1 and WTB2, via eaves sections 23a and 23b. On this movement, because the state where eaves sections 23a and 23b are in contact or in proximity is maintained, this can also prevent liquid Lq of liquid immersion area 14 from leaking from the gap between eaves section 23a and eaves section 23b. Accordingly, liquid immersion area 14 can be moved between wafer tables WTB1 and WTB2 without getting reflection mirrors 27f and 27e wet with liquid Lq. By this arrangement, recovery operation of liquid Lq from the lower part of projection optical system PL becomes unnecessary, which makes it possible to improve throughput compared with the case when recovery and supply of liquid Lq are performed.

Figure 4B:
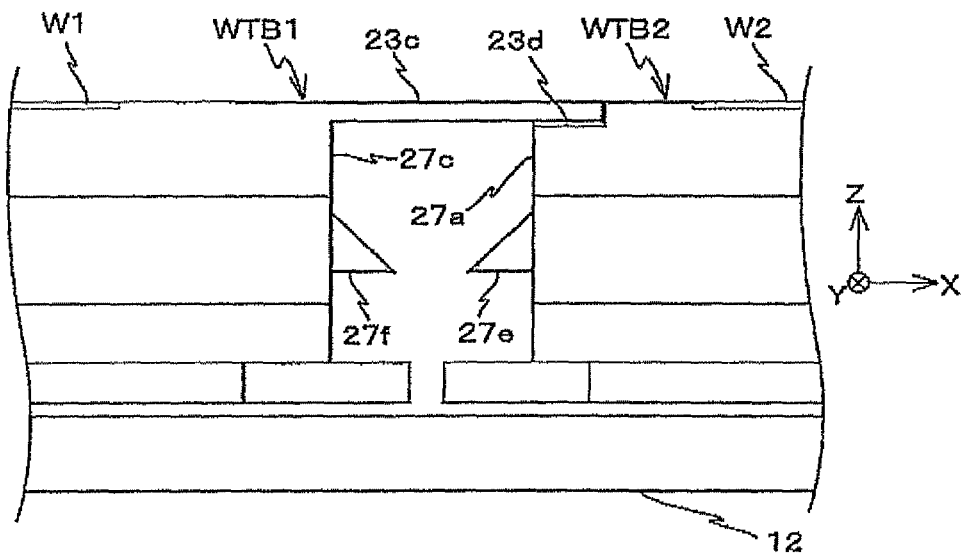
Figure 4C:
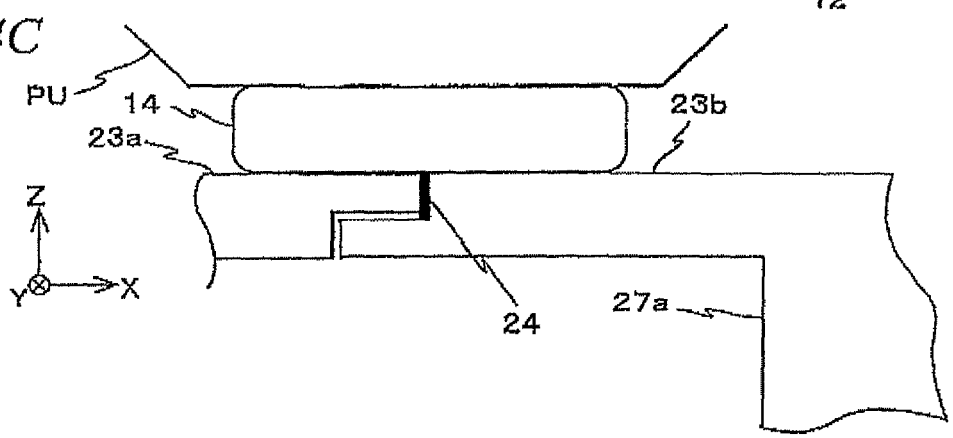

Incidentally, in the description above, while the case has been described where eaves sections 23a and 23b are arranged in wafer tables WTB1 and WTB2, respectively, for example, eaves section 23c can be arranged in wafer table WTB1 and a stepped portion 23d which fits in eaves section 23c can be arranged in water table WTB2 as shown in FIG. 4B. Or, on the contrary, the stepped portion can be arranged in wafer table WTB1 and the eaves section can be arranged in water table WTB2. In this case as well, in the scrum state of both wafer stages WST1 and WST2 where eaves section 23c and stepped portion 23d are fitted together, the length of eaves section 23c should be set to a length so that wafer stage WST1 and wafer stage WST2 is kept front coming into contact, and reflection mirror 27f and reflection mirror 27e can also be kept from coming into contact.

Furthermore, in wafer stages WST1, WST2, various measurement devices and measurement members such as a confidential bar (CD bar), an uneven illuminance measuring sensor, an aerial image measuring instrument, a wavefront aberration measuring instrument, an illuminance monitor and the like disclosed in, for example, the pamphlet of International Publication 2007/097379 can be arranged.

In the embodiment, from the −X side end of wafer stage WST1, a wiring/piping cable connects to a first cable shuttle (not shown) movable in the Y-axis direction arranged on the −X side of base board 12 (a movement guide surface of wafer stages WST1 and WST2). Similarly, from the +X side end of wafer stage WST2, a wiring/piping cable connects to a second cable shuttle (not shown) movable in the Y-axis direction arranged on the +X side of base board 12. By these cables, power supply to the Z leveling mechanism and the measurement devices, and the supply of pressurized air to the air sliders arranged in both wafer stages WST1 and WST2 are performed.

Next, interferometer system 118 which configures a part of measurement system 200 will be described.

As shown in FIGS. 2B and 3B, reflection surfaces 27a, 27b, 27c, and 27d are formed on the −X side end surface, +Y side end surface, +X side end surface, and −Y side end surface of wafer tables WTB1 and WTB2, respectively. Furthermore, reflection mirrors 27e and 27f having an inclination of 45 degrees with respect to reflection surfaces 27a and 27c, respectively, are installed on the −X side and +X side of wafer stages WST1 and WST2. Further, as shown in FIGS. 1 and 5, reflection plates 25A and 25B having rectangular plate shapes are placed with their reflection surfaces facing wafer stages WST1 and WST2 (wafer tables WTB1 and WTB2) on the +X side and −X side of projection unit PU, with their longitudinal directions in the X-axis direction. Reflection plates 25A and 253 are installed on the lower surface of a mainframe holding projection unit PU and the like.

As shown in FIG. 5, interferometer system 118 includes four Y interferometers 16, 17, 18, and 19, and four XZ interferometers 116, 117, 126, and 127. Y interferometers 16, 17, and 18 are placed on the +Y side of base board 12, at different positions in the X-axis direction. Y interferometer 19 is placed on the −Y side of base board 12, facing Y interferometer 17, XZ interferometers 116 and 117 are placed on the X side of base board 12, at a predetermined distance in the Y-axis directions. Further, XZ interferometers 126 and 127 are placed on the +X side of base board 12, facing XZ interferometers 116 and 117, respectively.

Figure 6:
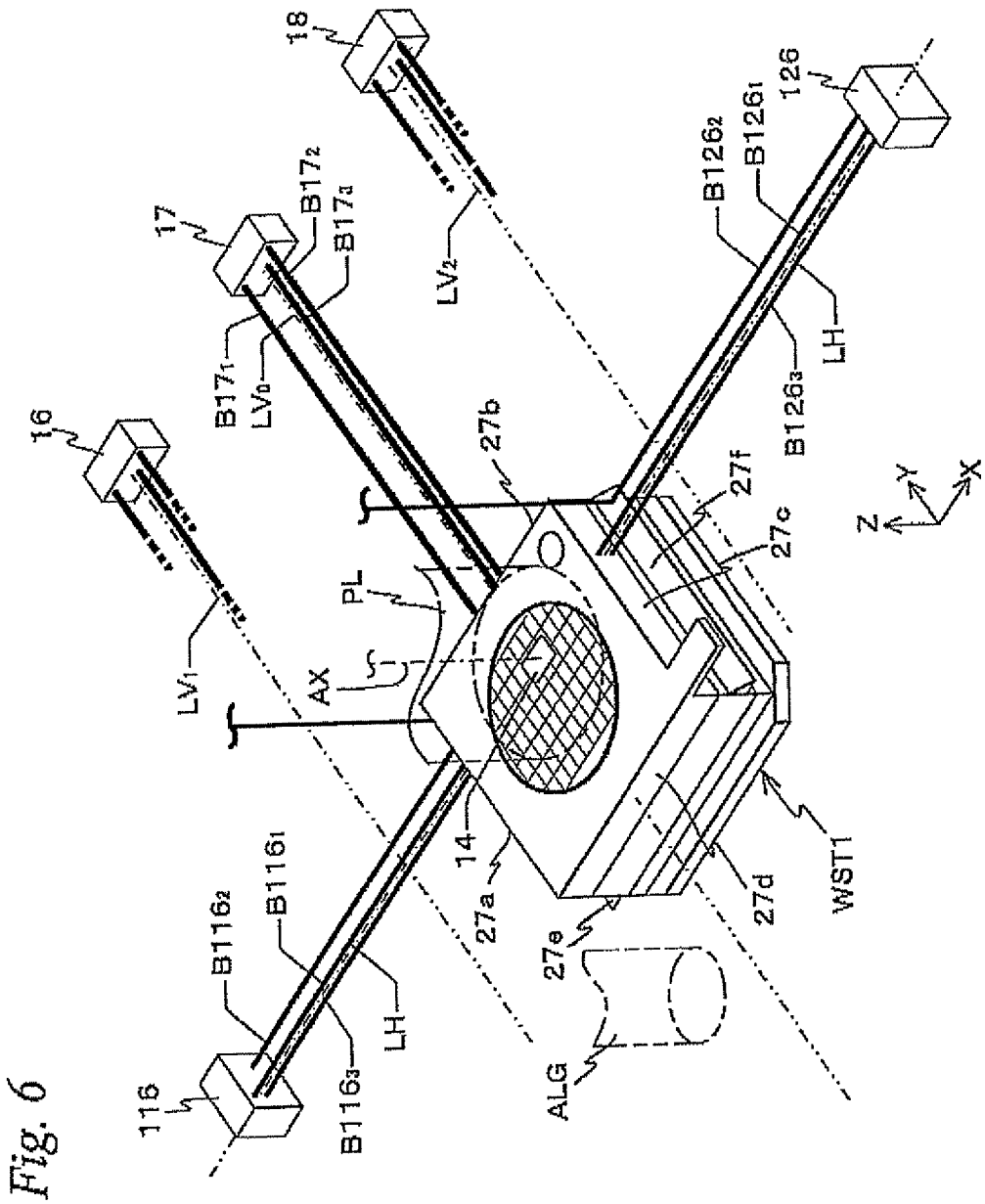
FIG. 6 is a view to explain position measurement of the wafer stage using three multiaxial interferometers.

More specifically, as shown in FIG. 6, Y interferometer 17 irradiates two measurement beams $B17_1$ and $B17_2$, which are parallel to the Y-axis and spaced apart equally in the ±X direction from a straight line (reference axis) $LV_0$ parallel to the Y-axis connecting optical axis AX of projection optical system PL and the detection center of alignment system ALG, on reflection surface 27b of wafer table WTB1 (or WTB2), and by receiving the reflected lights of measurement beams $B17_1$ and $B17_2$, measures the displacement of reflection surface 27b in the Y-axis direction (serving as a first and second positional information) at the irradiation points of measurement beams $B17_1$ and $B17_2$. The first and the second positional information is sent to main controller 20. Main controller 20 computes the position (the Y position) of wafer table WTB1 (or WTB2) in the Y-axis direction, based on an average value of the first and second positional information. That is, the substantial measurement axis in the Y-axis direction of Y interferometer 17 coincides with reference axis $LV_0$. Further, main controller 20 computes rotation information (yawing amount) in the θz direction of wafer table WTB1 (or WTB2), based on a difference between the first and second positional information.

Further, Y interferometer 17 irradiates another measurement beam $B17_3$, which is a predetermined distance away in the −Z direction from measurement beams $B17_1$ and $B17_2$, on reflection surface 27b, and by receiving the reflected light of measurement beam $B17_3$, measures the displacement of reflection surface 27b in the Y-axis direction (serving as a third positional information) at the irradiation point of measurement beam $B17_3$, and sends the measurement to main controller 20. Main controller 20 computes rotation information (pitching amount) in the ex direction of wafer table WTB1 (or WTB2), based on the third positional information, and the first and second positional information.

Y interferometers 16, 18, and 19 are used in a similar manner as Y interferometer 17, to measure the Y position, the pitching amount, and the yawing amount of one of, or both of the water tables WTB1 and WTB2. Y interferometers 16 and 18 have measurement axes $LV_1$ and $LV_2$ which are parallel to reference axis $LV_0$, respectively. Further, reference axis $LV_0$ serves as a substantial measurement axis of Y interferometer 19, and Y interferometer 19 irradiates three measurement beams on reflection surface 27d of wafer table WTB1 (or WTB2).

In XZ interferometers 116 and 126, a reference axis LH, which is orthogonal to optical axis AX of projection optical system PL and reference axis LV0, serves as a measurement axis in the X-axis direction. More specifically, as shown in FIG. 6, XZ interferometer 116 irradiates a measurement beam $B116_1$ on reflection surface 27a of wafer table WTB1 (or WTB2) along measurement axis LH, and by receiving the reflected light of measurement beam $B116_1$ on reflection surface 27a, measures the displacement of reflection surface 27a in the X-axis direction (serving as a fourth positional information) at the irradiation point of measurement beam $B116_1$. Similarly, XZ interferometer 126 irradiates a measurement beam $B126_1$ on reflection surface 27c of wafer table WTB1 (or WTB2) along measurement axis LH, and by receiving the reflected light of measurement beam $B126_1$ on reflection surface 27c, measures the displacement of reflection surface 27 in the X-axis direction (serving as a fifth positional information) at the irradiation point of measurement beam $B126_1$. The fourth and fifth positional information is sent to main controller 20. Main controller 20 computes the X position of wafer table WTB1 (or WTB2), based on the fourth and fifth positional information.

Further, XZ interferometer 116 irradiates a measurement beam (Z measurement beam) $B116_2$ on the reflection surface of reflection mirror 27e arranged in wafer table WTB1 (or WTB2), in parallel with measurement axis LH. Measurement beam $B116_2$ is reflected in the +Z direction by reflection mirror 27e, and is irradiated on the reflection surface of reflection plate 25B previously described. The reflected light of measurement bean $B116_2$ from the reflection surface of reflection plate 253 follows the original optical path back, and is received by XZ interferometer 116. XZ interferometer 116 measures an optical path length (change) of measurement beam $B116_2$, and sends the measurement results to main controller 20. Similarly, XZ interferometer 126 irradiates a measurement beam (Z measurement bean) $B126_2$ on the reflection surface of reflection mirror 27f arranged in wafer table WTB1 (or WTB2), in parallel with measurement axis LH. Measurement beam $B126_2$ is reflected in the +Z direction by reflection mirror 27f, and is irradiated on the reflection surface of reflection plate 25A previously described. The reflected light of measurement beam $B126_2$ from the reflection surface of reflection plate 25A follows the original optical path back, and is received by XZ interferometer 126. XZ interferometer 126 measures an optical path length (change) of measurement beam $B126_2$, and sends the measurement results to main controller 20.

Main controller 20 computes the Z position (to be expressed as Ze) of the irradiation point on the reflection surface of reflection mirror 27e of measurement beam $B116_2$ from a difference between the optical path length of measurement beam $B116_1$ and the optical path length of measurement beam $B116_2$ obtained from the fourth positional information previously described.

Further, main controller 20 computes the Z position (to be expressed as Zf) of the irradiation point on the reflection surface of reflection mirror 27f of measurement beam $B126_2$ from a difference between the optical path length of measurement beam $B126_1$ and the optical path length of measurement beam $B126_2$ obtained from the fifth positional information previously described. Furthermore, from an average value and a difference of the two Z positions Ze and Zf, main controller 20 computes a Z position and the rotation information (rolling amount) in the θy direction of wafer table WTB1 (or WTB2).

Furthermore, as shown in FIG. 6, XZ interferometers 116 and 126 irradiate measurement beams $B116_3$ and $B126_3$ which are parallel to measurement axis LH but a predetermined distance away in the −Z direction from measurement beams $B116_1$ and $B126_1$, on reflection surfaces 27a and 27c, respectively. And XZ interferometers 116 and 126 receive the reflected lights of measurement beams $B116_3$ and $B126_3$, and measure the displacement of reflection surfaces 27a and 27c in the X-axis direction (serving as a sixth and seventh positional information) at the irradiation point of measurement beams $B116_3$ and $B126_3$. The sixth and seventh positional information is sent to main controller 20. Main controller 20 computes the rolling amount (expressed as θy1) of wafer table WTB1 (or WTB2), based on the fourth positional information and the sixth positional information. Further, main controller 20 computes the rolling amount (expressed as θy2) of wafer table WTB1 (or WTB2), based on the fifth positional information and the seventh positional information. Further, main controller 20 computes the Z position of wafer table WTB1 (or WTB2), based on Z position (Ze) and tolling amount θy1 described above. Further, main controller 20 computes the Z position of wafer table WTB1 (or WTB2), based on Z position (Zf) and rolling amount θy2 described above.

However, the separation distance of measurement beams $B116_1$ and $B116_3$ and the separation distance of measurement beams $B126_1$ and $B126_3$ are shorter when compared with the distance in the X-axis direction of the irradiation points of measurement beans (Z measurement beams) $B116_2$ and $B126_2$ on the reflection surface of reflection mirrors 27e and 27f. Accordingly, the measurement accuracy of the rolling amount of wafer table WTB1 (or WTB2) is inferior when compared with the measurement using Z measurement beams $B116_2$ and $B126_2$ previously described. Therefore, rain controller 20 is to perform measurement of the positional information (rolling amount) in the θy direction of wafer table WTB1 (or WTB2) and the Z position using Z measurement beams $B116_2$ and $B126_2$, or more specifically, using both XZ interferometers 116 and 126 as a general rule, and as an alternative method, exceptionally, is to perform measurement using only either one of XZ interferometers 116 and 126. Incidentally, an example of the use of the alternative method will be described later on.

XZ interferometers 117 and 127 are used like XZ interferometers 116 and 126, to measure the X position, the Z position, and the position (rolling amount) in the θy direction of wafer table WTB1 (or WTB2) at the time of wafer alignment and the like. Incidentally, the measuring method is similar to the measurement using XZ interferometers 116 and 126, except for the point that a reference axis LA (refer to FIG. 5) which is parallel to the X-axis and is orthogonal to reference axis $LV_0$ at the detection center of alignment system ALG is used as the measurement axis.

Figure 10:
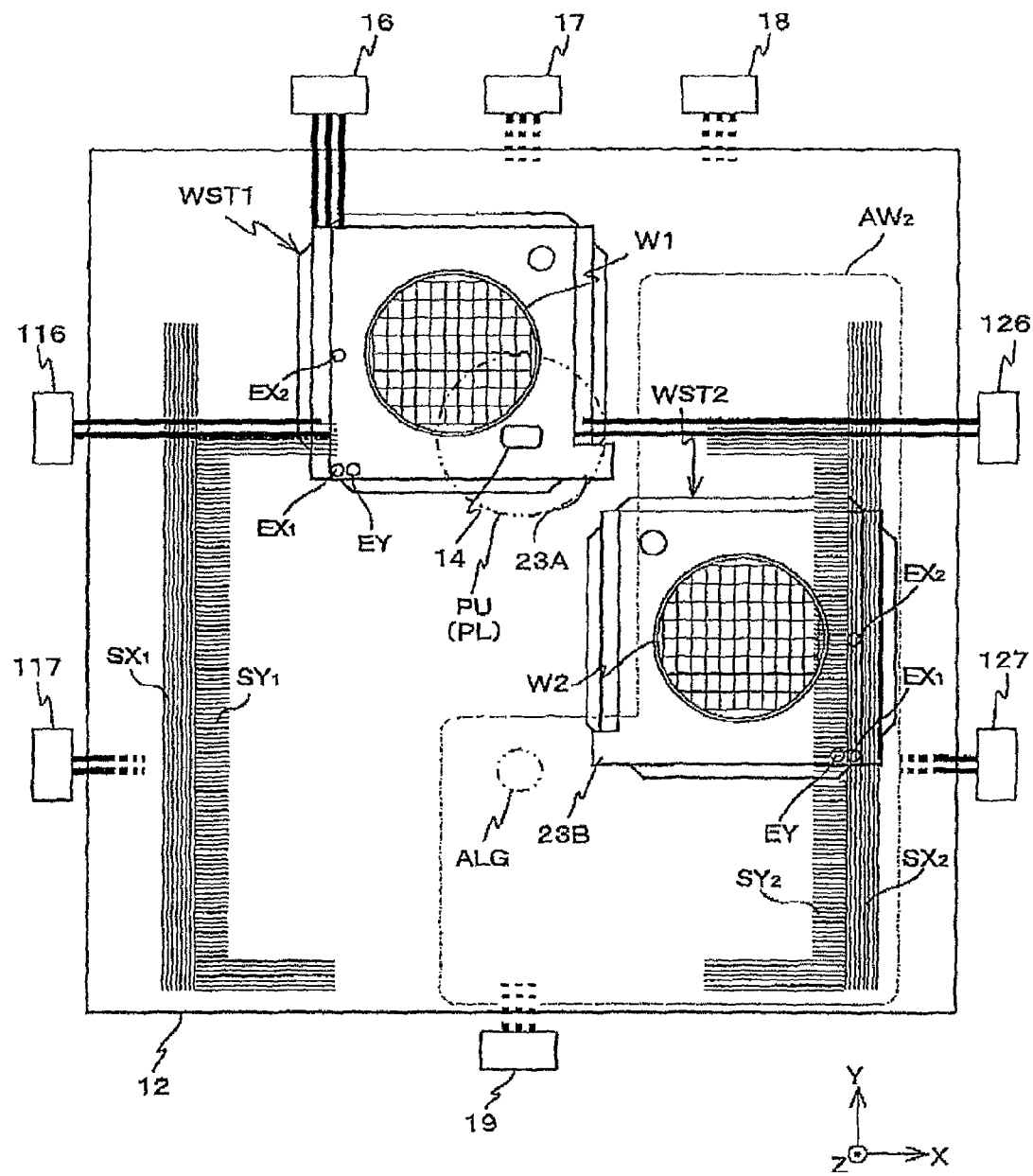
FIG. 10 is a view showing a state in which wafer stage WST2 moves from an alignment area to an exposure area via a second waiting area, along a path set by a placement of and encoder head and a scale, according to results of position measurement using an encoder.
Figure 12:
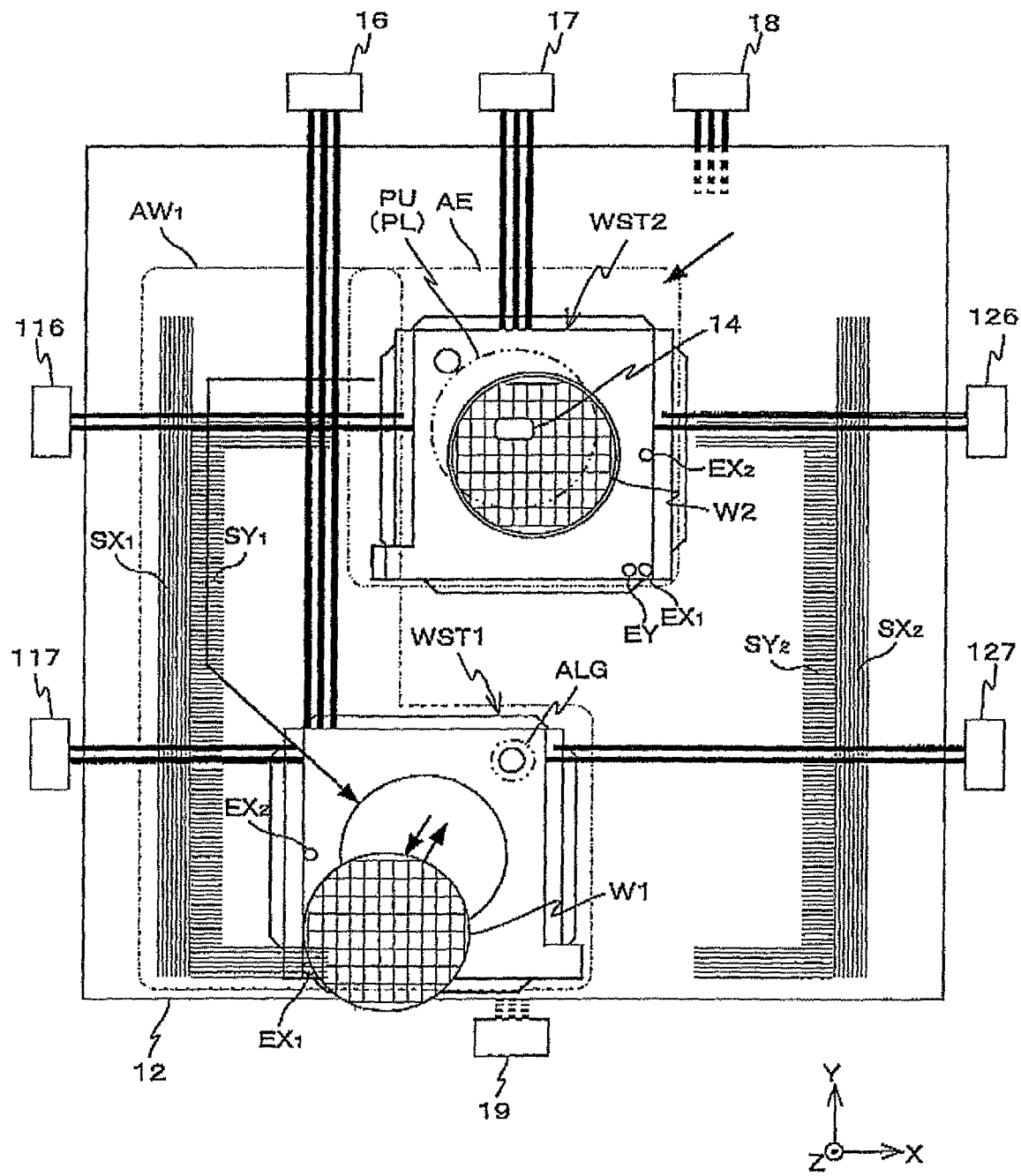
FIG. 12 is a view showing a state where exposure is performed on a water placed on wafer stage WST2, and wafer exchange is performed on wafer stage WST1.

As described above, by using interferometer system 118 including Y interferometers 16, 17, 18, and 19 and XZ interferometers 116, 117, 126, and 127, positional information of wafer table WTB1 (or WTB2) in directions of six degrees of freedom (X, Y, Z, θx, θy, and θz) can be measured. Incidentally, based on the placement of the individual interferometers, main controller 20 uses Y interferometer 17 and XZ interferometers 116 and 126 in movement area AE at the time of exposure, whereas in an alignment area AA (refer to FIG. 9) in the vicinity of alignment system ALG where wafer stages WST1 and WST2 move at the time of wafer alignment, Y interferometer 19 and XZ interferometers 117 and 127 are used. Further, for example, as shown in FIG. 12, main controller 20 uses Y interferometer 16 and XZ interferometers 116 and 126 or 117 and 127 at the first waiting area (an area on the −X side on base board 12) AW for wafer stage WST1 where wafer stage WST1 moves back and forth between exposure time movement area AE and alignment area AA, whereas, for example, as shown in FIG. 10, at the second waiting area (an area on the +X side of base board 12) AW2 for wafer stage WST2 where wafer stage WST2 moves back and forth between exposure time movement area AE and alignment area AA, Y interferometer 18 and XZ interferometers 116 and 126 or 117 and 127 are used.

In the embodiment, in order to measure positional information of wafer table WTB1 (or WTB2) in the XY plane, an encoder system 150 (refer to FIG. 7) is arranged separately from interferometer system 118 described above. Therefore, main controller 20 mainly uses interferometer system 118 for position measurement of wafer table WTB1 (or WTB2), and encoder system 150 is used when wafer stage WST1 (or WST2) is located outside the measurement area of interferometer system 118 as it will be described later on. As a matter of course, main controller 20 can perform position measurement of wafer table WTB1 (or WTB2) within the XY plane using interferometer system 118 and encoder system 150 together.

Next, details on encoder system 150 configuring a part of measurement system 200 will be described. Encoder system 150 can measure the position (X, Y, θz) of wafer stages WST1 and WST2 within the XY plane independently from interferometer system 118. In the embodiment, encoder system 150 is mainly used for position measurement of both wafer stages WST1 and WST2 when wafer stages WST1 and WST2 move along the movement paths within the first and second waiting areas AW1 and AW2 between exposure tire movement area AZ and alignment area AA, respectively.

On each of wafer stages WST1 and WST2, three encoder heads (hereinafter shortly referred to as a head), or to be more specific, two X heads whose measurement direction is in the X-axis direction and one Y head whose measurement direction is in the Y-axis direction are mounted upward so that the measurement beams are emitted upward (the +Z direction). More specifically on the upper surface of wafer table WTB1, as shown in FIG. 2B, an X head $EX_1$ and a Y head EY are placed adjacent in the X-axis direction in the vicinity of the −X side end and the −Y side end, and an X head $EX_2$ is placed around the center in the Y-axis direction on the −X side end.

Further, on the upper surface of wafer table WTB2, as shown in FIG. 3B, X heads $EX_1$ and $EX_2$ and a Y head EY are mounted, in an arrangement symmetric to the three heads on the upper surface of wafer table WTB1. As each encoder head above, a encoder head of the interference type disclosed in, for example, U.S. Pat. No. 7,238,931 is used.

In the embodiment, a configuration is employed where measurement beams outgoing from each encoder head mounted on wafer stages WST1 and WST2 are irradiated on a scale (a grating section) formed on reflection plates 25A and 25B previously described. More specifically, as shown in FIG. 5, an X scale $SX_1$ whose longitudinal direction is in the Y-axis direction is formed, slightly on the −X side from the center in the X-axis direction of the reflection surface of reflection plate 25B. X scale $SX_1$ is configured of a diffraction grating having grid lines whose longitudinal direction is in the Y-axis direction arranged at a predetermined pitch (for example, 1 μm) in the X-axis direction.

Further, Y scale $SY_1$ is formed adjacent to the +X side of X scale $SX_1$ on the reflection surface of reflection plate 25B. Y scale $SY_1$ has a narrow rectangular shaped main area whose longitudinal direction is in the Y-axis direction, and a pair of sub areas (extended areas) consisting of rectangular shaped areas extending in the +X direction from both ends on the ±Y side of the main area. Y scale $SY_1$ is configured of a diffraction grating having grid lines whose longitudinal direction is in the X-axis direction arranged at a predetermined pitch (for example, 1 μm) in the Y-axis direction.

On the reflection surface of reflection plate 25A, X scale $SX_2$ and Y scale $SY_2$ are formed in a placement symmetric to X scale $SX_1$ and Y scale $SY_1$. X scale $SX_2$ and Y scale $SY_2$ are consisting of diffraction gratings having a configuration similar to X scale $SX_1$ and Y scale $SY_1$.

In the embodiment, X heads $EX_1$ and $EX_2$ whose measurement direction is in the X-axis direction irradiate measurement beams on X scales $SX_1$ and $SX_2$, respectively, and by receiving the reflected lights, the relative displacement of the X heads themselves in the X-axis direction with respect to the X scales on which the measurement beams were irradiated is detected.

Similarly, Y head $EY_1$ whose measurement direction is in the Y-axis direction irradiates measurement beams on Y scales $SY_1$ and $SY_2$, and by receiving the reflected lights, the relative displacement of the Y head itself in the Y-axis direction with respect to the Y scales on which the measurement beams were irradiated is detected.

In the embodiment, for example, as shown in FIG. 5, when wafer stage WST1 is located at a position on the −X side end as well as the +Y side end of the movement path in which wafer stage WST1 moves from exposure time movement area AE to a first loading position and alignment area AA via the first waiting area AW1, X heads $EX_1$ and $EX_2$ mounted on wafer stage WST1 face X scale $SX_1$, and Y head EY faces Y scale $SY_1$. From each head facing the corresponding scales herein, measurement information of the relative displacement of the heads to the corresponding scales for each measurement direction is sent to main controller 20. Main controller 20 computes the position (the position in the K-axis direction, the Y-axis direction, and the θz direction) of wafer stage WST1 within the XY plane, based on the measurement information of each head.

The first loading position herein is the position where wafer exchange is performed on wafer stage WST1, and, in the embodiment, the first loading position is placed within the first waiting area AW1 and is decided to be a position of wafer stage WST1 where fiducial mark plate FM1 is positioned right under alignment system ALG with a position of positioned wafer stage WST1.

Incidentally, when wafer stage WST1 moves in the +X direction from the state shown in FIG. 5, X heads $EX_1$ and $EX_2$ move off from X scale $SX_1$. In this case, main controller 20 measures the position of wafer stage WST1 using Y head EY, XZ interferometer 116 (or XZ interferometers 116 and 126), and Y interferometer 6E. When wafer stage WST1 moves further in the +X direction by a predetermined distance, Y head EY also moves off from Y scale $SY_1$. In this case, main controller 20 measures the position of wafer stage WST1 using interferometer system 119, or more particularly, using Y interferometer 16 and XZ interferometer 116 (or Y interferometer 16 and XZ interferometers 116 and 126).

Further, when wafer stage WST2 is located at a position on the +X side end as well as the +Y side end of the movement path in which wafer stage WST2 moves from exposure time movement area AE to a second loading position and alignment area AA via the second waiting area AW2, X heads $EX_1$ and $EX_2$ mounted on wafer stage WST2 face X scale $SX_2$, and Y head EY faces Y scale $SY_2$. Main controller 20 computes the position of wafer stage WST2 within the XY plane in the movement plane, based on the measurement results of these three heads. Incidentally, when the heads move off from the corresponding scales, position measurement is switched to the position measurement using interferometer system 118, as previously described.

The second loading position herein is the position where wafer exchange is performed on wafer stage WST2, and, in the embodiment, the second loading position is placed within the second waiting area AW2 and is decided to be a position of wafer stage WST2 where fiducial mark plate FM2 is positioned right under alignment system ALG with a position of positioned wafer stage WST2.

By employing the placement shown in FIG. 5 of scales $SX_1$ and $SY_1$ and the placement of heads $EX_1$, $EX_2$, and EY mounted on wafer stage WST1, position measurement using only encoder system 150 is possible when wafer stage WST1 moves from exposure time movement area AE to the first loading position and alignment area AA via the first waiting area AW1, or when wafer stage WST1 moves in reverse, in at least a straight line path extending in the Y-axis direction in the movement paths of wafer stage WST1. Similarly, by employing the placement of scales $SX_2$ and $SY_2$ and the placement of heads $EX_1$, $EX_2$, and EY mounted on wafer stage WST2, position measurement using only encoder system 150 is possible when wafer stage WST2 moves from exposure time movement area AE to the second loading position and alignment area AA via the second waiting area AW2, or when wafer stage WST2 moves in reverse, in at least a straight line path extending in the Y-axis direction in the movement paths of wafer stage WST2. By such placements, switching process between XZ interferometers 116 and 117, switching process between XZ interferometers 126 and 127, and reset (origin reset) of the interferometer to be used after the switching which are essential in the case of performing position measurement of wafer stages WST1 and WST2 that move along the straight line path described above using interferometer system 118, will not be required. Accordingly, the throughput can be improved when compared with the case when interferometer system 118 is used.

FIG. 7 shows the main configuration of the control system of exposure apparatus 100. The control system is mainly configured of main controller 20 composed of a microcomputer (or workstation) that performs overall control of the entire apparatus.

Next, a parallel processing operation that uses wafer stage WST1 and wafer stage WST2 will be described, based on FIGS. 8 to 12, and FIG. 5. Incidentally, during the operation described below, main controller 20 controls liquid supply device 5 and liquid recovery device 6 as is previously described so that in the space right under tip lens 191 of projection optical system PL, a constant quantity of liquid Lq is held therein, which constantly forms liquid immersion area 14.

Figure 8:
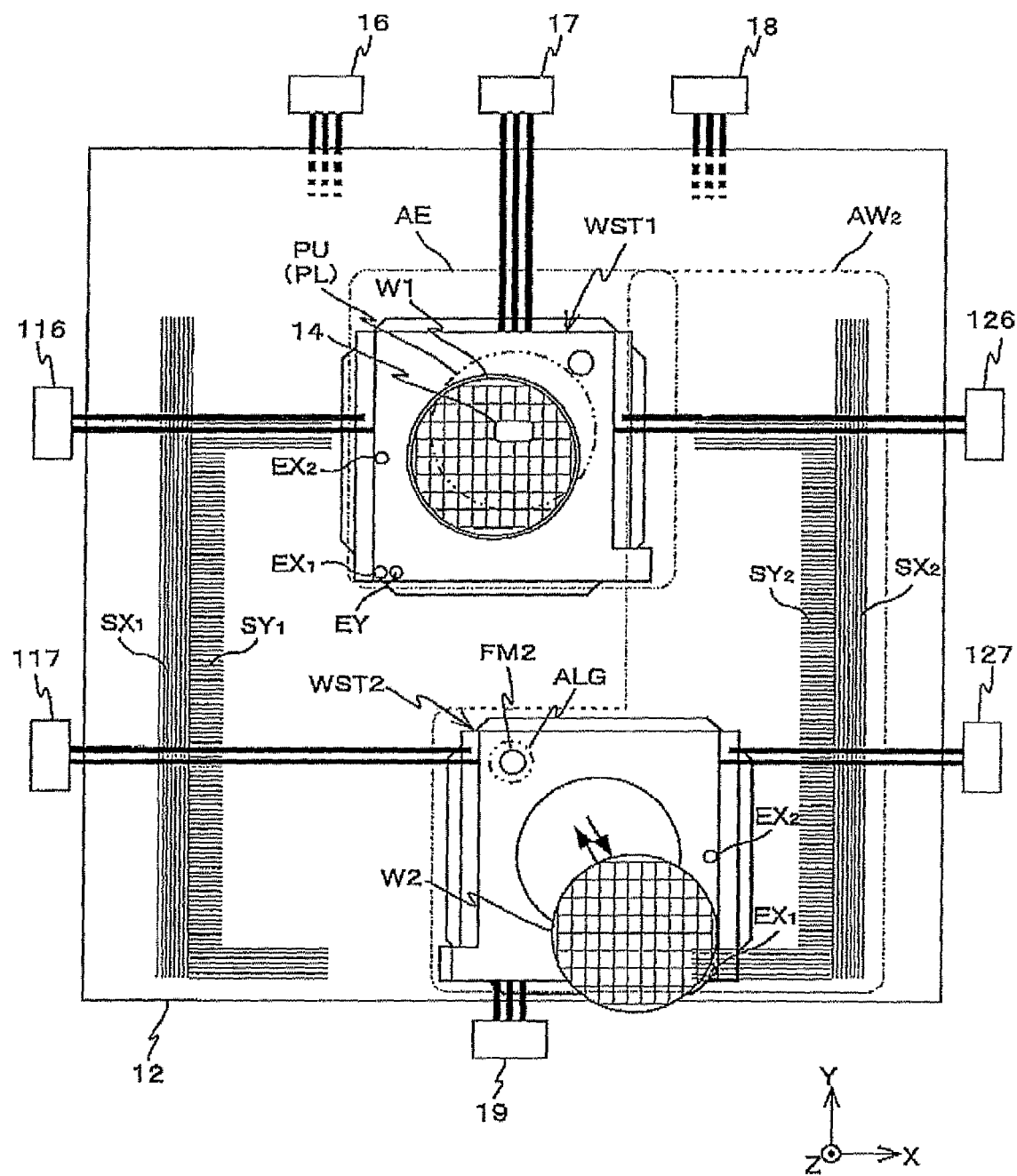
FIG. 8 is a view showing a state where exposure is performed on a wafer placed on wafer stage WST1, and wafer exchange is performed on wafer stage WST2.

FIG. 8 shows a state in which exposure by the step-and-scan method is performed on wafer W1 mounted on wafer stage WST1 in exposure time movement area AE, and wafer exchange is concurrently performed between a water carriage mechanism (not shown) and wafer stage WST2, at a second loading position within the second waiting area AW.

During the wafer exchange described above and after the wafer exchange, while wafer stage WST2 comes to a standstill at the second loading position, main controller 20 resets (origin reset) Y interferometer 19 and XZ interferometers 117 and 127, prior to beginning wafer alignment (and other pre-processing measurements) of a new wafer W2.

When wafer exchange (loading of the new wafer W2) and reset of interferometers 19, 117, and 127 are completed, main controller 20 detects the second fiducial mark on fiducial mark plate FM2, using alignment system ALG. Then, main controller 20 detects the position of the second fiducial mark which uses the index center of alignment system ALG as a reference, and based on the detection results and results of position measurement of wafer stage WST2 according to interferometers 19, 117, and 127 at the time of the detection, main controller 20 computes the position coordinate of the second fiducial mark in an orthogonal coordinate system (an alignment coordinate system) which uses reference axis LA and reference axis $LV_0$ as the coordinate axes.

Next, main controller 20 moves wafer stage WST2 to alignment area AA, as shown in FIG. 9. Then, main controller performs enhanced global alignment (EGA), while measuring the position coordinate of wafer stage WST2 in alignment area AA (in the alignment coordinate system) using interferometers 19, 117, and 127. To explain this in detail, main controller 20 detects a plurality of alignment marks arranged in a plurality of shot areas (sample shot areas) which are specified on wafer W2 using alignment system ALG and obtains their position coordinates while controlling the position coordinate of wafer stage WST2 using interferometers 19, 117, and 127. Based on the position coordinate which has been obtained and a design position coordinate, a statistics operation disclosed in, for example, U.S. Pat. No. 4,780,617 and the like is performed, and a position coordinate of the plurality of shot areas in the alignment coordinate system is computed. Furthermore, the position coordinate of the second fiducial mark detected earlier is subtracted from the position coordinate that has been computed, and the position coordinate of the plurality of shot areas on wafer W2 using the position of the second fiducial mark as an origin is obtained.

The wafer exchange/wafer alignment sequence described above is normally completed earlier than the exposure sequence. Therefore, when wafer alignment has been completed, main controller 20 moves wafer stage WST2 to a predetermined waiting position on the straight line path extending in the Y-axis direction within the second waiting area AW2 previously described. At this point, main controller 20 makes wafer stage WST2 return to the second loading position previously described once. This makes Y head EY mounted on wafer stage WST2 face Y scale $SY_2$ (refer to FIG. 8). Therefore, at the point when Y head EY faces Y scale $SY_2$, main controller 20 switches the measurement of the Y position of wafer stage WST2 from the measurement using Y interferometer 19 to the measurement using Y head EY. Then, main controller 20 drives wafer stage WST2 in the +X direction. This makes X heads $EX_1$ and $EX_2$ face X scale $SX_2$. Therefore, at the point when X heads $EX_1$ and $EX_2$ face X scale $SX_2$, main controller 20 switches the measurement of the X position of wafer stage WST2 and the θz position from the measurement using interferometer system 118 to the measurement using X heads $EX_1$ and $EX_2$. Then, main controller 20 makes wafer stage WST2 wait at the predetermined waiting position above, until exposure of wafer W1 on wafer stage WST1 has been completed.

When exposure to wafer W1 on wafer table WTB1 has been completed, main controller 20 begins the drive of wafer stages WST1 and WST2 to their predetermined positions (right side scrum positions) within scrum state movement area AS, shown in FIG. 11. After the movement of wafer stage WST1 to the right side scrum position begins, main controller 20 switches the Y interferometer used in position measurement of wafer stage WST1 from Y interferometer 17 to Y interferometer 16. Further, at this point, main controller 20 measures the position of wafer stage WST2 using encoder heads $EX_1$, $EX_2$, and EY as shown in FIG. 10, and based on the measurement results, moves wafer stage WST2 along a path (straight line path) set by the placement of heads $EX_1$, $EX_2$, and EY and the corresponding scales $SX_2$ and $SY_2$.

Further, at this point, the three measurement beams of XZ interferometer 126 which have been irradiated on wafer stage WST1 are interrupted by wafer stage WST2 which moves toward the right side scrum position, and the position of wafer stage WST1 using XZ interferometer 126 can no longer be measured. Therefore, main controller 20 measures the X, z, and θy positions of wafer table WTB1, using only XZ interferometer 116. Main controller 20 uses the alternative method previously described herein to measure the θy position and the Z position.

Further, main controller 20 switches the measurement of the X position and the θz position of wafer stage WST2 from the measurement using heads $EX_1$ and $EX_2$ to the measurement using XZ interferometer 126 and Y interferometer 18 when wafer stage WST2 arrives at the right side scrum position shown in FIG. 11. At this point, main controller 20 pre-sets (however, the measurement by Y head EY is continued) XZ interferometer 126 and Y interferometer 18, based on the measurement values of heads $EX_1$, $EX_2$, and EY. Further, as is obvious from FIG. 11, in the state where water stage WST2 has moved to the right side scrum position, because the three measurement beams of XZ interferometer 116 are interrupted by wafer stage WST1, main controller 20 uses only XZ interferometer 126 to measure the X, Z, and θy positions of wafer table WTB2. Main controller 20 also employs the alternative method previously described herein to measure the θy position and the Z position.

And, in the state where both wafer stages WST1 and WST2 have moved to the right side scrum position within scrum state movement area AS, eaves section 23a of wafer stage WST1 becomes engaged with eaves section 23b of wafer stage WST2, and both wafer stages WST1 and WST2 move into a serum state where the stages are in proximity or in contact via eaves sections 23a and 23b, as shown in FIG. 11. Further, at this point, as shown in FIG. 11, Y head EY mounted on water stage WST1 faces Y scale $SY_1$. Therefore, main controller 20 switches the measuring instrument used to measure the Y position of wafer stage WST1 from interferometer 16 to Y head EY. Then, main controller 20 drives both wafer stages WST1 and WST2 in the −X direction, while keeping this scrum state. Incidentally, at this point, the measurement of the X, Y positions of wafer stage WST1 is performed using Y head EY mounted on wafer stage WST1 and XZ interferometer 116 (however, Y interferometer 16 is used for the measurement of the θz position), and the measurement of the X, Y positions of wafer stage WST2 is performed using Y head EY mounted on wafer stage WST2 and XZ interferometer 126 (however, Y interferometer 18 is used for the measurement of the θz position), and both wafer stages WST1 and WST2 are driven according to these measurement results. Incidentally, at this point, it is possible to measure the Y position of wafer stages WST1 and WST2 using Y interferometers 16 and 18, respectively.

As water stages WST1 and WST2 move in the –X direction within serum state movement area AS while keeping the scrum state, liquid immersion area 14 formed in the space between tip lens 191 and wafer table WTB1 sequentially moves from the area over water table WTB1, eaves section 23$a$, eaves section 23$b$, and then to the area over wafer table WTB2. FIG. 5 shows the state right after liquid immersion area 14 has crossed eaves section 23$a$ from above wafer table WTB1 to above wafer table WTB2 in the manner described above.

When the movement of liquid immersion area 14 to above wafer table WTB2 is completed, encoder heads $EX_1$, $EX_2$, and EY mounted on wafer stage WST1 face their corresponding scales $SX_1$ and $SX_2$. Therefore, main controller 20 switches the position measurement of wafer stage WST1 in the XY plane from the measurement using XZ interferometer 116 and Y head EY to the measurement using X heads $EX_1$, $EX_2$ and Y head EY. Then, main controller 20 moves wafer stage WST1 to the first loading position shown in FIG. 12 along a path within the first waiting area AW1 set by the placement of the three heads $EX_1$, $EX_2$, and EY and the corresponding scales $SX_1$ and $SY_1$. After wafer stage WST1 arrives at the first loading position, main controller 20 switches the position measurement of wafer stage WST1 to the measurement using Y interferometer 19 and XZ interferometers 117 and 127.

In parallel with the movement of wafer stage WST1, main controller 20 drives wafer stage WST2 and positions fiducial mark plate FM2 directly below projection optical system PL. Prior to this, main controller 20 switches the position measurement of wafer stage WST2 in the XY plane from the measurement using Y head EY mounted on wafer stage WST2 and XZ interferometer 126 to the position measurement of wafer stage WST2 in the XY plane using Y interferometer 17 and XZ interferometers 116 and 126. Then, the pair of first fiducial marks on fiducial mark plate FM2 is detected using reticle alignment detection system 13 (refer to FIG. 7), and a relative position of the projected image on the wafer surface of the reticle alignment mark on reticle R corresponding to the first reference mark is detected. Incidentally, this detection is performed via projection optical system PL and liquid Lq forming liquid immersion area 14.

Main controller 20 computes the relative positional relation of the projection position (projection center of projection optical system PL) of the pattern of reticle R and each shot area on wafer W2, based on the relative position information which has been detected and the positional information which has been obtained beforehand of each shot area on wafer W2 using the second fiducial mark as a reference. And, based on the computation results, main controller 20 transfers the pattern of reticle R onto each shot area on wafer W2 by the step-and-scan method, while controlling the position of wafer stage WST2 as in the case of wafer W1 previously described. FIG. 12 shows the state where a pattern of reticle R is transferred onto each shot area on wafer W2 in the manner described above.

In parallel with the exposure operation to wafer W2 on wafer stage WST2 described above, main controller 20 performs wafer exchange between the wafer carrier mechanism (not shown) and wafer stage WST1 at the first loading position, and a new wafer W1 is mounted on wafer table WTB1. Then, main controller 20 detects the second fiducial mark on fiducial mark plate FM1, using alignment system ALG. Incidentally, prior to the detection of the second fiducial mark, main controller 20 resets (origin reset) Y interferometer 19 and XZ interferometers 117 and 127 in a state where wafer stage WST1 is at the first loading position. Then, main controller 20 performs wafer alignment (EGA) on wafer W1 as is previously described using alignment system ALG, while controlling the position of wafer stage WST1.

When wafer alignment (EGA) of wafer W1 on wafer table WTB1 has been completed and exposure of wafer W2 on wafer table WTB2 has also been completed, main controller 20 drives wafer stages WST1 and WST2 toward a left aide scrum position within scrum state movement area AS. This left side scrum position refers to a position in which wafer stages WST1 and WST2 are located at positions symmetrical to the right side scrum position shown in FIG. 11, with respect to reference axis $LV_0$ previously described. The measurement of the position of wafer stage WST1 during the drive to the left side scrum position is performed in a procedure similar to the position measurement of wafer stage WST2 previously described.

In this left side scrum position as well, eaves section 23$a$ of wafer stage WST1 becomes engaged with eaves section 23$b$ of wafer stage WST2, and both wafer stages WST1 and WST2 move into a scrum state. Main controller 20 drives both water stages WST1 and WST2 in the +X-direction, which is opposite to the preceding drive, while keeping this scrum state. With this drive, liquid immersion area 14 formed in the space between tip lens 191 and wafer table WTB2 moves sequentially in reverse, from wafer table WTB2, eaves section 23$b$, eaves section 23$a$, and then on wafer table WTB1. As a matter of course, position measurement of both wafer stages WST1 and WST2 is performed in a similar manner as before, even when the wafer stages are moved while maintaining the scrum condition. When the movement of liquid immersion area 14 has been completed, main controller 20 begins exposure of wafer W1 on wafer stage WST1 in a procedure similar to the one previously described. In parallel with this exposure operation, main controller 20 drives wafer stage WST2 in a similar manner as is previously described toward the second loading position via the second waiting area AW2, exchanges wafer W2 which has been exposed on wafer stage WST2 to a new wafer W2, and then performs wafer alignment on the new wafer W2.

Hereinafter, main controller 20 repeatedly performs the parallel operation using wafer stages WST1 and WST2 described above.

As is obvious from the description so far, by the pair of X encoders configured of the pair of X heads $EX_1$ and $EX_2$ facing X scale $SX_1$ and the Y encoder configured of Y head EY facing Y scale $SY_1$, a first encoder system is configured which measures positional information of wafer stage WST1 within the XY plane when water stage WST1 moves along a path in the X-axis direction when a state transition is performed between a first state in which wafer W1 is positioned at an exposure position where liquid immersion area 14 is formed and a second state in which wafer W1 is made to be withdrawn from the exposure position, or more specifically when wafer stage WST1 moves along a movement path between exposure time movement area AE and the area in the vicinity of the first loading position including a movement path within scrum state movement area AS and a movement path within the first waiting area AW1. Further, by the pair of X encoders configured of the pair of X heads $EX_1$ and $EX_2$ facing X scale $SX_2$ and the Y encoder configured of Y head EY facing Y scale $SY_2$, a second encoder system is configured which measures positional information of wafer stage WST1 within the XY plane when wafer stage WST2 moves along a path in the X-axis direction when a state transition is performed between a first state in which wafer W2 is positioned at an exposure position where liquid immersion area 14 is formed and a second state in which wafer W1 is made to be withdrawn from the exposure position, or more specifically when wafer stage WST2 moves along a movement path between exposure time movement area AE and the area in the vicinity of the second loading position including a movement path within scrum state movement area AS and a movement path within the second waiting area AW2. And encoder system 150 is configured, including the first encoder system and the second encoder system.

As described above, according to exposure apparatus 100 of the embodiment, by the pair of X encoders configured of the pair of X heads EX1 and EX2 facing X scale $SX_1$ and the Y encoder configured of Y head EY facing Y scale $SY_1$, positional information (including rotation information in the θz direction) within the XY plane of wafer stage WST1 is measured when water stage WST1 moves along a movement path within the first waiting area AW1 between exposure time movement area AE and the area in the vicinity of the first loading position, or more specifically, moves along the movement path substantially parallel path to the Y-axis previously described. Similarly, according to exposure apparatus 100 of the embodiment, by the pair of X encoders configured of the pair of X heads $EX_1$ and $EX_2$ facing X scale $SX_2$ and the Y encoder configured of Y head EY facing Y scale $SY_2$, positional information (including rotation information in the θz direction) within the XY plane of wafer stage WST2 is measured when wafer stage WST2 moves along a movement path within the second waiting area AW2 between exposure time movement area AE and the area in the vicinity of the second loading position, or more specifically, moves along the movement path substantially parallel path to the Y-axis previously described. Therefore, in exposure apparatus 100, the position of wafer stages WST1 and WST2 can be measured by encoder system 150 in the area where position measurement of wafer stages WST1 and WST2 by interferometer system 118 becomes difficult, and by measurement system 200 including interferometer system 118 and encoder system 150, positional information of wafer stages WST1 and WST2 within the XY plane can be constantly measured. Further, during the movement of wafer stages WST1 and WST2 along each of the movement paths described above, the switching process between XZ interferometers 116 and 117, and 126 and 126 is not required. Therefore, waste of time by the switching process of the interferometer can be avoided, which allows a high throughput to be maintained.

Further, according to exposure apparatus 100 of the embodiment, by just placing X scale $SX_1$ and Y scale $SY_1$ along the movement track of heads $EX_1$, $EX_2$ and EY corresponding to the movement path of wafer stage WST1 on the reflection surface of reflection plate 25A parallel to the XY plane, it becomes possible to control the position of wafer stage WST1 within the XY plane when wafer stage WST1 moves along the movement path within the first waiting area AW1 between exposure time movement area AE and the area in the vicinity of the first loading position. Similarly, by just placing X scale $SX_2$ and Y scale $SY_2$ along the movement track of heads $EX_1$, $EX_2$ and EY corresponding to the movement path of water stage WST2 on the reflection surface of reflection plate 25B parallel to the XY plane, it becomes possible to control the position of wafer stage WST2 within the XY plane when wafer stage WST2 moves along the movement path within the second waiting area AW2 between exposure time movement area AE and the area in the vicinity of the second loading position. Therefore, according to exposure apparatus 100, lowering the cost becomes possible when compared with the case when a grating is installed on the entire surface in the area between the exposure position and the first and second loading positions (more specifically, substantially coinciding with the entire surface of reflection plates 25A and 25B).

Further, when a state transition is performed between the first state in which wafer W1 is positioned at an exposure position where liquid immersion area 14 is formed and the second state in which wafer W1 is made to be withdrawn from the exposure position, on the movement path of wafer stage WST1 in the X-axis direction, or more specifically, on the movement path within scrum state movement area AS where wafer stage WST1 is in a scrum state with wafer stage WST2, main controller 20 measures the Y position of wafer stage WST1 using Y head EY mounted on wafer stage WST1 which faces the corresponding Y scale $SY_1$. Similarly, when a state transition is performed between the first state in which wafer W2 is positioned at an exposure position where liquid immersion area 14 is formed and the second state in which wafer W2 is made to be withdrawn from the exposure position, on the movement path of wafer stage WST2 in the X-axis direction, or more specifically, on the movement path within scrum state movement area AS where wafer stage WST2 is in a scrum state with wafer stage WST1, main controller 20 measures the Y position of wafer stage WST2 using Y head EY mounted on wafer stage WST2 which faces the corresponding Y scale $SY_2$. Therefore, it becomes possible to measure the position of wafer stages WST1 and WST2 in the Y-axis direction with a higher precision when wafer stages WST1 and WST2 move in the scrum state within scrum state movement area AS when compared with the case when the position is measured using the interferometer system.

Further, according to exposure apparatus 100 of the embodiment, transition from the first state to the second state previously described, or conversely the second state to the first state becomes possible, in a state where liquid immersion area 14 is formed in the space between projection optical system PL (projection unit PU) and the wafer table (or the wafer mounted on the wafer table) located just below projection optical system PL without the liquid leaking from the gap between both wafer stages WST1 and WST2. This will keep the reflection surfaces of reflection mirrors 27e and 27f, which are arranged on a surface on the side facing each other in the serum state, from getting wet by the liquid, which ensures high stability of position measurement of the wafer stage by XZ interferometers 116, 117, 126, and 127, using the reflection surfaces of reflection mirrors 27e and 27f.

Further, the process of collecting all the liquid forming liquid immersion area 14 and supplying the liquid again will not be necessary, from after exposure of the wafer which has been performed at one of the wafer stages via projection optical system PL and liquid Lq of liquid immersion area 14 until exposure of the wafer via projection optical system PL and liquid immersion area 14 begins at the other wafer stage. Accordingly, the time from the end of exposure on one of the wafer stages to the beginning of exposure on the other stage can be shortened to around the same level as in the exposure apparatus by the non-liquid immersion method, which allows the throughput to be improved. Further, because the liquid is constantly present on the image plane side of projection optical system PL, this can effectively prevent water stains (water marks) from being generated on the optical members (for example, tip lens 191) on the image plane side of projection optical system PL, which makes it possible to favorably maintain the image-forming characteristics of projection optical system PL for over a long period of time.

Further, by the parallel operation of the two wafer stages WST1 and WST2 previously described, the throughput can be improved when compared with a conventional exposure apparatus equipped with a single stage that sequentially performs wafer exchange, water alignment, and exposure operation using only one wafer stage.

Further, by performing exposure with high resolution and a larger depth of focus than in the air by means of the liquid immersion exposure, the pattern of reticle R can be transferred with good precision on the wafer.

Incidentally, in the embodiment above, while a pair of X heads $EX_1$ and $EX_2$ which faces X scale $SX_1$ and a Y head which faces Y scale $SY_1$ were equipped on wafer stages WST1 and WST2, respectively, the present invention is not limited to this, and a pair of Y heads and one X head can also be equipped on wafer stages WST1 and WST2. The point is that there should be at least three Y heads and X heads in total on each wafer stage. This is because in such a case, in addition to the positional information of each water stage in the X-axis direction and the Y-axis direction, rotation information in the θz direction can also be measured. However, if the object is to measure positional information only in the X-axis direction and the Y-axis direction of each wafer stager then, one X head which faces X scale $SX_1$ and one Y head which faces Y scale $SY_1$ should be installed on wafer stages WST1 and WST2.

Figure 13A:
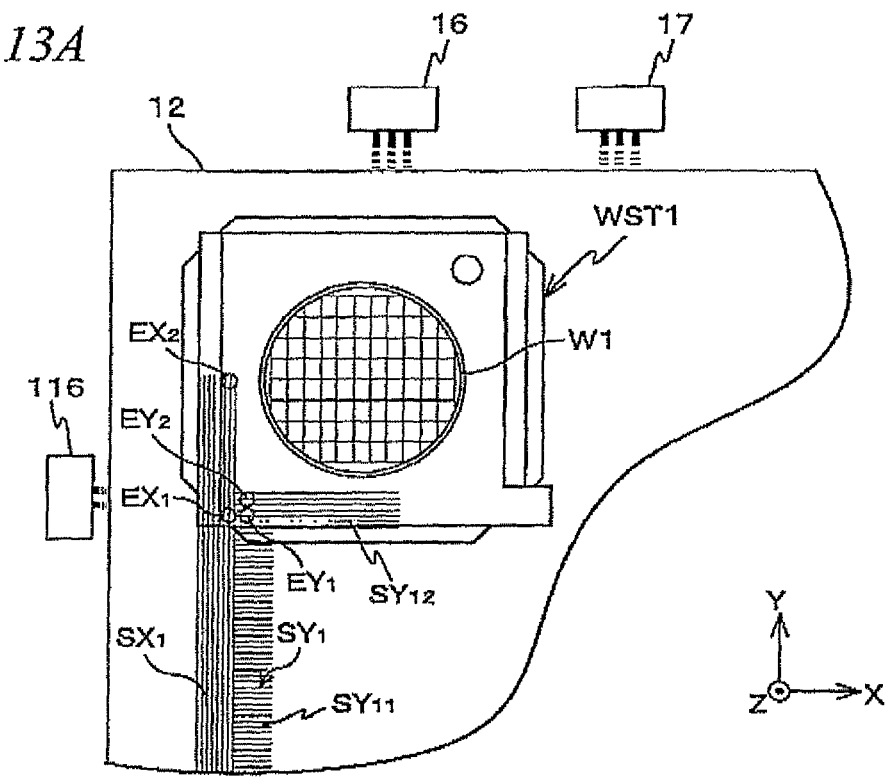
FIGS. 13A and 13B are views used to explain a first modified example of the first embodiment.
Figure 13B:
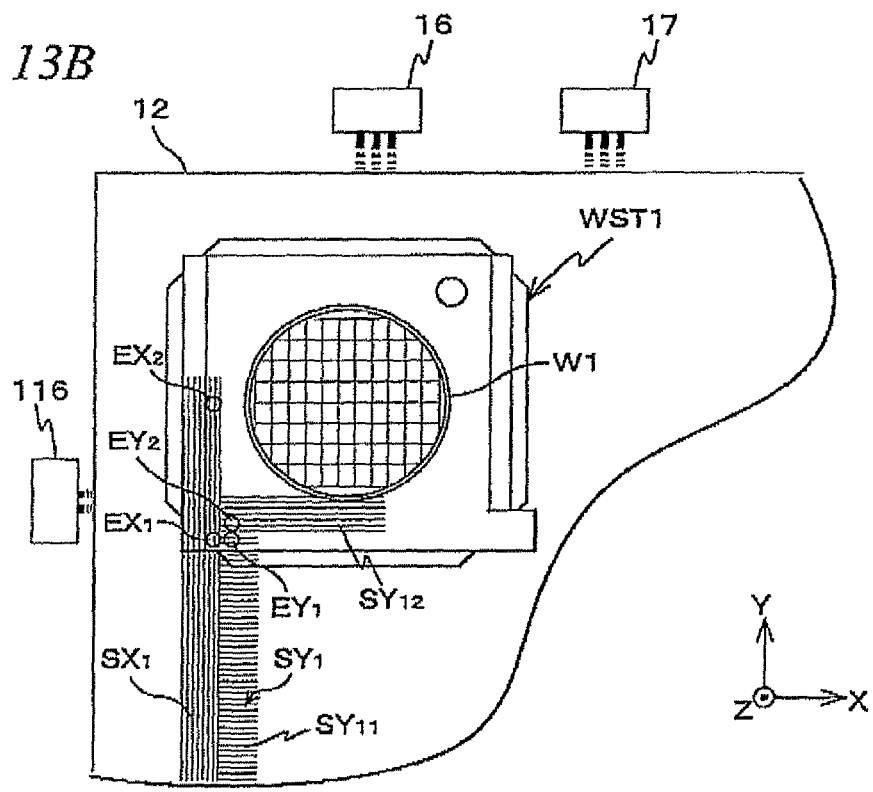

Further, in the embodiment previously described, as shown in FIGS. 13A and 13B, Y heads $EY_1$ and $EY_2$ can be placed in the vicinity of X head $EX_1$ on wafer stage WST1. In this case, Y head $EY_1$ is placed at the same position as Y head EY previously described, and Y head $EY_2$ is placed adjacent to Y head $EY_1$ on the +Y side, or more specifically, in a positional relation so that Y heads $EY_1$ and $EY_2$ can simultaneously face the sub area (extended area) of Y scale $SY_1$. The modified example (hereinafter referred to as a first modified example for the sake of convenience) shown in FIGS. 13A and 13B have the following advantages.

That is, for example, to reduce the production cost of Y scale $SY_1$, the three sections previously described, which are the main area and the pair of sub areas, can be separately made and lined up to make Y scale $SY_1$. In this case, it is difficult to dispose the main area (hereinafter expressed as scale section $SY_{11}$) of Y scale $SY_1$ and the sub area (hereinafter expressed as scale section $SY_{12}$) without any errors, that is, to dispose the divided gratings without any errors (according to the design value).

Therefore, in the first modified example, the influence of the error is removed by the following method.

a.

When, wafer stage WST1 is at a position where Y heads $EY_1$ and $EY_2$ can face scale section $SY_{12}$ as shown in FIG. 13A, main controller 20 takes in the measurement information of Y heads $EY_1$ and $EY_2$, respectively, which face scale section $SY_{12}$.

b.

Then, when wafer stage WST1 moves in the −Y direction and moves into a state shown in FIG. 13B, the measurement information of Y head $EY_2$ facing scale section $SY_{12}$ and measurement information of Y head $EY_1$ facing scale section $SY_{11}$ are taken in.

c.

Then, based on a relation between the measurement information of Y heads $EY_1$ and $EY_2$ obtained in paragraph a. and a relation between the measurement information of Y heads $EY_2$ and $EY_2$ obtained in paragraph b. main controller 20 obtains a joint error between scale section $SY_{12}$ and scale section $SY_{11}$, and corrects the measurement information of Y head $EY_1$. This allows the Y position of wafer stage WST1 to be measured with good precision hereinafter, by using at least one of Y heads $EY_1$ and $EY_2$.

A processing similar to the one described above should be performed, also on the joint section of scale section $SY_{11}$ and the end on the −Y side of scale section $SY_{12}$. Incidentally, in the case rotational error between scale section $SY_{11}$ and scale section $SY_{12}$ also has to be corrected, another Y head should be arranged in a positional relation where the head can face scale section $SY_{12}$ simultaneously with Y heads $EY_1$ and $EY_2$, such as, for example, on wafer stage WST1 adjacent to the +X side of Y head $EY_1$ or $EY_2$.

Further, also on the other stage on the wafer stage WST2 side, two Y heads should be arranged on wafer stage WST2 in an arrangement symmetric to the one described above, and the same processing should be performed.

By such an arrangement, it becomes possible to control the position of wafer stages WST1 and WST2 in the Y-axis direction with the same level of accuracy as in the case of using a Y scale that was produced by forming the three sections, which are the main section and the pair of sub areas, on one plate.

Figure 14:
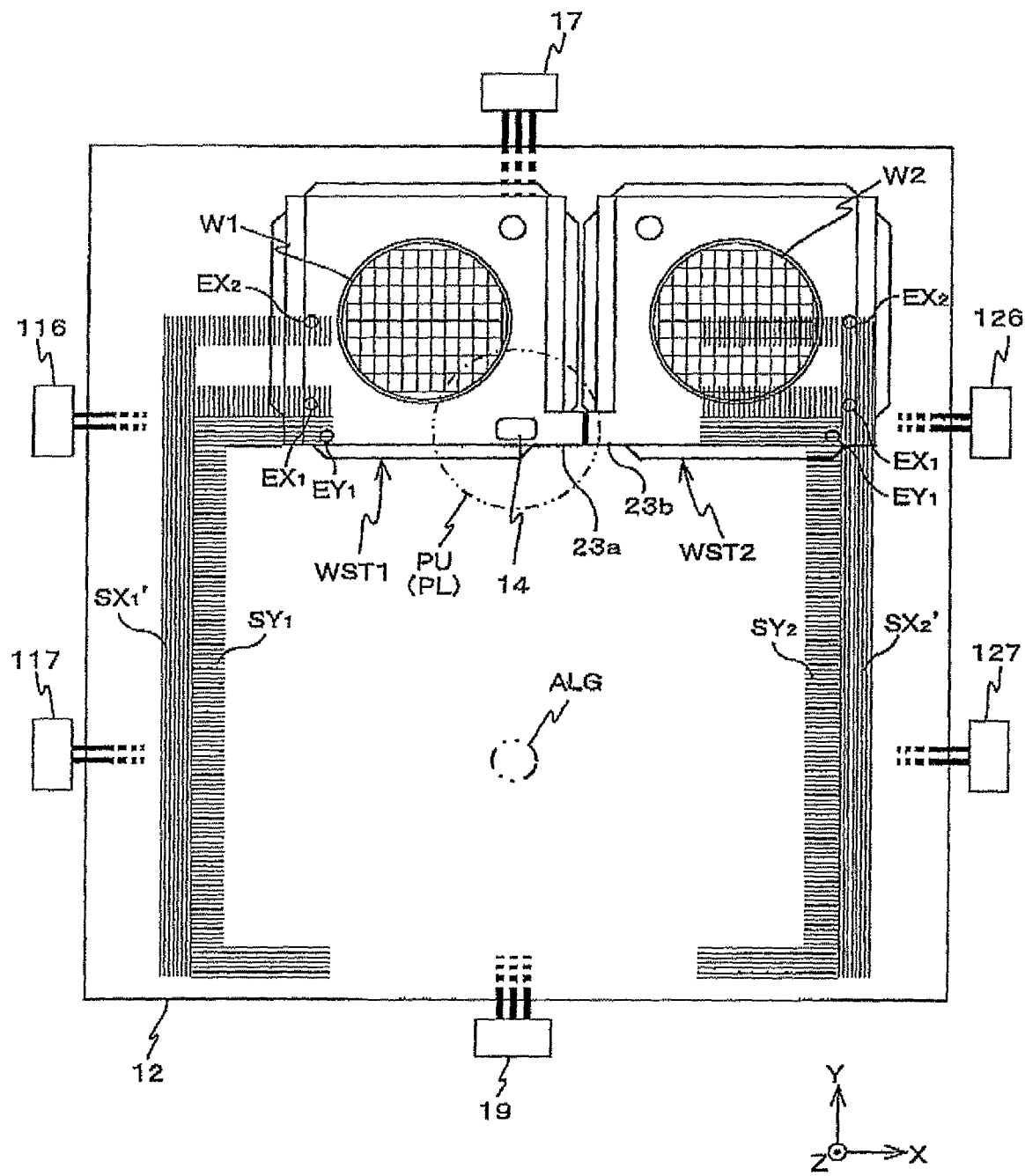
FIG. 14 is a view used to explain a second modified example of the first embodiment.

Further, in the embodiment previously described, X scales $SX_1'$ and $SX_2'$ shown in the second modified example in FIG. 14 can be used, instead of X scales $SX_1$ and $SX_2$ previously described. These X scales $SX_1'$ and $SX_2'$ have a narrow rectangular shaped main area whose longitudinal direction is in the Y-axis direction, and a pair of sub areas (extended areas) consisting of rectangular shaped areas extending in the +X direction from the end on the +Y side of the main area and the +Y side end of Y scale $SY_1$. Accordingly, the position of X head $EX_1$ on each wafer stage can be changed to a position shifted by a predetermined distance to the +Y side with respect to Y head $EY_1$ (Y head $EY_1$ is arranged at the same position as Y head EY on the wafer stage), as shown in FIG. 14.

According to the second modified example, in the movement path of wafer stage WST1 when a state transition is performed between the first state in which wafer W1 is positioned at an exposure position where liquid immersion area 14 is formed and the second state in which wafer W4 is made to be withdrawn from the exposure position, or more specifically, in the entire area of the movement path between exposure time movement area AE and the area in the vicinity of the first loading position that includes the movement path within scrum state movement area AS where wafer stage WST1 is in a serum state with wafer stage WST2 and the movement path within the first waiting area AW1, positional information of wafer stage WST1 in the XY plane at the time of movement along the movement path can be measured with high precision by the first encoder system including two X encoders consisting of X heads $EX_1$ and $EX_2$ which face X scale $SX_1'$ and a Y encoder consisting of Y head $EY_1$ which faces Y scale $SY_1$.

Further, according to the second modified example, in the movement path of wafer stage WST2 when a state transition is performed between the first state in which wafer W2 is positioned at an exposure position where liquid immersion area 14 is formed and the second state in which wafer W2 is made to be withdrawn from the exposure position, or more specifically, in the entire area of the movement path between exposure time movement area AE and the area in the vicinity of the second loading position that includes the movement path within scrum state movement area AS where wafer stage WST2 is in a scrum state with wafer stage WST1 and the movement path within the second waiting area AW2, positional information of wafer stage WST2 in the XY plane at the time of movement along the movement path can be measured with high precision by the second encoder system including two X encoders consisting of X heads $EX_1$ and $EX_2$ which face X scale $SX_2'$ and a Y encoder consisting of Y head $EY_1$ which faces Y scale $SY_2$.

Therefore, in the second modified example, there is also an advantage of not necessarily having to arrange Y interferometers 16 and 18 previously described. However, in the second modified example, Y interferometers 16 and 18 previously described can be arranged. In general, the interferometer is affected by the influence of air fluctuation more easily than the encoder, which makes the interferometer inferior in short-term stability of the measurement when compared with the encoder, while on the other hand, the interferometer is free from the temporal change of the scales (gratings), which makes the interferometer superior in long-term stability of the measurement; thus the measurement characteristics of the interferometer and the encoder can be different. Accordingly, by using both the encoder and the interferometer, the total reliability of the positional information which is measured can be improved.

Figure 15:
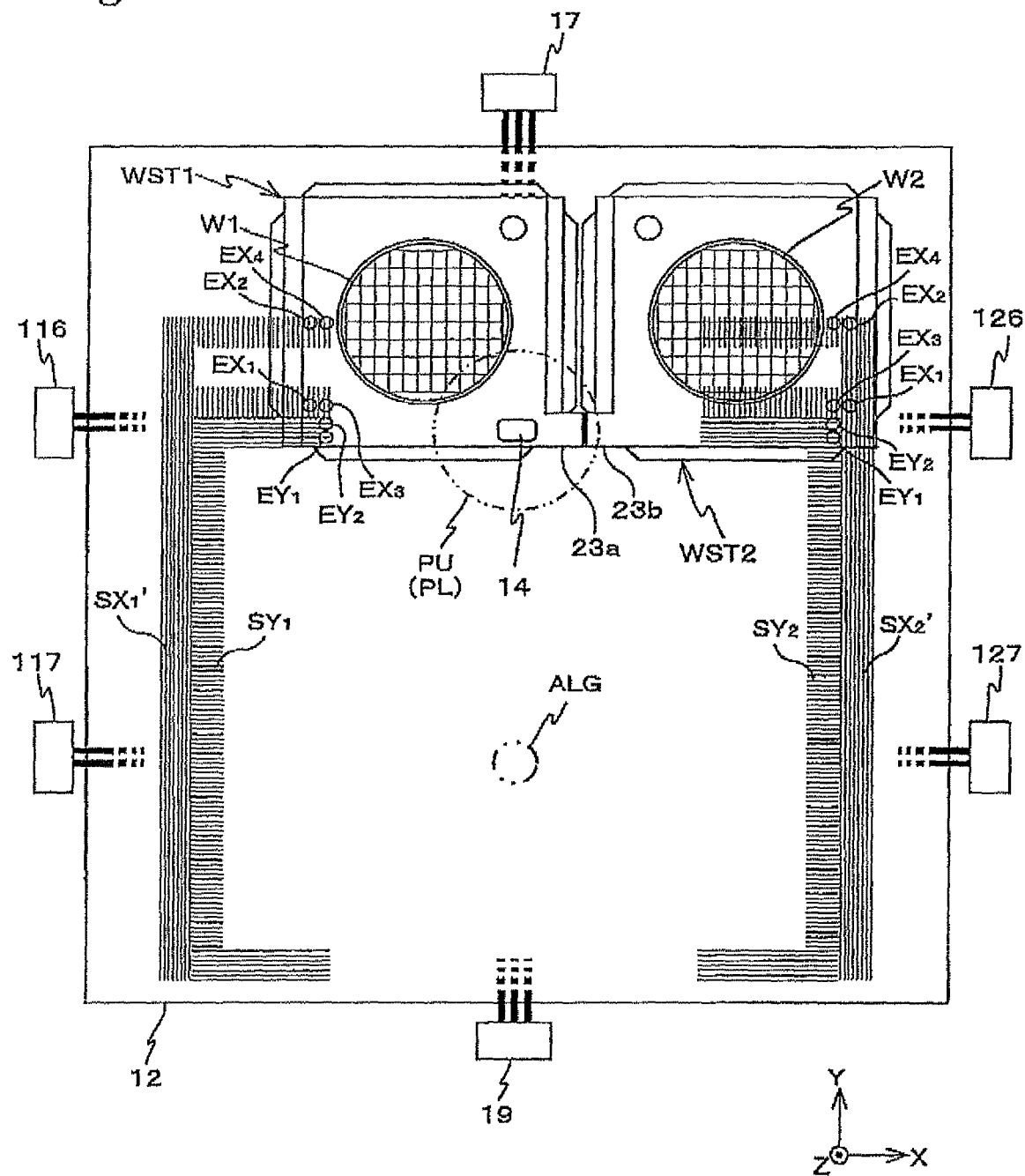
FIG. 15 is a view used to explain another modified example.

Incidentally, in the second modified example in FIG. 14, X head $EX_3$, X head $EX_4$, and Y head $EY_2$ can be arranged adjacent to X head $EX_1$, X head $EX_2$, and Y head $EY_1$, respectively, in a placement where X head $EX_3$, X head $EX_4$, and Y head $EY_2$ can simultaneously face the corresponding scales, as show in FIG. 15. This allows the production cost of each scale to be reduced for the same reasons as in the first modified example.

A Second Embodiment

Next, a second embodiment of the present invention will be described, based on FIGS. 16 to 20. Although the exposure apparatus of the second embodiment differs from the first embodiment previously described, such as in the configuration of the encoder system and the parallel processing operation of WST1 and WST2 accompanied by position measurement using the encoder system, the configuration and the like of other sections is the same as the first embodiment previously described. Therefore, in the description below, from the viewpoint of avoiding repetition in the description, components which are the same or similar are to use the same reference code, and the description thereabout is to be omitted. Further, the description below will be focusing mainly on the difference.

In the first embodiment described above, while a linear encoder which has sensibility in a uniaxial direction was employed as each encoder (head), in the exposure apparatus of the second embodiment, a two-dimensional encoder (a 2D encoder) which has sensibility in two axial directions in directions orthogonal to each other, or more specifically, a two-dimensional encoder (a 2D encoder) whose measurement direction is in the directions of the two orthogonal axes is employed. As the two-dimensional encoder, for example, an encoder can be used of a diffraction interference mode using three gratings, which has two pairs of fixed scales placed in the directions of the two orthogonal axes, and converges diffraction lights of the same order in the directions of the two orthogonal axes generated from the two-dimensional gratings on each pair of the fixed scales, respectively, on a common index scale.

Figure 16:
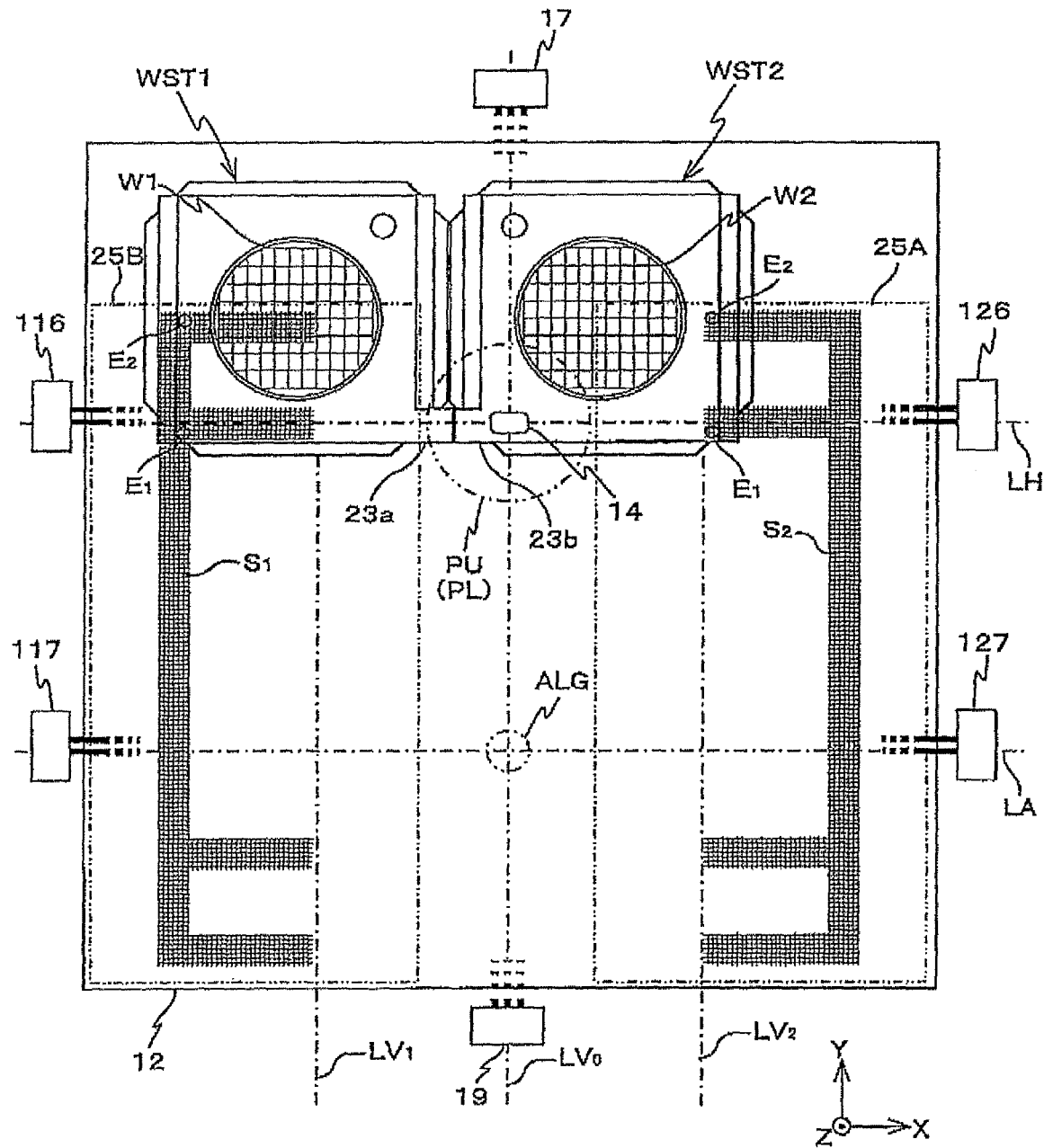
FIG. 16 is a planar view showing a stage unit of an exposure apparatus of the second embodiment.

In the exposure apparatus of the second embodiment, at least two each of two-dimensional encoder heads (2D heads) $E_1$ and $E_2$ are installed on wafer stages WST1 and WST2, respectively, as shown in FIG. 16. On the upper surface of wafer stage WST1, a first head $E_1$ is placed close to the −X side end and also to the −Y side end, and a second head $E_2$ is placed on the −X side close to the center in the Y-axis direction. Further, on the upper surface of wafer stage WST2, two 2D heads $E_1$ and $E_2$ are installed in a placement symmetric to the two 2D heads installed on wafer stage WST1 (symmetric with respect to the Y-axis).

As shown in FIG. 16, slightly on the −X side from the center in the X-axis direction of the reflection surface of reflection plate 25B, a two-dimensional scale (a 2D scale) $S_1$ is formed which has a narrow rectangular shaped main area whose longitudinal direction is in the Y-axis direction, a pair of sub areas (extended areas) extending in the +X direction from both ends in the Y-axis direction of the main area, and furthermore, at a position a predetermined distance away in the Y-axis direction from the pair of sub areas (extended areas), a pair of sub areas (extended areas) extending in the +X direction from the main area. A predetermined distance in the Y-axis direction, here, refers to the separation distance of the two 2D heads $E_1$ and $E_2$ in the Y-axis direction. Meanwhile, on the reflection surface of reflection plate 25A, a two-dimensional scale (a 2D scale) $S_2$ is formed to be in symmetry with 2D scale $S_1$.

2D scales $S_1$ and $S_2$ are configured of two-dimensional diffraction gratings arranged at a predetermined pitch in the X-axis and Y-axis directions.

In the embodiment, by 2D heads $E_1$ and $E_2$ each irradiating a measurement bean on 2D scales $S_1$ and $S_2$, and receiving the reflected lights (diffraction lights) from 2D scales S3 and $S_2$, relative displacement of the 2D heads in the X-axis direction and the Y-axis direction to the 2D scales on which the measurement beams were irradiated is detected.

In the second embodiment, for example, as shown in FIG. 16, when wafer stage WST1 is located at a position on the −X side end as well as the +Y side end of the movement path in which wafer stage WST1 moves from exposure time movement area AE to a first loading position and alignment area AA via the first waiting area AW1, 2D heads $E_1$ and $E_2$ mounted on wafer stage WST1 face the main area of 2D scale $S_1$. In this case, from 2D heads $E_1$ and $E_2$ which face the corresponding 2D scale $S_1$, measurement values of the relative displacement of 2D heads $E_1$ and $E_2$ with respect to the corresponding 2D scale $S_1$ in both the X-axis and the Y-axis directions, are sent to main controller 20. Main controller 20 computes the position (the position in the X-axis direction, the Y-axis direction, and the θz direction) of wafer stage WST1 in the XY plane, based on the measurement values of each 2D of the heads $E_1$ and $E_2$.

Incidentally, when wafer stage WST1 moves in the +X direction from a state shown in FIG. 16, the two 2D heads $E_1$ and $E_2$ face the pair of sub areas (extended areas) on the +Y side of 2D scale $S_1$. Similarly, when wafer stage WST1 is located at the end on the −Y side of the movement path described above, at the same X position, the two 2D heads $E_1$ and $E_2$ face the pair of sub areas (extended areas) on the −Y side of 2D scale $S_1$. In these cases as well, main controller 20 can compute the position of wafer stage WST1 within the XY plane, based on the measurement values of both 2D heads $E_1$ and $E_2$ as before.

When wafer stage WST1 moves by a predetermined distance further in the +X direction from the state in which 2D heads $E_1$ and $E_2$ face the pair of sub areas (extended areas) on the +Y side of 2D scale $S_1$, 2D heads $E_1$ and $E_2$ moves off from 20 scale $S_1$. Before this, main controller 20 switches from a position measurement of wafer stage WST1 using 2D heads $E_1$ and $E_2$ to a position measurement of wafer stage WST1 using interferometer system 118. For example, from the measurement results of Y interferometer 17 and XZ interferometers 116 and 126, the position (the position in the X-axis direction, the Y-axis direction, and the θz direction) of wafer stage WST1 within the XY plane is computed.

Similarly, when wafer stage WST2 is located at a position on the +X side end as well as the +Y side end of the movement path in which wafer stage WST2 moves from exposure time movement area AE to the second loading position and alignment area AA via the second waiting area AW2, 2D heads $E_1$ and $E_2$ mounted on wafer stage WST2 face the main area of 2D scale $S_2$. Main controller 20 computes the position of wafer stage WST2 within the XY plane, based on the measurement values of 2D heads $E_1$ and $E_2$. Further, the same can be said for the case when 2D heads $E_1$ and $E_2$ face the extended area of 2D scale $S_2$. Incidentally, when 2D heads $E_1$ and $E_2$ move off from 2D scale $S_2$, prior to this, position measurement of wafer stage WST2 is switched to a measurement using interferometer 118, as in the case of wafer stage WST1 previously described.

Incidentally, by employing the arrangement of 2D scale $S_1$ and the arrangement of 2D heads $E_1$ and $E_2$ mounted on wafer stage WST1 as shown in FIG. 16, a stage position measurement using only the 2D encoders becomes possible in the entire movement path of wafer stage WST1 when wafer stage WST1 moves from exposure time movement area AE to the first loading position via the first waiting area AW1, or when wafer stage WST1 moves in reverse. Similarly, by employing the arrangement of 2D scale $S_2$ and the arrangement of 2D heads $E_1$ and $E_2$ mounted on wafer stage WST2, a stage position measurement using only the 2D encoders becomes possible in the entire movement path of wafer stage WST2 when wafer stage WST2 moves from exposure time movement area AE to the second loading position via the second waiting area AW2, or when wafer stage WST2 moves in reverse. By such placements, switching process between XZ interferometers 116 and 117, switching process between XZ interferometers 126 and 127, and reset (origin reset) of the interferometer to be used after the switching which are essential in the case of performing position measurement of wafer stages WST1 and WST2 that move along the straight line path described above using interferometer system 118, will not be required. Accordingly, the throughput can be improved when compared with the case when interferometer system 118 is used. Further, due to the reasons described above, in the second embodiment, Y interferometers 16 and IS previously described do not have to be arranged.

Next, a parallel processing operation that uses two wafer stages WST1 and WST2 will be described, based on FIGS. 16 to 20. Incidentally, during the operation described below, liquid immersion area 14 is constantly formed, similar to the first embodiment previously described.

Figure 17:
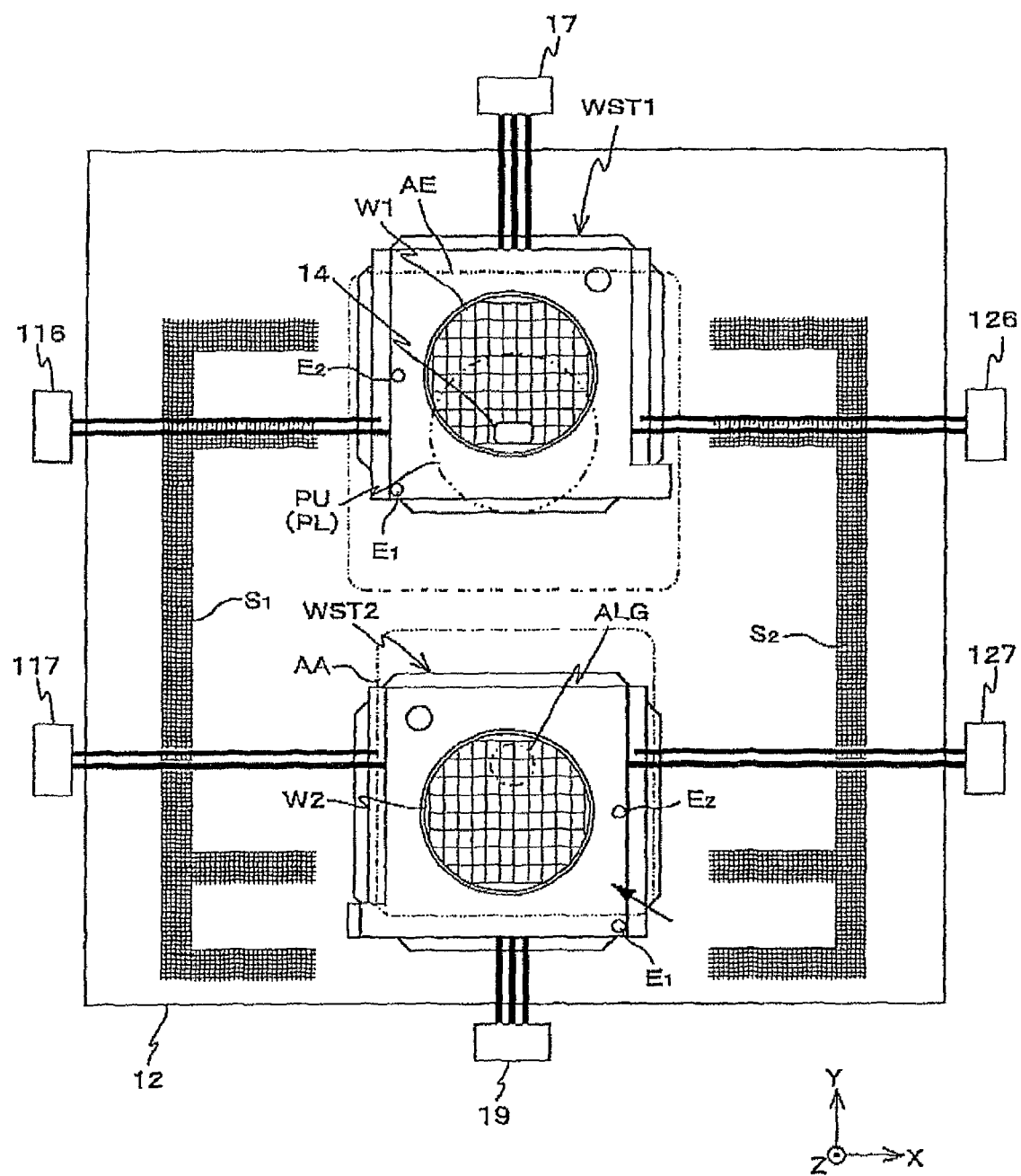
FIG. 17 is a view showing a state where exposure is performed on a wafer placed on wafer stage WST1 in the exposure apparatus of the second embodiment, and wafer alignment is performed on wafer stage WST2.

FIG. 17 shows a state in which exposure by the step-and-scan method is performed on wafer W1 mounted on wafer stage WST1 in exposure time movement area AE, and an enhanced global alignment (EGA) being concurrently performed on wafer W2 mounted on wafer stage WST2 in alignment area AA. At this point, main controller 20 measures the position of wafer stage WST1 using Y interferometer 17 and XZ interferometers 116 and 126, and measures the position of wafer stage WST2 using Y interferometer 19 and XZ interferometers 117 and 127.

When wafer alignment (EGA) to wafer W2 has been completed, main controller 20 moves wafer stage WST2 to a predetermined waiting position on the straight line path extending in the Y-axis direction set by the main section of 2D scale $S_2$ within the second waiting area AW2. At this point, main controller 20 makes wafer stage WST2 return to the second loading position previously described once. This makes 2D heads $E_1$ and $E_2$ mounted on wafer stage WST2 face a pair of extended areas of 2D scale $S_2$. Therefore, at the point when 2D heads $E_1$ and $E_2$ face 2D scale $S_2$, main controller 20 switches from the position measurement of wafer stage WST2 within the XY plane using interferometers 19, 117, and 127 to the position measurement of wafer stage WST2 within the XY plane using 2D encoders $E_1$ and $E_2$. Then, main controller 20 makes wafer stage WST2 wait at the predetermined waiting position above, until exposure of wafer W1 on wafer stage WST1 has been completed.

Figure 18:
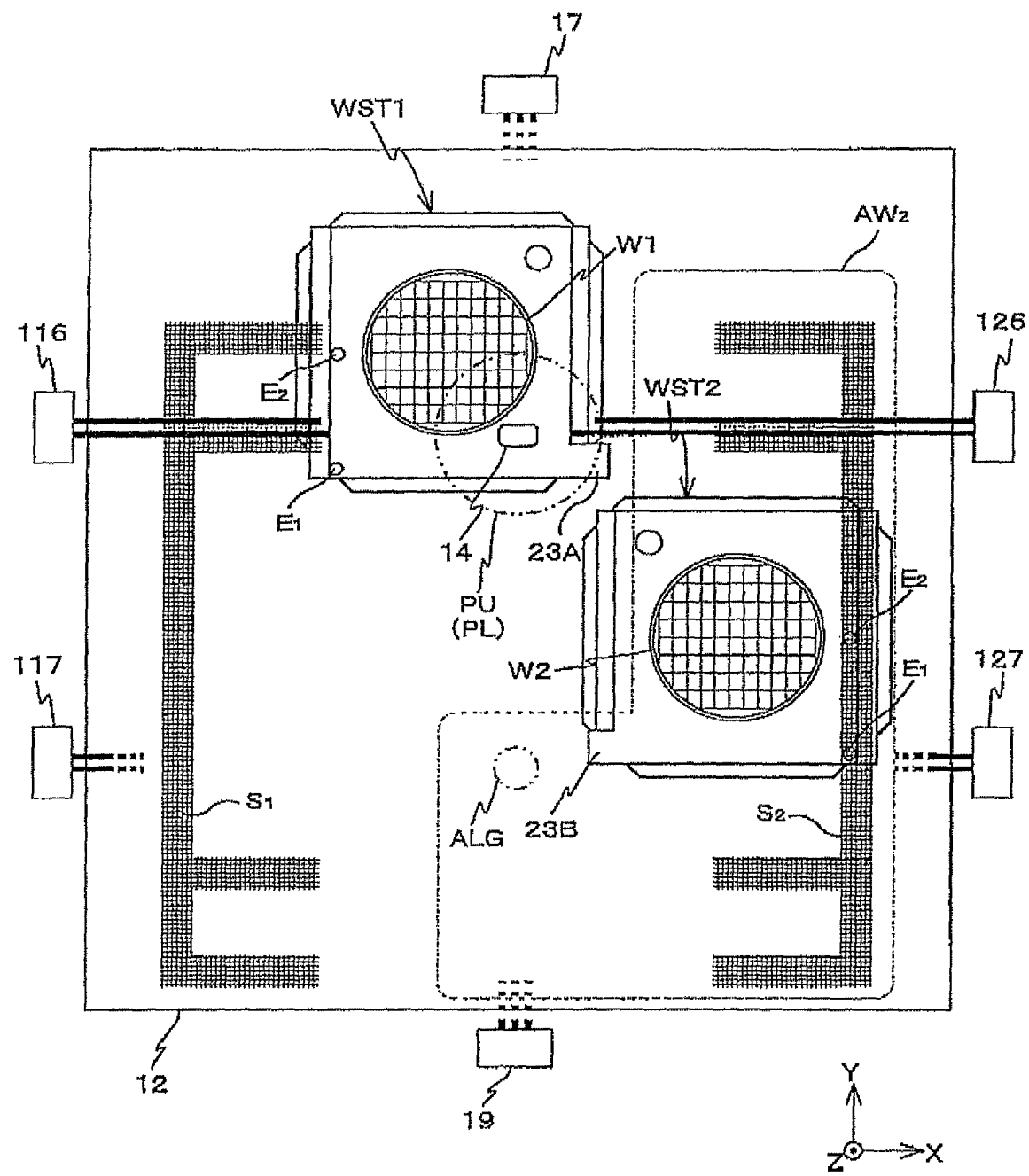
FIG. 18 is a view showing a state in which wafer stage WST2 in the exposure apparatus of the second embodiment moves front an alignment area to an exposure area via a second waiting area, along a path set by a placement of an encoder head and a scale, according to results of position measurement using an encoder.
Figure 19:
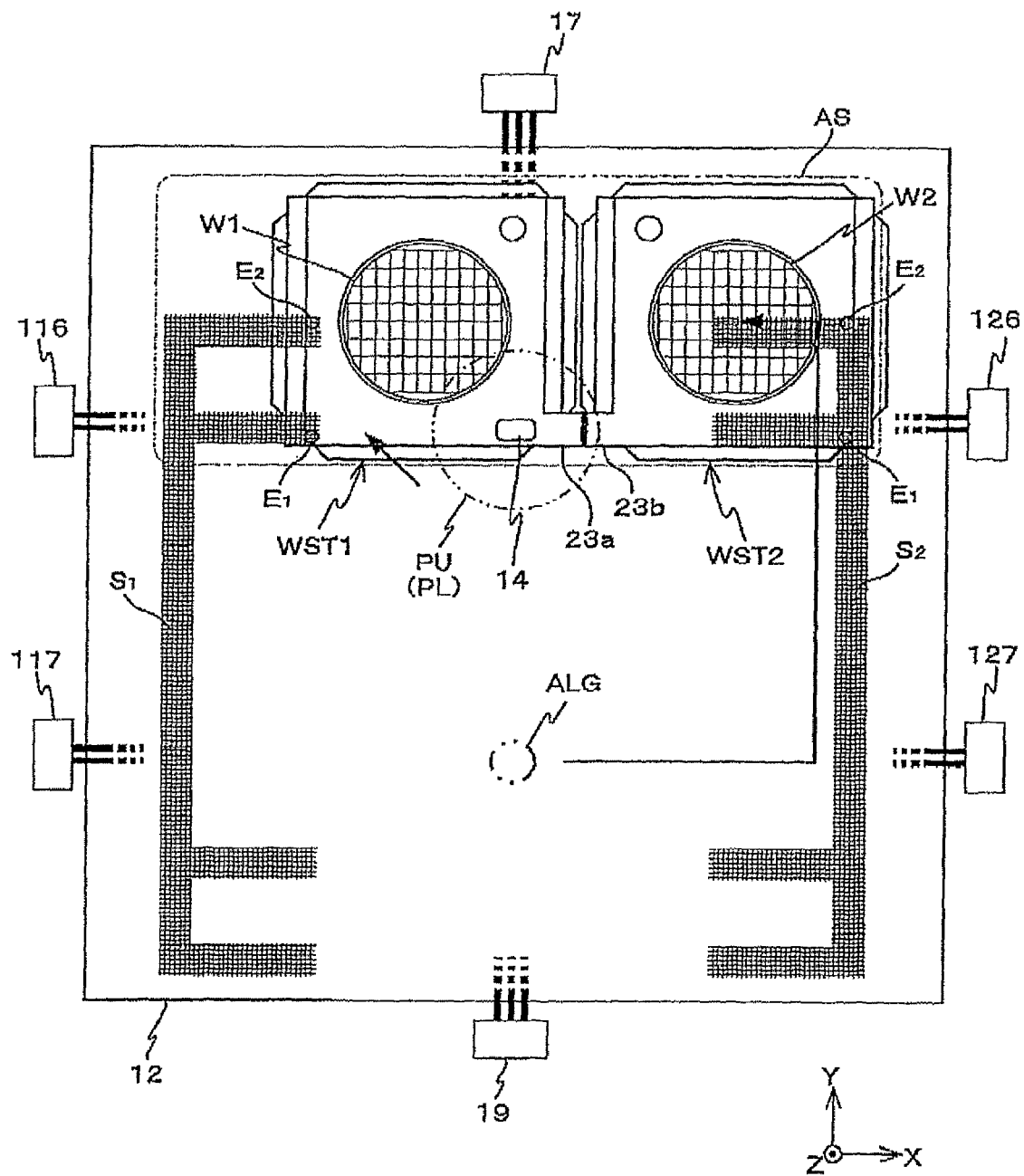
FIG. 19 is a view showing a state where movement to a scrum position of wafer stage WST1 and water stage WST2 has been completed in the exposure apparatus of the second embodiment.

When exposure to water W1 on wafer table WTB1 has been completed, main controller 20 drives wafer stages WST1 and WST2 to their predetermined positions (right side scrum positions) within scrum state movement area AS, shown in FIG. 19. At this point, main controller 20 measures the position of wafer stage WST2 using 2D heads $E_1$ and $E_2$ as shown in FIG. 18, and according to the measurement results, moves wafer stage WST2 along a path (a straight line path) within the second waiting area AW2, which is set by the placement of 2D heads $E_1$ and $E_2$ and 2D scale $S_2$.

Further, when wafer stage WST1 arrives at the right side scrum position in the scrum state movement area AS, 2D heads $E_1$ and $E_2$ mounted on wafer stage WST1 face a pair of extended areas of 2D scale $S_1$ as shown in FIG. 19, therefore, main controller 20 switches from the position measurement of wafer stage WST1 using interferometers 17, 116, and 126, to the position measurement using 2D heads $E_1$ and $E_2$.

In the state where both wafer stages WST1 and WST2 have moved to the right side scrum position within scrum state movement area AS, eaves section 23a of wafer stage WST1 becomes engaged with eaves section 23b of wafer stage WST2, and both wafer stages WST1 and WST2 move into a scrum state where the stages are in proximity or in contact via eaves sections 23a and 23b, as shown in FIG. 19. Then, main controller 20 drives both wafer stages WST1 and WST2 in the −X direction, while keeping this serum state. At this point, main controller 20 performs position measurement using 2D encoders $E_1$ and $E_2$ mounted on wafer stages WST1 and WST2, respectively, and drives both stages WST1 and WST2, based on the measurement results.

As wafer stages WST1 and WST2 move in the −X direction within serum state movement area AS while keeping the scrum state, liquid immersion area 14 formed in the space between tip lens 191 and wafer table WTB1 sequentially moves from the area over water table WTB1, eaves section 23a, eaves section 23b, and then to the area over wafer table WTB2. FIG. 16 shows the state right after liquid immersion area 14 has passed over eaves section 23a from above wafer table WTB1 to above wafer table WTB2 in the manner described above.

Figure 20:
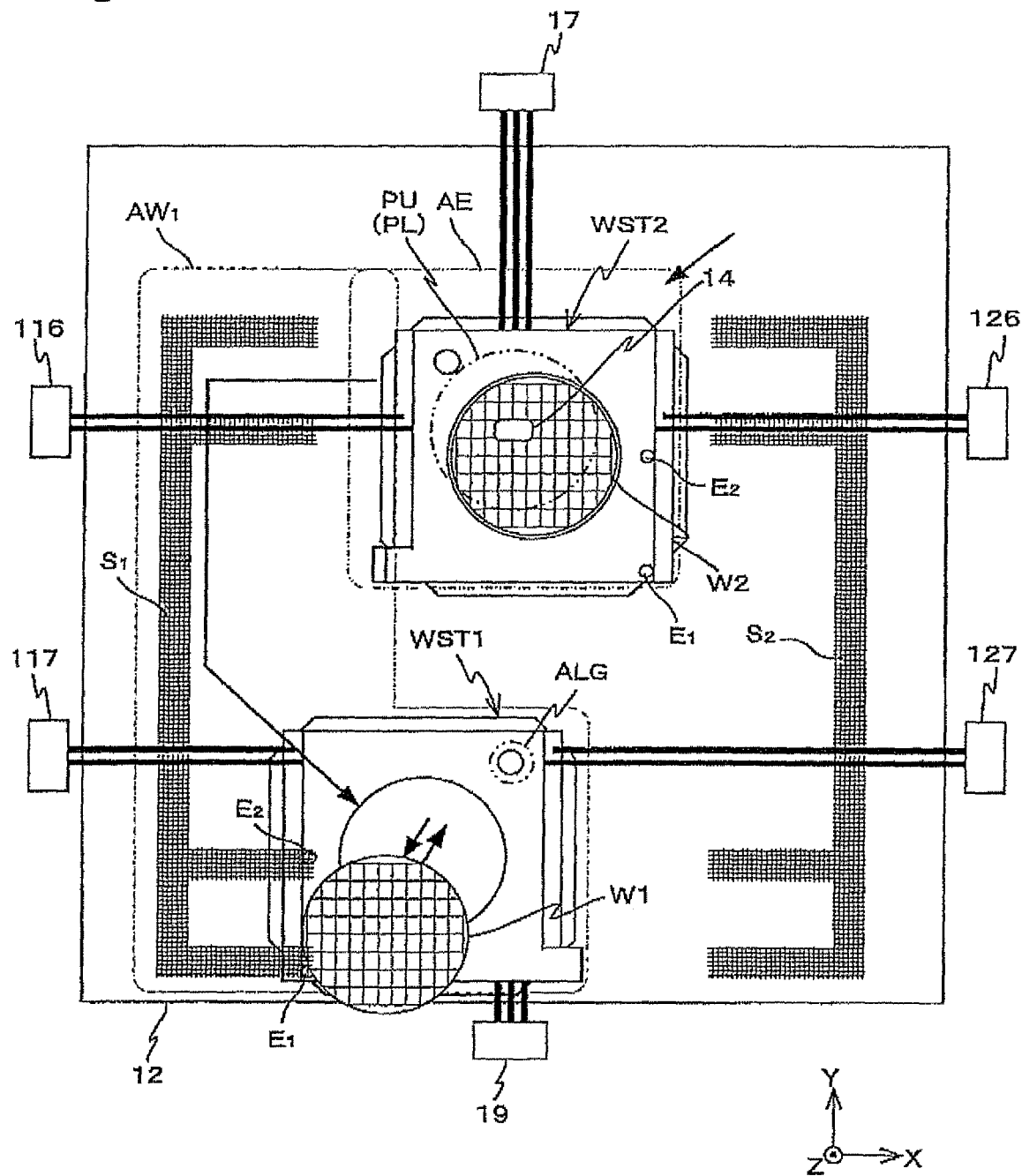
FIG. 20 is a view showing a state where exposure is performed on a wafer placed on wafer stage WST2, and wafer exchange is performed on wafer stage WST1 in the exposure apparatus of the second embodiment.

When the movement of liquid immersion area 14 to above wafer table WTB2 is completed, main controller 20 moves wafer stage WST1 to the first loading position shown in FIG. 20, via the first waiting area AW1. The position of wafer stage WST1 during the movement is measured, using 2D heads $E_1$ and $E_2$. After stage WST1 arrives at the first loading position, main controller 20 switches from the position measurement of wafer stage WST1 using 2D heads $E_1$ and $E_2$, to the measurement of wafer stage WST1 using Y interferometer 19 and XZ interferometers 117 and 127.

In parallel with the movement of wafer stage WST1 above, main controller 20 moves wafer stage WST2 to exposure time movement area AE, and positions fiducial mark plate FM2 directly below projection optical system PL. Prior to this, main controller 20 switches the position measurement of wafer stage WST2 in the XY plane from the measurement using 2D heads $E_1$ and $E_2$ to the position measurement of wafer stage WST2 in the XY plane using interferometers 17, 116, and 126. Then, in a procedure similar to the one previously described, reticle alignment (detection of a pair of first fiducial marks on fiducial mark plate FM2) and exposure to wafer W2 by the step-and-scan method are started.

In parallel with the exposure operation to wafer W2 on wafer stage WST2 described above, main controller 20 performs wafer exchange between the wafer carrier mechanism (not shown) and wafer stage WST1 at the first loading position, and a new wafer W1 is mounted on wafer table WTB1. Then, the second fiducial mark on fiducial mark plate FM1 is detected, using alignment system ALG. Then, main controller 20 performs wafer alignment (EGA) on wafer W1 as is previously described using alignment system ALG, while moving wafer stage WST1 to alignment area AA and controlling the position of wafer stage WST1.

When wafer alignment (EGA) of wafer W1 on wafer table WTB1 has been completed and exposure of wafer W2 on wafer table WTB2 has also been completed, main controller 20 reversely follows the movement path earlier, and drives wafer stages WST1 and WST2 toward the left side scrum position within scrum state movement area AS. When both wafer stages WST1 and WST2 moves to the left side scrum position, main controller 20 drives both stages WST1 and WST2 in the +X direction opposite to the preceding drive, while keeping the scrum state. With this drive, liquid immersion area 14 moves sequentially in reverse, from wafer table WTB2, eaves section 23b, eaves section 23a, and then on water table WTB1. When the movement of liquid immersion area 14 has been completed, main controller 20 begins exposure of wafer W1 on wafer stage WST1 in a procedure similar to the one previously described. In parallel with this exposure operation, main controller 20 drives wafer stage WST2 in a similar manner as is previously described toward the second loading position via the second waiting area AW2, exchanges water W2 which has been exposed on wafer stage WST2 to a new wafer W2, and then performs wafer alignment on the new wafer W2.

Hereinafter, main controller 20 repeatedly performs the parallel operation of wafer stages WST1 and WST2 described above.

As discussed above, according to the exposure apparatus of the second embodiment, the same effect can be obtained as the exposure apparatus of the first embodiment previously described. In addition, according to the exposure apparatus of the second embodiment, in the parallel processing operation of wafer stage WST1 and WST2 using the 2D encoders described above, because main controller 20 measures the position of both of the wafer stages WST1 and WST2, which axe moving within scrum state movement area AS between each scrum position and each loading position and in the path within each of the waiting areas AW1 and AW2, using only the encoder system, Y interferometers 16 and 18 previously described do not have to be arranged.

Further, in the second embodiment, because two each of 2D heads $E_1$ and $E_2$ were mounted on wafer stages WST1 and WST2, facing 2D scales $S_1$ and $S_2$, respectively, rotation information in the θz direction can also be measured, as well as the positional information of each wafer stage in the X-axis direction and the Y-axis direction. However, if the object is to measure positional information only in the X-axis direction and in the Y-axis direction of each water stager the 2D head mounted on wafer stage WST1 and WST2 can be a single head.

Figure 21:
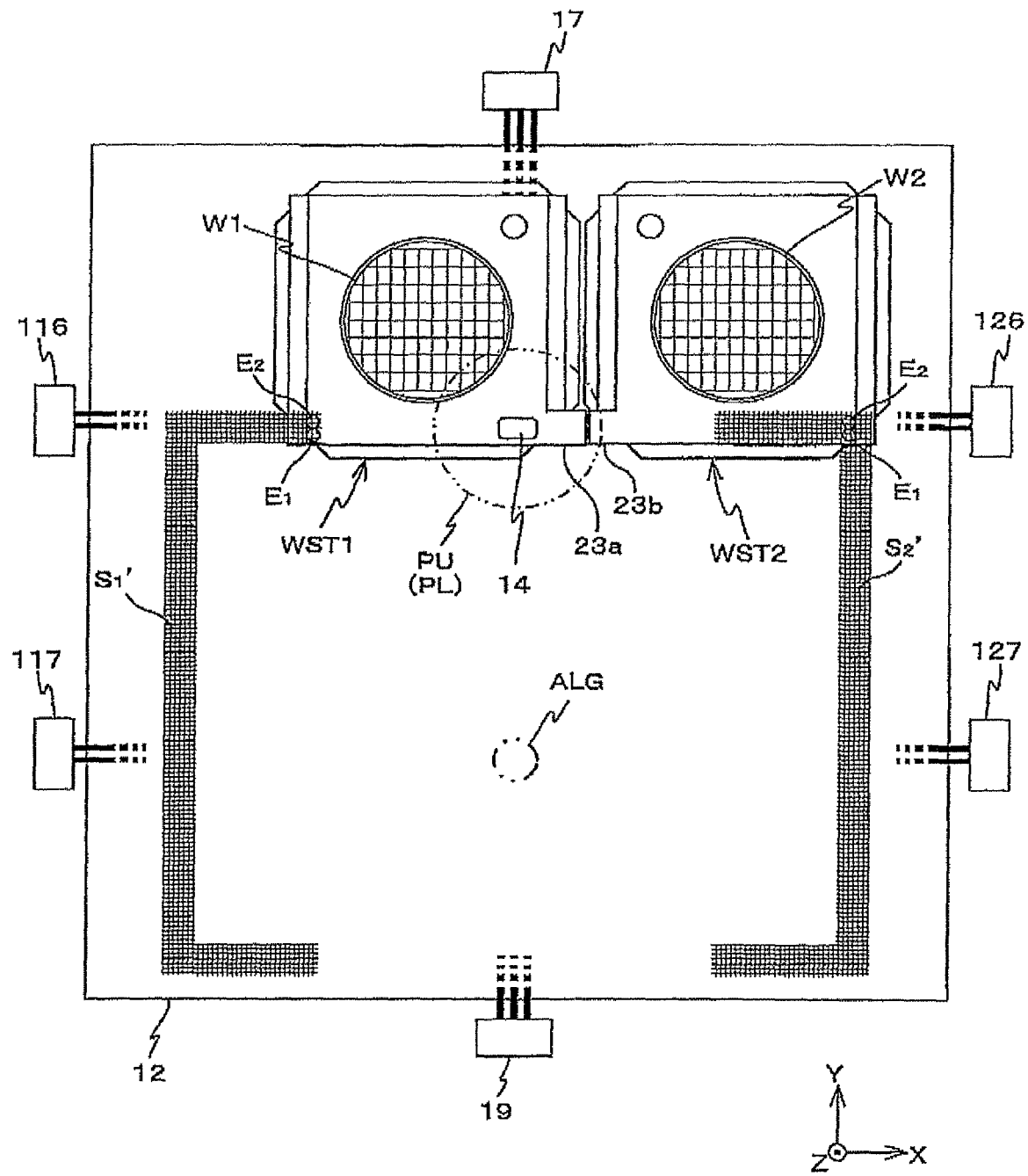
FIG. 21 is a view used to explain a first modified example of the second embodiment.

Incidentally, in the case of using 2D encoders as in the second embodiment above, two-dimensional encoder heads (2D heads) $E_1$ and $E_2$ can be mounted on wafer stage WST1 and WST2, respectively, for example, adjacent to the Y-axis direction, or more specifically, a positional relation so that the heads can simultaneously face the 2D scales as in the first modified example shown, for example, in FIG. 21. In this modified example, the main controller computes the position (the position in the X-axis direction, the Y-axis direction, and the θz direction) of wafer stages WST1 and WST2 in the XY plane, based on the measurement values of 2D heads $E_1$ and $E_2$. Further, in the modified example, the cost can be reduced by reducing the size of the placement area of the scales using a rough U-shaped 2D scales $S_1'$ and $S_2'$ as shown in FIG. 21 corresponding to the placement of 2D heads $E_1$ and $E_2$. Incidentally, in this modified example, the 2D heads $E_1$ and $E_2$ can be placed adjacent to each other in the X-axis direction on wafer stages WST1 and WST2, respectively, or the 2D heads can be placed in another positional relation. The point is the placement should be a placement where 2D heads $E_1$ and $E_2$ simultaneously face 2D scales $S_1'$ and $S_2'$.

Incidentally, in each of the embodiments above, position measurement of wafer stages WST1 and WST2 was performed using interferometer system 118 in exposure time movement area AE and in alignment area AA, and using both interferometer system 118 and encoder system 150 together, or using only encoder system 150 in the scrum state movement area AS and in the first and second waiting areas AW1 and AW2. On the other hand, it is possible to perform position measurement of both of the stages WST1 and WST2 using only the encoder system in the entire movement range.

Figure 22:
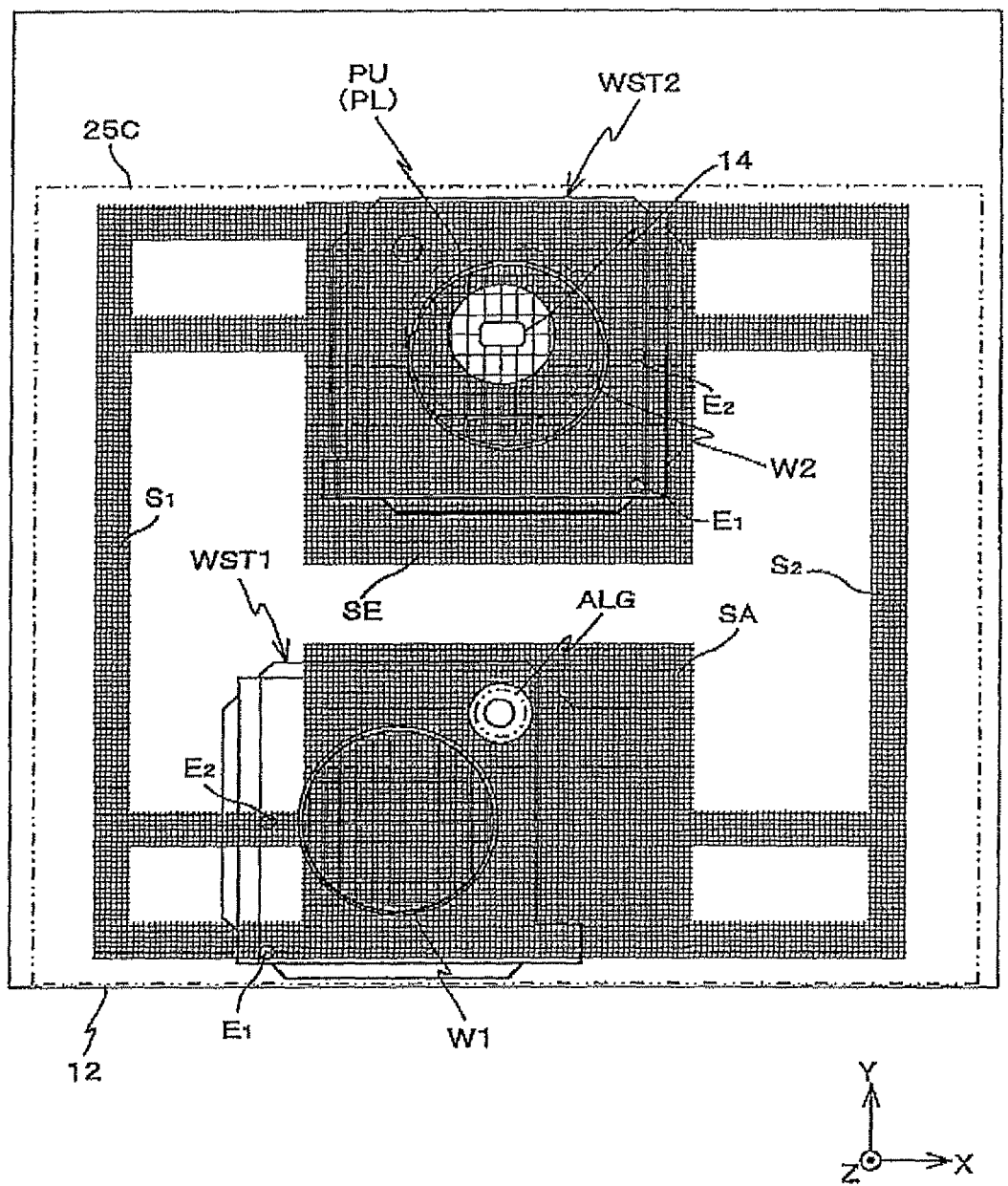
FIG. 22 is a view used to explain a second modified example of the second embodiment.

Now, as an example, a second modified example of the second embodiment above shown in FIG. 22 will be described. Instead of reflection plates 25A and 253 shown in FIGS. 1 and 5, a rectangular shaped reflection plate 25C is placed, facing the entire surface of the movement plane (base board 12) of wafer stages WST1 and WST2. However, in reflection plate 25C, two circular openings are formed to insert the lower end section of barrel 40 and alignment system ALG. Incidentally, reflection plate 25C is installed on the lower surface of a mainframe holding projection unit PU and the like.

At a position on a surface facing base board 12 of reflection plate 25C corresponding to scrum state movement area AS and the first and second waiting areas AW1 and AW2, two 2D scales $S_1$ and $S_2$ (refer to FIG. 16) introduced in the second embodiment described above are formed. Furthermore, at a position corresponding to exposure time movement area AE and alignment area AA except for the opening section which barrel 40 and alignment system ALG penetrates, similar 2D scales SE and SA are formed. These 2D scales SE and SA are connected via 2D scales $S_1$ and $S_2$.

2D heads $E_1$ and $E_2$ mounted on wafer stages WST1 and WST2 irradiate measurement beams on 2D scales $S_1$, SE, and SA and $S_2$, SE, and SA, respectively, and by receiving the reflected lights (diffraction lights) of the measurement beams from the 2D scales, detect relative displacement of the 20 heads in the X-axis direction and the Y-axis direction to the 2D scales on which the measurement beams have been irradiated. The measurement values of 2D heads $E_1$ and $E_2$ mounted on wafer stage WST1 and WST2 are sent to main controller 20. Main controller 20 computes the position (the position in the X-axis direction, the Y-axis direction, and the θz direction) of wafer stages WST1 and WST2 in the XY plane, based on the measurement values of each of the 2D heads $E_1$ and $E_2$.

By introducing 2D scales SA and SE in addition to 2D scales $S_1$ and $S_2$ in the manner described above, it becomes possible to measure the position of wafer stages WST1 and WST2 using only encoder system 150 at the time of exposure, as well as at the time of wafer alignment. Accordingly, a parallel processing operation using wafer stages WST1 and WST2 as in each of the embodiments described above becomes possible without using an interferometer system. As a matter of course, an interferometer system can be arranged, and the interferometer system and the encoder system can be used together as in each of the embodiments described above.

Figure 23:
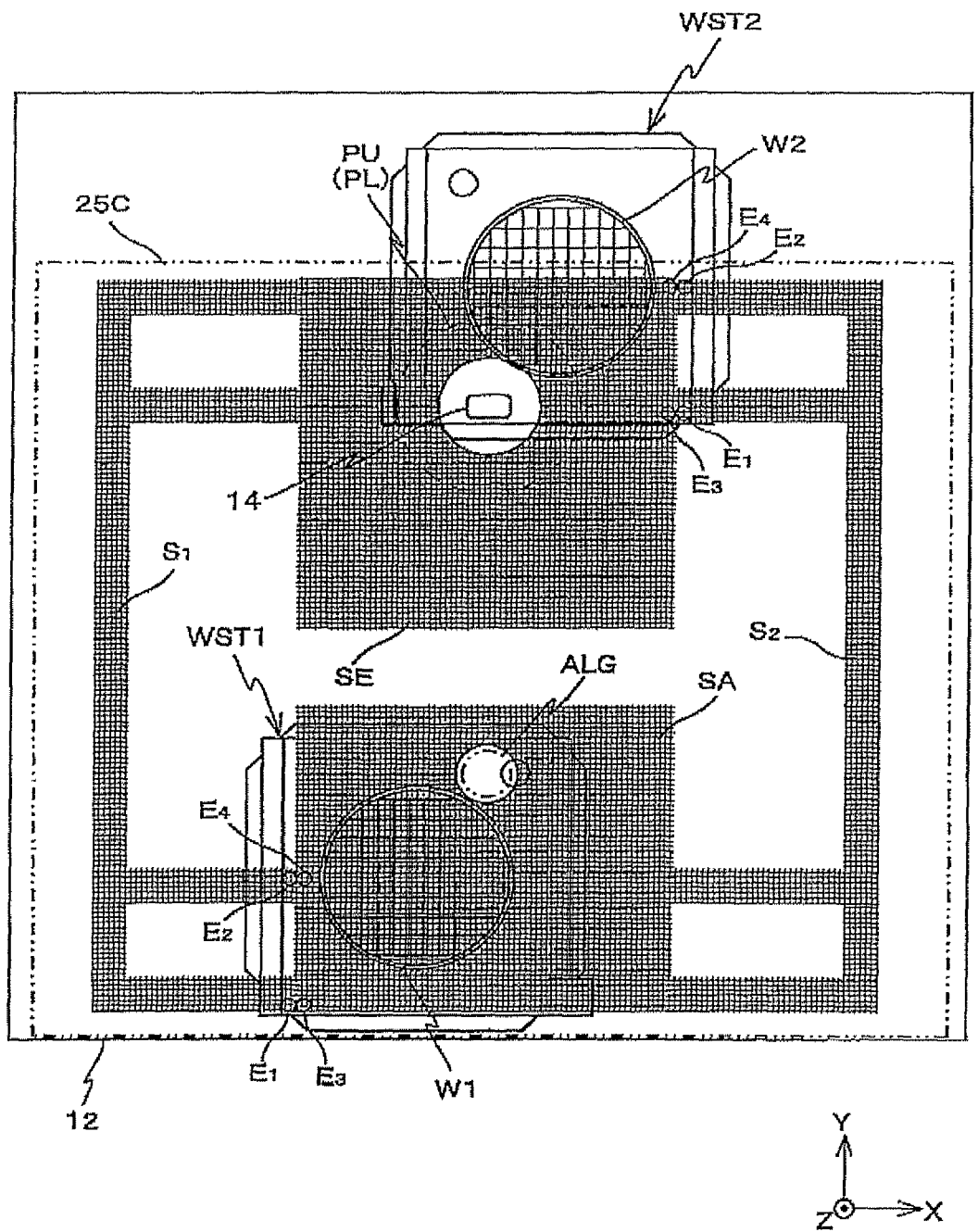
FIG. 23 is a view used to explain another modified example of the second embodiment.

Further, similar to the two modified examples of the first embodiment shown in FIGS. 13 and 15, 2D heads $E_3$ and $E_4$ can be arranged in the vicinity of 2D heads $E_1$ and $E_2$ on wafer stages WST1 and WST2, as shown in FIG. 23. 2D scales $S_1$, $S_2$, SE, and SA are each made individually, and as for 2D scales $S_1$ and $S_2$, the main area and the sub area (extended area) are made individually and by joining each of these areas together an reflection plate 25C, an integral 2D scale $S_1$, $S_2$, SE, SA is formed. Therefore, similar to the two modified examples described above, by the combined usage of two each of 2D heads $E_1$ and $E_3$, and $E_2$ and $E_4$ placed close to each other on wafer stages WST1 and WST2, when each of the 20 heads cross the joint section of 2D scales $S_2$, $S_2$, SE, and SA or cross the joint section of the main area and the sub area of 2D scales $S_1$ and $S_2$, results of position measurement of wafer stages WST1 and WST2 can be linked between the two 2D heads which are close to each other. FIG. 23 shows a state of the moment in which 21 heads $E_1$ and $E_3$, and $E_2$ and $E_4$ on wafer stage WST1 cross the joint section of 2D scales SA and $S_1$, and 2D heads $E_1$ and $E_3$, and $E_2$ and $E_4$ on wafer stage WST2 cross the joint section of 2D scales SE and $S_2$. In this state, correction of the joint error previously described is performed. This corrects the joint error in the 2D scale, which makes position measurement of wafer stages WST1 and WST2 with high precision possible.

Incidentally, in the embodiment above, while a delivery portion which passes liquid immersion area 14 between wafer stages WST1 and WST2 was configured by eaves sections 23a and 23b (or eaves section 23c (and stepped portion 23d)), the delivery portion does not have to be shaped like the eaves section as long as wafer stage WST1 and wafer stage WST2 can maintain the state opposing each other by a predetermined distance (by a distance which can prevent wafer stage WST1 from being in contact with wafer stage WST2 and reflection mirror 27f from being in contact with reflection mirror 27e) by being engaged with each other, and the immersion area can move over the upper surface.

Further, in each of the embodiments above, wafer stages WST1 and WST2 were driven independently along the XY plane by a planar motor, with the movement path of wafer stages WST1 and WST2 given as a premise. However, the planar motor does not necessarily have to be used, and a linear motor may also be used depending on the movement path.

Further, in each of the embodiments and the modified examples above, eaves sections 23a and 23b (or eaves section 23c and stepped portion 23d which become engaged with each other) which become engaged with each other were arranged on a surface on the +X side of wafer stage WST1 and a surface on the −Y side of wafer stage WST2, on their −Y ends. This was employed so as to make the eaves sections correspond to the movement path of wafer stages WST1 and WST2 at the time of scrum as shown in, for example, FIGS. 5 and 11 and the like. Accordingly, in the case the movement path of wafer stages WST1 and WST2 are different at the time of the scrum, the arrangement place of eaves section 23a and eaves section 23b (or, eaves section 23c and stepped portion 23d) should be set appropriately, according to the movement path. As long as the delivery portion is arranged on at least one surface of the surfaces arranged on the side where the two wafer stages face each other, the delivery portion such as the eaves section is not limited to the −Y end and can be arranged anywhere. However, the arrangement place should preferably be at a position (above the non-effective area of the reflection surface of reflection mirrors 27e and 27f) where measurement of positional information in the Z-axis direction of wafer stages WST1 and WST2 using a measurement beam irradiated on the reflection surface of reflection mirrors 27e and 27f arranged at wafer stages WST1 and WST2 is not substantially obstructed. Further, the number of delivery portions such as the eaves section is not limited to one, as long as it is arranged on at least one surface of the surfaces on the side where the two wafer stages face each other. For example, in the case of arranging a plurality of delivery portions, a placement of the plurality of delivery portions should be decided so that a scrum (the most effective scrum), which allows the start of exposure of the wafer subject to the next exposure to be performed most efficiently, becomes possible. In this case, the placement of the delivery portion such as the eaves section, and when further necessary, the placement of the fiducial mark plate on the wafer stage can be decided so that the beginning of exposure of the wafer subject to the next exposure can be performed most efficiently including the detection of fiducial marks on the fiducial mark plate, according to the exposure sequence of the shot areas of wafers W1 and W2.

Incidentally, in each of the embodiments and the modified examples above, while the case has been described where protruding sections such as eaves sections fixed to wafer stages WST1 and WST2 are arranged on wafer stage WST1 and WST2, the present invention is not limited to this, and the protruding section can be movable. In this case, for example, the protruding sections can be in a substantially horizontal state only when both wafer stages WST1 and WST2 are in a scrum state, and at the time besides the scrum, or more specifically, when the protruding sections are not used, the protruding sections can be folded.

Further, in the embodiments and the modified examples above, while the width of the eaves section in the Y-axis direction was set slightly larger than the liquid immersion area, the present invention is not limited to this, and the width of the eaves section in the Y-axis direction can be set much wider.

Further, in each of the embodiments and the modified examples above, while the case has been described where the two wafer stages WST1 and WST2 are driven in the X-axis direction while maintaining a scrum state on delivery and the like of the liquid immersion area, the present invention is not limited to this, and the stages can be driven not only in the X-axis direction but also in the Y-axis direction. This can reduce even a little of the time until the beginning of exposure to the wafer subject to the next exposure held by the wafer stage to which the liquid immersion area has been delivered after the scrum state, when compared with the case when the two wafer stages WST1 and WST2 are driven only in the +X direction while maintaining the scrum state.

Incidentally, in the description so far, the case has been described where a protruding section such as an eaves section is formed on at least one side in the X-axis direction of at least one of wafer stages WST1 and WST. However, a scrum state with a positional shift (an offset) of both stages in the Y-axis direction such as the state described in, for example, the modified example above, can be employed between two wafer stages that do not have a protruding section such as the eaves section. In this case, the offset amount at the time of the scrum state can be set to be the most efficient scrum described above. Or, for example, in the case where there is a component (hereinafter referred to as a projection) on the side surface of one of the wafer stage WST1 on the +X side in the vicinity of the +Y side end and a recessed section which can house the component above inside is formed on the side surface of the other wafer stage WST2 on the −X side in the vicinity of the −Y side end, the offset at the time of the scrum state can be decided so that the projection and the recessed section face each other. In such a case, the liquid immersion area can be moved back and forth in the area over wafer stages WST1 and WST, while preventing the projection from coming into contact with wafer stage WST2 and causing damage.

Further, in each of the embodiments above, while the case has been described where the present invention has been applied to an exposure apparatus which is equipped with wafer stages WST1 and WST2 serving as the first and second movable body, the present invention is not limited to this, and as disclosed in, U.S. Pat. No. 6,897,963 and the like, the present invention can also be applied to an exposure apparatus which is equipped with a wafer stage and a measurement stage having a measurement member (a reference mark, a sensor and the like). In such a case, the measurement stage is used in a predetermined measurement in which illumination light IL is received via projection optical system PL and liquid Lq, such as, for example, uneven illumination measurement, illuminance measurement, aerial image measurement, wavefront aberration measurement and the like. And, by the movable body drive system which drives the wafer stage and the like driving the wafer stage when exposing the wafer on the wafer stage with an illumination light (energy beam) based on at least a part of the measurement results, exposure with high precision becomes possible.

Moreover, the present invention, which does not employ the first and second movable bodies as component parts, can also be applied to a type of stepper which has only one wafer stage and does not have a measurement stage, or also to a scanner.

Incidentally, in each of the embodiments above, given that the surface on the +X side of wafer stage WST1 faces the surface on the −X side of wafer stage WST2, eaves sections 23a and 23b which become engaged with each other were arranged only on these surfaces. However, besides such an arrangement, when the −X side edge surface of wafer stage WST1 and the +X side edge surface of wafer stage WST2 can be arranged facing each other, it is a matter of course that eaves sections that engage with each other can also be arranged on these surfaces, and the two stages can be in proximity or be in contact via the eaves sections.

Incidentally, in each of the embodiments above, while the case has been described where main controller 20 drives wafer stages WST1 and WST2 in the X-axis direction while maintaining the scram state in which a part of the stages are in contact or in proximity in the X-axis direction so as to deliver liquid immersion area 14, the present invention is not limited to this. More specifically, to deliver liquid immersion area 14, a configuration can be employed where stages WST1 and WST2 are driven by main controller 20 in the Y-axis direction while maintaining the scorn state in which a part of the stages are in contact or in proximity in the Y-axis direction.

Incidentally, in each of the embodiments above, while the lower surface of nozzle unit 32 and the lower end surface of the tip optical element of projection optical system PL were on a substantially flush surface, as well as this, for example, the lower surface of nozzle unit 32 can be placed nearer to the image plane (more specifically, to the wafer) of projection optical system PL than the outgoing surface of the tip optical element. That is, the configuration of local liquid immersion device 8 is not limited to the configuration described above, and the configurations which are described in, for example, EP Patent Application Publication No. 1420298, U.S. Patent Application Publication 2006/0231206, U.S. Patent Application Publication 2005/0280791, and U.S. Pat. No. 6,952,253 and the like can also be used. Further, as disclosed in, for example, U.S. Patent Application Publication No. 2005/0248856, the optical path on the object plane side of the tip optical element can also be filled with liquid, in addition to the optical path on the image plane side of the tip optical element. Furthermore, a thin film that is lyophilic and/or has dissolution preventing function may also be formed on the partial surface (including at least a contact surface with liquid) or the entire surface of the tip optical element. Incidentally, quartz has a high affinity for liquid, and also needs no dissolution preventing film, while in the case of fluorite, at least a dissolution preventing film is preferably formed.

Incidentally, in each of the embodiments above, pure water (water) was used as the liquid, however, it is a matter of course that the present invention is not limited to this. As the liquid, a chemically stable liquid that has high transmittance to illumination light IL and is safe to use, such as a fluorine-containing inert liquid can be used. As the fluorine-containing inert liquid, for example, Fluorinert (the brand name of 3M United States) can be used. The fluorine-containing inert liquid is also excellent front the point of cooling effect. Further, as the liquid, liquid which has a refractive index higher than pure water (a refractive index is around 1.44), for example, liquid having a refractive index equal to or higher than 1.5 can be used. As this type of liquid, for example, a predetermined liquid having C—H binding or O—H binding such as isopropanol having a refractive index of about 1.50, glycerol (glycerin) having a refractive index of about 1.61, a predetermined liquid (organic solvent) such as hexane, heptane or decane, or decalin (decahydronaphthalene) having a refractive index of about 1.60, or the like can be cited. Alternatively, a liquid obtained by mixing arbitrary two or more of these liquids may be used, or a liquid obtained by adding (mixing) at least one of these liquids to (with) pure water may be used. Alternatively, as the liquid, a liquid obtained by adding (mixing) base or acid such as $H^+$, $Cs^+$, $K^+$, $Cl^-$, $SO_4^{2-}$, or $PO_4^{2-}$ to (with) pure water can be used. Moreover, a liquid obtained by adding (mixing) particles of Al oxide or the like to (with) pure water can be used. These liquids can transmit ArF excimer laser light. Further, as the liquid, liquid, which has a small absorption coefficient of light, is less temperature-dependent, and is stable to a projection optical system (tip optical member) and/or a photosensitive agent (or a protection film (top coat film), an antireflection film, or the like) coated on the surface of a wafer, is preferable. Further, in the case an $F_2$ laser is used as the light source, fomblin oil can be selected. Further, as the liquid, a liquid having a higher refractive index to illumination light IL than that of pure water, for example, a refractive index of around 1.6 to 1.8 may be used. As the liquid, supercritical fluid can also be used. Further, the tip optical element of projection optical system PL may be formed by quartz (silica), or single-crystal materials of fluoride compound such as calcium fluoride (fluorite), barium fluoride, strontium fluoride, lithium fluoride, and sodium fluoride, or may be formed by materials having a higher refractive index than that of quartz or fluorite (e.g. equal to or higher than 1.6). As the materials having a refractive index equal to or higher than 1.6, for example, sapphire, germanium dioxide, or the like disclosed in the pamphlet of International Publication No. 2005/059117, or kalium chloride (having a refractive index of about 1-75) or the like disclosed in the pamphlet of International Publication No. 2005/059618 can be used.

Further, in each of the embodiments above, withdrawn liquid may be reused, it is desirable that this case arranges a filter removing impurities from withdrawn liquid in liquid recovery device or a recovery pipe.

Further, in each of the embodiments above, the case has been described where the present invention is applied to a scanning exposure apparatus by a step-and-scan method or the like. However, the present invention is not limited to this, but may also be applied to a static exposure apparatus such as a stepper. Further, the present invention can also be applied to a reduction projection exposure apparatus by a step-and-stitch method that synthesizes a shot area and a shot area, an exposure apparatus by a proximity method, a mirror projection aligner, or the like.

Further, the magnification of the projection optical system in the exposure apparatus in each of the embodiments above is not only a reduction system, but also may be either an equal magnifying system or a magnifying system, and projection optical system PL is not only a dioptric system, but also may be either a catoptric system or a catadioptric system, and in addition, the projected image may be either an inverted image or an upright image. Further, the illumination area and exposure area described above are to have a rectangular shape. However, the shape is not limited to rectangular, and can also be circular arc, trapezoidal, parallelogram or the like.

Incidentally, the light source of the exposure apparatus in each of the embodiments above is not limited to the ArF excimer laser, but a pulse laser light source such as a KrF excimer laser (output wavelength: 248 nm), an $F_2$ laser (output wavelength: 157 nm), an $Ar_2$ laser (output wavelength: 126 nm) or a $Kr_2$ laser (output wavelength: 146 nm), or an extra-high pressure mercury lamp that generates an emission line such as a g-line (wavelength: 436 nm), an i-line (wavelength, 365 nm) and the like can also be used. Further, a harmonic wave generating unit of a YAG laser or the like can also be used. Besides the sources above, as is disclosed in, for example, U.S. Pat. No. 7,023,610 description, a harmonic wave, which is obtained by amplifying a single-wavelength laser beam an the infrared or visible range emitted by a DFB semiconductor laser or fiber laser as vacuum ultraviolet light, with a fiber amplifier doped with, for example, erbium (or both erbium and ytteribium), and by converting the wavelength into ultraviolet light using a nonlinear optical crystal, can also be used.

Further, in each of the embodiments above, a transmissive type mask (reticle) is used, which is a transmissive substrate on which a predetermined light shielding pattern (or a phase pattern or a light attenuation pattern) is formed. Instead of this reticle, however, as is disclosed in, for example, U.S. Pat. No. 6,778,257 description, an electron mask (which is also called a variable shaped mask, an active mask or an image generator, and includes, for example, a DMD (Digital Micromirror Device) that is a type of a non-emission type image display device (spatial light modulator) or the like) on which a light-transmitting pattern, a reflection pattern, or an emission pattern is formed according to electronic data of the pattern that is to be exposed can also be used.

Further, for example, the present invention can also be applied to an exposure apparatus (lithography system) that forms line-and-space patterns on a wafer by forming interference fringes on the wafer.

Moreover, as disclosed in, for example, U.S. Pat. No. 6,611,316, the present invention can also be applied to an exposure apparatus that synthesizes two reticle patterns via a projection optical system and almost simultaneously performs double exposure of one shot area by one scanning exposure.

Incidentally, an object on which a pattern is to be formed (an object subject to exposure to which an energy beam is irradiated) in each of the embodiments above is not limited to a wafer, but may be other objects such as a glass plate, a ceramic substrate, a film member, or a mask blank.

The use of the exposure apparatus is not limited only to the exposure apparatus for manufacturing semiconductor devices, but the present invention can also be widely applied, for example, to an exposure apparatus for transferring a liquid crystal display device pattern onto a rectangular glass plate, and an exposure apparatus for producing organic ELs, thin-film magnetic heads, imaging devices (such as CCDs) micromachines, DNA chips, and the like. Further, the present invention can be applied not only to an exposure apparatus for producing microdevices such as semiconductor devices, but can also be applied to an exposure apparatus that transfers a circuit pattern onto a glass plate or silicon wafer to produce a mask or reticle used in a light exposure apparatus, an EUV exposure apparatus, an X-ray exposure apparatus, an electron-beam exposure apparatus, and the like.

Electronic devices such as semiconductor devices are manufactured through the steps of; a step where the function/performance design of the device is performed, a step where a reticle based on the design step is manufactured, a step where a wafer is manufactured from silicon materials, a lithography step where the pattern of a mask (the reticle) is transferred onto the water by the exposure apparatus (pattern formation apparatus) and the exposure method in the embodiment previously described, a development step where the water that has been exposed is developed, an etching step where an exposed member of an area other than the area where the resist remains is removed by etching, a resist removing step where the resist that is no longer necessary when etching has been completed is removed, a device assembly step (including a dicing process, a bonding process, the package process), inspection steps and the like. In this case, in the lithography step, because the device pattern is formed on the wafer by executing the exposure method previously described using the exposure apparatus of the embodiment, a highly integrated device can be produced with good productivity.

While the above-described embodiments of the present invention are the presently preferred embodiments thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. An exposure apparatus that exposes an object with an energy beam, the apparatus comprising:
a movable body on which the object is held and which is movable substantially along a predetermined plane within an area of a predetermined range which includes a first area including an exposure position where at least an exposure to the object which is mounted is performed, a second area positioned on one side in a first direction of the first area where at least an exchange of the object is performed, and a third area which is between the first area and the second area;

a first grating section placed at a position corresponding to the third area on a plane parallel to the predetermined plane, the first grating section facing from above a surface substantially parallel to the predetermined plane of the movable body; and a measurement device including an encoder system and an interferometer system, the encoder system measuring positional information of the movable body within the predetermined plane based on output of a first encoder head, a second encoder head and a third encoder head arranged on the surface of the movable body, each encoder head facing the first grating section, the first encoder head and the third encoder head measuring positional information of the movable body in at least one direction parallel to the predetermined plane, the second encoder head measuring positional information of the movable body in at least another direction different from the one direction and parallel to the predetermined plane, the first encoder head and the second encoder head being disposed adjacent to each other at a corner of the surface of the movable body, a first side of the movable body and a second side of the movable body forming the corner, the first encoder head and the third encoder head being disposed along the first side of the movable body, the first encoder head and the second encoder head being disposed along the second side of the movable body, and the interferometer system irradiating a measurement beam on a reflection surface arranged on the movable body and measuring positional information of the movable body in at least the first area and the second area, whereby the third area includes a movement path of the movable body where the measurement beam moves off from the reflection surface.

2. The exposure apparatus according to claim 1 wherein the first grating section is placed along a movement track of the first and the second encoder heads when the movable body moves between the first area and the second area.

3. The exposure apparatus according to claim 1, further comprising:

a second and a third grating sections placed at positions corresponding to the first and the second areas, respectively, on the plane parallel to the predetermined plane, whereby the measurement device further measures positional information of the movable body within the predetermined plane in the first and the second areas, respectively, based on an output of the first, the second and the third encoder heads facing the second and the third grating sections.

4. The exposure apparatus according to claim 3 wherein the measurement device has a plurality of encoder heads arranged on the surface of the movable body, the plurality of encoder heads including the first, the second and the third encoder heads, and based on an output of the plurality of encoder heads, measures positional information of the movable body within the predetermined plane.

5. The exposure apparatus according to claim 4 wherein a state is set by switching between a state in which two of the plurality of encoder heads face one of the first, the second, and the third grating sections simultaneously, and a state where the two encoder heads face any two of the first, the second, and the third grating sections individually and simultaneously, according to the movement of the movable body.

6. The exposure apparatus according to claim 4 wherein the plurality of encoder heads includes a plurality of first heads, each placed at a different position on the surface of the movable body and having a measurement direction in at least one of the first direction and a second direction perpendicular to the first direction within the predetermined plane, and the plurality of first heads simultaneously face a section which has a grating whose periodic direction is the measurement direction in at least one of the first, the second, and the third grating sections.

7. The exposure apparatus according to claim 6 wherein the measurement device measures positional information in a rotational direction within the predetermined plane of the movable body, based on an output of the plurality of first heads.

8. The exposure apparatus according to claim 6 wherein the measurement device acquires a positional relation between a first section and a second section of at least one of the first, the second, and the third grating sections, based on an output of the plurality of first heads.

9. The exposure apparatus according to claim 1 wherein the movable body is provided in a plurality.

10. The exposure apparatus according to claim 9, further comprising:

a movable body drive system which drives two movable bodies of the plurality of the movable bodies, as well as driving the two movable bodies simultaneously in a predetermined direction within the predetermined plane, while maintaining a scrum state where the two movable bodies are in proximity or in contact in the predetermined direction when a transition is made from a first state in which one of the two movable bodies is located in the first area to a second state in which the other of the two movable bodies is located in the first area.

11. The exposure apparatus according to claim 10 wherein a fourth grating section is placed further at a position where an encoder head equipped in at least one of the two movable bodies in the scrum state can face, on the plane parallel to the predetermined plane, and the measurement device measures positional information within the predetermined plane of at least one of the two movable bodies in the scrum state, based on an output of the encoder head facing the fourth grating section.

12. The exposure apparatus according to claim 10 wherein the predetermined direction is one of the first direction and a second direction perpendicular to the first direction.

13. The exposure apparatus according to claim 10 wherein the one movable body of the two movable bodies moves within a first range including the first, the second, and the third areas in the predetermined plane, and the other of the two movable bodies moves within a second range in which at least a part of the range differs from the first range except for the first area.

14. The exposure apparatus according to claim 1, further comprising:

an optical system arranged at an exposure position where the exposure is performed; and a liquid immersion device which supplies liquid to a space between the optical system and a movable body located at the exposure position, and forms a liquid immersion area.

15. An exposure apparatus that exposes an object with an energy beam, the apparatus comprising:
- a movable body on which the object is held and which is movable substantially along a predetermined plane within an area of a predetermined range which includes a first area including an exposure position where at least an exposure to the object which is mounted is performed, a second area positioned on one side in a first direction of the first area where at least an exchange of the object is performed, and a third area which is between the first area and the second area;
- a first, a second, and a third grating sections placed respectively at positions corresponding to the first, the second, and the third areas on a plane parallel to the predetermined plane, the first, the second, and the third grating sections facing from above a surface substantially parallel to the predetermined plane of the movable body; and
- a measurement device including an encoder system which measures positional information of the movable body within the predetermined plane based on output of a first encoder head, a second encoder head and a third encoder head arranged on the surface of the movable body, each encoder head facing any one of the first, the second, and the third grating sections, the first encoder head and the third encoder head measuring positional information of the movable body in at least one direction parallel to the predetermined plane, the second encoder head measuring positional information of the movable body in at least another direction different from the one direction and parallel to the predetermined plane, the first encoder head and the second encoder head being disposed adjacent to each other at a corner of the surface of the movable body, a first side of the movable body and a second side of the movable body forming the corner, the first encoder head and the third encoder head being disposed along the first side of the movable body, and the first encoder head and the second encoder head being disposed along the second side of the movable body.

16. The exposure apparatus according to claim 15 wherein the third grating section is placed along a movement track of the first and the second encoder heads when the movable body moves between the first area and the second area.

17. The exposure apparatus according to claim 15 wherein the first grating section and the second grating section are placed distanced from each other.

18. The exposure apparatus according to claim 17 wherein the first grating section and the second grating section are placed via the third grating section.

19. The exposure apparatus according to claim 15 wherein the measurement device further includes an interferometer system which irradiates a measurement beam on a reflection surface arranged on the movable body and measures positional information in at least the predetermined plane of the movable body, and
the third area includes a movement path of the movable body where the measurement beam moves off from the reflection surface.

20. The exposure apparatus according to claim 15 wherein the measurement device has a plurality of encoder heads arranged on the surface of the movable body, the plurality of encoder heads including the first, the second and the third encoder heads, and based on an output of the plurality of encoder heads, measures positional information of the movable body within the predetermined plane.

21. The exposure apparatus according to claim 20 wherein a state is set by switching between a state in which two of the plurality of encoder heads face any one of the first, the second, and the third grating sections simultaneously, and a state where the two encoder heads face any two of the first, the second, and the third grating sections individually and simultaneously, according to the movement of the movable body.

22. The exposure apparatus according to claim 20 wherein the plurality of encoder heads includes a plurality of first heads, each placed at a different position on the surface of the movable body and having a measurement direction in at least one of the first direction and a second direction perpendicular to the first direction within the predetermined plane, and
the plurality of first heads simultaneously face a section which has a grating whose periodic direction is the measurement direction in at least one of the first, the second, and the third grating sections.

23. The exposure apparatus according to claim 22 wherein the measurement device measures positional information in a rotational direction within the predetermined plane of the movable body, based on an output of the plurality of first heads.

24. The exposure apparatus according to claim 22 wherein the measurement device acquires a positional relation between a first section and a second section of at least one of the first, the second, and the third grating sections, based on an output of the plurality of first heads.

25. The exposure apparatus according to claim 15 wherein the movable body is provided in a plurality.

26. The exposure apparatus according to claim 25, further comprising:
- a movable body drive system which drives two movable bodies of the plurality of the movable bodies, and drives the two movable bodies simultaneously in a predetermined direction within the predetermined plane, while maintaining a scrum state where the two movable bodies are in proximity or in contact in the predetermined direction when a transition is made from a first state in which one of the two movable bodies is located in the first area to a second state in which the other of the two movable bodies is located in the first area.

27. The exposure apparatus according to claim 26 wherein a fourth grating section is placed further at a position where an encoder head equipped in at least one of the two movable bodies in the scrum state can face, on the plane parallel to the predetermined plane, and
the measurement device measures positional information within the predetermined plane of at least one of the two movable bodies in the scrum state, based on an output of the encoder head facing the fourth grating section.

28. The exposure apparatus according to claim 26 wherein the predetermined direction is one of the first direction and a second direction perpendicular to the first direction.

29. The exposure apparatus according to claim 26 wherein the one movable body of the two movable bodies moves within a first range including the first, the second, and the third areas in the predetermined plane, and
the other of the two movable bodies moves within a second range in which at least a part of the range differs from the first range except for the first area.

30. The exposure apparatus according to claim 15, further comprising:
an optical system arranged at the exposure position; and a liquid immersion device which supplies liquid to a space between the optical system and a movable body located at the exposure position, and forms a liquid immersion area.

31. An exposure apparatus that exposes an object with an energy beam, the apparatus comprising:
a first movable body on which an object is held and which is movable substantially along a predetermined plane within a first range which includes a first area including an exposure position where at least an exposure to the mounted object is performed, a second area positioned on one side in a first direction of the first area where at least an exchange of the object is performed, and a third area which is between the first area and the second area;
a second movable body on which an object is held and which is movable substantially along the predetermined plane within a second range which includes the first area, a fourth area positioned on one side in a first direction of the first area where at least an exchange of the object is performed, and a fifth area between the first area and the fourth area;
a first and a second grating sections placed respectively at positions corresponding to the third and the fifth areas on a plane parallel to the predetermined plane, the first and the second grating sections facing from above a surface of the first movable body and a surface of the second movable body, respectively, which are substantially parallel to the predetermined plane; and
a measurement device including an encoder system which measures positional information of the first movable body within the predetermined plane based on output of a first encoder head, a second encoder head and a third encoder head arranged on the surface of the first movable body and measures positional information of the second movable body within the predetermined plane based on output of a fourth encoder head, a fifth encoder head and a sixth encoder head arranged on the surface of the second movable body, wherein
each of the first, the second and the third encoder heads faces the first grating section, the first and the third encoder heads measure positional information of the first movable body in at least one direction parallel to the predetermined plane, the second encoder head measures positional information of the first movable body in at least another direction different from the one direction and parallel to the predetermined plane, the first encoder head and the second encoder head are disposed adjacent to each other at a corner of the surface of the first movable body, a first side of the first movable body and a second side of the first movable body form the corner, the first encoder head and the third encoder head are disposed along the first side of the first movable body, and the first encoder head and the second encoder head are disposed along the second side of the first movable body, and
each of the fourth, the fifth and the sixth encoder heads faces the second grating section, the fourth and the sixth encoder heads measure positional information of the second movable body in at least the one direction parallel to the predetermined plane, the fifth encoder head measures positional information of the second movable body in at least the another direction parallel to the predetermined plane, the fourth encoder head and the fifth encoder head are disposed adjacent to each other at a corner of the surface of the second movable body, a first side of the second movable body and a second side of the second movable body form the corner, the fourth encoder head and the sixth encoder head are disposed along the first side of the second movable body, and the fourth encoder head and the fifth encoder head are disposed along the second side of the second movable body.

32. The exposure apparatus according to claim 31 wherein a part of the first range and the second range overlap each other.

33. The exposure apparatus according to claim 31 wherein the encoder system has a plurality of specific encoder heads, the plurality of specific encoder heads being at least one of a plurality of encoder heads including the first, the second and the third encoder heads arranged on the surface of the first movable body, and a plurality of encoder heads including the fourth, the fifth and the sixth encoder heads arranged on the surface of the second movable body, and based on an output of the plurality of specific encoder heads, measures positional information within the predetermined plane of a specific movable body on which the specific encoder heads are arranged, of the first and the second movable bodies.

34. The exposure apparatus according to claim 33 wherein a state is set by switching between a state in which two of the plurality of specific encoder heads face one of the first and the second grating sections simultaneously, and a state where the two specific encoder heads respectively face the first and the second grating sections individually and simultaneously, according to the movement of the specific movable body.

35. The exposure apparatus according to claim 33 wherein the plurality of specific encoder heads includes a plurality of first heads, each placed at a different position on the surface of the specific movable body and having a measurement direction in at least one of the first direction and a second direction perpendicular to the first direction within the predetermined plane, and
the plurality of first heads simultaneously face a section which has a grating whose periodic direction is the measurement direction in at least one of the first and the second grating sections.

36. The exposure apparatus according to claim 35 wherein the measurement device measures positional information in a rotational direction within the predetermined plane of the specific movable bodies, based on an output of the plurality of first heads.

37. The exposure apparatus according to claim 35 wherein the measurement device acquires a positional relation between a first section and a second section of at least one of the first and the second grating sections, based on an output of the plurality of first heads.

38. The exposure apparatus according to claim 31, further comprising:
an optical system arranged at the exposure position; and
a liquid immersion device which supplies liquid to a space between the optical system and a movable body located at the exposure position, and forms a liquid immersion area.

39. An exposure method that exposes an object with an energy beam, the method comprising:
a measurement process in which within a predetermined range including a first area including an exposure position where at least an exposure to the object which is mounted is performed, a second area positioned on one side in a first direction of the first area where at least an exchange of the object is performed, and a third area which is between the first area and the second area, positional information within a predetermined plane of a movable body, on which the object is held and which is movable substantially along the predetermined plane, in the third area is measured, based on an output of a first encoder head, a second encoder head and a third encoder head that are arranged on a surface of the movable body substantially parallel to the predetermined plane and that face a first grating section placed at a position corresponding to the third area on a plane parallel to the predetermined plane, the first grating section facing from above the surface of the movable body, and positional information of the movable body in at least the first area and the second area is measured using an interferometer system which irradiates a measurement beam on a reflection surface arranged on the movable body, the first encoder head and the third encoder head measuring positional information of the movable body in at least one direction parallel to the predetermined plane, the second encoder head measuring positional information of the movable body in at least another direction different from the one direction and parallel to the predetermined plane, the first encoder head and the second encoder head being disposed adjacent to each other at a corner of the surface of the movable body, a first side of the movable body and a second side of the movable body forming the corner, the first encoder head and the third encoder head being disposed along the first side of the movable body, and the first encoder head and the second encoder head being disposed along the second side of the movable body, wherein the third area includes a movement path of the movable body where the measurement beam moves off the reflection surface.

40. The exposure method according to claim 39 wherein the first grating section is placed along a movement track of the first and the second encoder heads when the movable body moves between the first area and the second area.

41. The exposure method according to claim 39 wherein a second and a third grating sections are placed further on the plane parallel to the predetermined plane at positions corresponding to the first and the second areas, respectively, and
in the measurement process, positional information of the movable body within the predetermined plane in the first and the second areas, is measured respectively based on an output of the first, the second and the third encoder heads facing the second and the third grating sections.

42. The exposure method according to claim 39 wherein a plurality of encoder heads including the first, the second and the third encoder heads are arranged on the surface of the movable body, and
in the measurement process, positional information of the movable body within the predetermined plane is measured, based on an output of the plurality of encoder heads.

43. The exposure method according to claim 42 wherein a state is set by switching between a state in which two of the plurality of encoder heads face any one of the first, the second, and the third grating sections simultaneously, and a state where the two encoder heads respectively face any two of the first, the second, and the third grating sections individually and simultaneously, according to the movement of the movable body.

44. The exposure method according to claim 42 wherein in the plurality of encoder heads, a plurality of first heads is included, each placed at a different position on the surface of the movable body and having a measurement direction in at least one of the first direction and a second direction perpendicular to the first direction within the predetermined plane, and
the plurality of first heads simultaneously face a section which has a grating whose periodic direction is the measurement direction in at least one of the first, the second, and the third grating sections.

45. The exposure method according to claim 44 wherein in the measurement process, positional information in a rotational direction within the predetermined plane of the movable body is measured, based on an output of the plurality of first heads.

46. The exposure method according to claim 44 wherein in the measurement process, a positional relation between a first section and a second section of at least one of the first, the second, and the third grating sections is acquired, based on an output of the plurality of first heads.

47. The exposure method according to claim 39 wherein the movable body is used in a plurality.

48. The exposure method according to claim 47, further comprising:
a drive process in which two movable bodies of the plurality of the movable bodies are driven, and the two movable bodies are also simultaneously driven in a predetermined direction within the predetermined plane, while maintaining a scrum state where the two movable bodies are in proximity or in contact in the predetermined direction when a transition is made from a first state in which one of the two movable bodies is located in the first area to a second state in which the other of the two movable bodies is located in the first area.

49. The exposure method according to claim 48 wherein a fourth grating section is placed further at a position where an encoder head equipped in at least one of the two movable bodies in the scrum state can face, on the plane parallel to the predetermined plane, and
in the measurement process, positional information within the predetermined plane of at least one of the two movable bodies in the scrum state is measured, based on an output of the encoder head facing the fourth grating section.

50. The exposure method according to claim 48 wherein the predetermined direction is one of the first direction and a second direction perpendicular to the first direction.

51. The exposure method according to claim 48 wherein the one movable body of the two movable bodies moves within a first range including the first, the second, and the third areas in the predetermined plane, and
the other of the two movable bodies moves within a second range in which at least a part of the range differs from the first range except for the first area.

52. The exposure method according to claim 39 wherein the object on the movable body is exposed by irradiating an energy beam via a liquid of a liquid immersion area formed in a space between an optical system set at the exposure position and the movable body located at the exposure position.

53. A device manufacturing method, including:
an exposure process in which an object is exposed using the exposure method according to claim 39; and
a development process in which the object that has undergone exposure is developed.

54. An exposure method that exposes an object with an energy beam, the method comprising:
a measurement process in which positional information within a predetermined plane of a movable body on which the object is held and which is movable substantially along the predetermined plane is measured within a predetermined range including a first area including an exposure position where at least an exposure to the object which is mounted is performed, a second area positioned on one side in a first direction of the first area where at least an exchange of the object is performed, and a third area which is between the first area and the second area, based on an output of a first encoder head, a second encoder head and a third encoder head that are arranged on a surface of the movable body substantially parallel to the predetermined plane and that face any one of a first, a second, and a third grating sections placed respectively at positions corresponding to the first, the second, and the third areas on a plane parallel to the predetermined plane, the first, the second, and the third grating sections facing from above the surface of the movable body, wherein the first encoder head and the third encoder head measure positional information of the movable body in at least one direction parallel to the predetermined plane and the second encoder head measures positional information of the movable body in at least another direction different from the one direction and parallel to the predetermined plane, and the first encoder head and the second encoder head are disposed adjacent to each other at a corner of the surface of the movable body, a first side of the movable body and a second side of the movable body form the corner, the first encoder head and the third encoder head are disposed along the first side of the movable body, and the first encoder head and the second encoder head are disposed along the second side of the movable body.

55. The exposure method according to claim 54 wherein the third grating section is placed along a movement track of the first and the second encoder heads when the movable body moves between the first area and the second area.

56. The exposure method according to claim 54 wherein the first grating section and the second grating section are placed distanced from each other.

57. The exposure method according to claim 56 wherein the first grating section and the second grating section are placed via the third grating section.

58. The exposure method according to claim 54 wherein in the measurement process, positional information of the movable body is measured further in at least the first area and the second area using an interferometer system which irradiates a measurement beam on a reflection surface arranged on the movable body, and the third area includes a movement path of the movable body where the measurement beam moves off the reflection surface.

59. The exposure method according to claim 54 wherein a plurality of encoder heads including the first, the second and the third encoder heads are arranged on the surface of the movable body, and in the measurement process, positional information of the movable body within the predetermined plane is measured, based on an output of the plurality of encoder heads.

60. The exposure method according to claim 59 wherein a state is set by switching between a state in which two of the plurality of encoder heads face any one of the first, the second, and the third grating sections simultaneously, and a state where the two encoder heads face any two of the first, the second, and the third grating sections individually and simultaneously, according to the movement of the movable body.

61. The exposure method according to claim 59 wherein the plurality of encoder heads includes a plurality of first heads, each placed at a different position on the surface of the movable body and having a measurement direction in at least one of the first direction and a second direction perpendicular to the first direction within the predetermined plane, and the plurality of first heads simultaneously face a section which has a grating whose periodic direction is the measurement direction in at least one of the first, the second, and the third grating sections.

62. The exposure method according to claim 61 wherein in the measurement process, positional information in a rotational direction within the predetermined plane of the movable body is measured, based on an output of the plurality of first heads.

63. The exposure method according to claim 61 wherein in the measurement process, a positional relation between a first section and a second section of at least one of the first, the second, and the third grating sections is acquired, based on an output of the plurality of first heads.

64. The exposure method according to claim 54 wherein the movable body is used in a plurality.

65. The exposure method according to claim 64, further comprising:

a drive process in which two movable bodies of the plurality of the movable bodies are driven, and the two movable bodies are also simultaneously driven in a predetermined direction within the predetermined plane, while maintaining a scrum state where the two movable bodies are in proximity or in contact in the predetermined direction when a transition is made from a first state in which one of the two movable bodies is located in the first area to a second state in which the other of the two movable bodies is located in the first area.

66. The exposure method according to claim 65 wherein a fourth grating section is placed further at a position where an encoder head equipped in at least one of the two movable bodies in the scrum state can face, on the plane parallel to the predetermined plane, and in the measurement process, positional information is measured within the predetermined plane of at least one of the two movable bodies in the scrum state, based on an output of the encoder head facing the fourth grating section.

67. The exposure method according to claim 65 wherein the predetermined direction is one of the first direction and a second direction perpendicular to the first direction.

68. The exposure method according to claim 65 wherein the one movable body of the two movable bodies moves within a first range including the first, the second, and the third areas in the predetermined plane, and the other of the two movable bodies moves within a second range in which at least a part of the range differs from the first range except for the first area.

69. The exposure method according to claim 54 wherein the object on the movable body is exposed by irradiating an energy beam via a liquid of a liquid immersion area formed in a space between an optical system set at the exposure position and the movable body located at the exposure position.

70. A device manufacturing method, including:

an exposure process in which an object is exposed using the exposure method according to claim 54; and a development process in which the object that has undergone exposure is developed.

71. An exposure method that exposes an object with an energy beam, the method comprising:
a measurement process in which
within a first range which includes a first area including an exposure position where at least an exposure to the object which is mounted is performed, a second area positioned on one side in a first direction of the first area where at least an exchange of the object is performed, and a third area which is between the first area and the second area, positional information within a predetermined plane of a first movable body, on which the object is held and which is movable substantially along the predetermined plane, in the third area is measured based on output of a first encoder head, a second encoder head and a third encoder head that are arranged on a surface of the first movable body substantially parallel to the predetermined plane and that face a first grating section placed at a position corresponding to the third area on a plane parallel to the predetermined plane and facing from above the surface of the first movable body, and
within a second range which includes the first area, a fourth area positioned on one side in the first direction of the first area where at least an exchange of the object is performed, and a fifth area between the first area and the fourth area, positional information within the predetermined plane of a second movable body, on which the object is held and which is movable substantially along the predetermined plane, in the fifth area is measured based on output of a fourth encoder head, a fifth encoder head and a sixth encoder head that are arranged on a surface of the second movable body substantially parallel to the predetermined plane and that face a second grating section placed at a position corresponding to the fifth area on a plane parallel to the predetermined plane and facing from above the surface of the second movable body,
wherein:
the first encoder head and the third encoder head measure positional information of the first movable body in at least one direction parallel to the predetermined plane and the second encoder head measures positional information of the first movable body in at least another direction different from the one direction and parallel to the predetermined plane, the first encoder head and the second encoder head are disposed adjacent to each other at a corner of the surface of the first movable body, a first side of the first movable body and a second side of the first movable body form the corner, the first encoder head and the third encoder head are disposed along the first side of the first movable body, and the first encoder head and the second encoder head are disposed along the second side of the first movable body, and
the fourth encoder head and the sixth encoder head measure positional information of the second movable body in at least the one direction parallel to the predetermined plane and the fifth encoder head measures positional information of the second movable body in at least the another direction parallel to the predetermined plane, the fourth encoder head and the fifth encoder head are disposed adjacent to each other at a corner of the surface of the second movable body, a first side of the second movable body and a second side of the second movable body form the corner, the fourth encoder head and the sixth encoder head are disposed along the first side of the second movable body, and the fourth encoder head and the fifth encoder head are disposed along the second side of the second movable body.

72. The exposure method according to claim 71 wherein a part of the first range and the second range overlap each other.

73. The exposure method according to claim 71 wherein a plurality of specific encoder heads are provided, the plurality of specific encoder heads being at least one of a plurality of encoder heads including the first, the second and the third encoder heads arranged on the surface of the first movable body and a plurality of encoder heads including the fourth, the fifth and the sixth encoder heads arranged on the surface of the second movable body, and
in the measurement process, based on an output of the plurality of specific encoder heads, positional information within the predetermined plane of a specific movable body on which the specific encoder heads are arranged is measured, of the first and the second movable bodies.

74. The exposure method according to claim 73 wherein a state is set by switching between a state in which two of the plurality of specific encoder heads face one of the first and the second grating sections simultaneously, and a state where the two specific encoder heads respectively face the first and the second grating sections individually and simultaneously, according to the movement of the specific movable body.

75. The exposure method according to claim 73 wherein in the plurality of specific encoder heads, a plurality of first heads is included, each placed at a different position on the surface of the specific movable body and having a measurement direction in at least one of the first direction and a second direction perpendicular to the first direction within the predetermined plane, and
the plurality of first heads simultaneously face a section which has a grating whose periodic direction is the measurement direction of at least one of the first and the second grating sections.

76. The exposure method according to claim 75 wherein in the measurement process, positional information in a rotational direction within the predetermined plane of the specific movable body is measured, based on an output of the plurality of first heads.

77. The exposure method according to claim 75 wherein in the measurement process, a positional relation between a first section and a second section of at least one of the first and the second grating sections is acquired, based on an output of the plurality of first heads.

78. The exposure method according to claim 71 wherein the object on the movable body is exposed by irradiating an energy beam via a liquid of a liquid immersion area formed in a space between an optical system set at the exposure position and the movable body located at the exposure position.

79. A device manufacturing method, including:
an exposure process in which an object is exposed using the exposure method according to claim 71; and
a development process in which the object that has undergone exposure is developed.

* * * * *

UNITED STATES PATENT AND TRADEMARK OFFICE
CERTIFICATE OF CORRECTION

Page 1 of 1

PATENT NO. : 8,711,327 B2
APPLICATION NO. : 12/331863
DATED : April 29, 2014
INVENTOR(S) : Shibazaki It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1292 days.

Signed and Sealed this
Twenty-eighth Day of July, 2015

Michelle K. Lee
*Director of the United States Patent and Trademark Office*